(12) United States Patent
Dowling et al.

(10) Patent No.: US 8,077,790 B2
(45) Date of Patent: Dec. 13, 2011

(54) TILED-BUILDING-BLOCK TRELLIS ENCODERS

(76) Inventors: Eric Morgan Dowling, Escazu (CR);
John P. Fonseka, Plano, TX (US)

( * ) Notice: Subject to any disclaimer, the term of this patent is extended or adjusted under 35 U.S.C. 154(b) by 855 days.

(21) Appl. No.: 11/976,214

(22) Filed: Oct. 23, 2007

(65) Prior Publication Data

US 2009/0103646 A1 Apr. 23, 2009

(51) Int. Cl.
*H04L 23/02* (2006.01)
(52) U.S. Cl. ........ 375/265; 375/244; 375/262; 375/341; 375/286; 714/795; 714/792
(58) Field of Classification Search ................... 375/265, 375/341, 262, 244; 714/792, 795
See application file for complete search history.

(56) References Cited

U.S. PATENT DOCUMENTS

| | | | |
|---|---|---|---|
| 4,713,817 A | 12/1987 | Wei | |
| 5,258,987 A | 11/1993 | Wei | |
| 5,329,551 A | 7/1994 | Wei | |
| 5,436,932 A * | 7/1995 | Sogo et al. | 375/341 |
| 5,535,228 A | 7/1996 | Dong et al. | |
| 5,548,615 A | 8/1996 | Wei | |
| 5,654,986 A | 8/1997 | Lim | |
| 5,787,127 A * | 7/1998 | Ono et al. | 375/341 |
| 5,914,989 A * | 6/1999 | Thapar et al. | 375/341 |
| 6,034,996 A | 3/2000 | Herzberg | |
| 6,115,427 A | 9/2000 | Calderbank et al. | |
| 6,266,795 B1 | 7/2001 | Wei | |
| 6,351,832 B1 | 2/2002 | Wei | |
| 6,473,878 B1 | 10/2002 | Wei | |
| 6,516,037 B1 | 2/2003 | Wei | |
| 6,769,091 B2 | 7/2004 | Classon | |
| 6,889,355 B1 | 5/2005 | Calderbank et al. | |
| 7,197,691 B2 * | 3/2007 | Beerel et al. | 714/795 |
| 2009/0135946 A1 * | 5/2009 | Dowling et al. | 375/286 |

OTHER PUBLICATIONS

L-F Wei, "Trellis-coded modulation with multidimensional constellations,"IEEE Trans Inform. Theory, vol. IT-33, No. 4, pp. 483-501, Jul. 1987.
A. Gatherer and A. Murtaza, "Analysis and improvement of the J.83 Annex B trellis code for cable modems," 32nd Asilomar Conference on Signals, Sys. & Comp, pp. 1773-1777, Nov. 1998.
S-M Yang, W-K Cheng, and J. Shen, "LSB-coded modulation and its application to microwave digital radios," IEEE pp. 1243-1247, 1996.
H. Iami and S. Hirakawa, "A new multilevel coding method using erroFcorrecting codes," IEEE Trans Inform. Theory, vol. IT-23, No. 3, pp. 371-373, May 1977.
L.-F. Wei, "Coded modulation with unequal error protection," IEEE Trans Comm., vol. 41, No. 10, pp. 1439-1449, Oct. 1993.

(Continued)

*Primary Examiner* — Eva Y Puente
(74) *Attorney, Agent, or Firm* — Eric M. Dowling

(57) ABSTRACT

A first convolutional coder (building-block trellis coder) is used to establish a minimum squared Euclidian distance (MSED) between signal points within a coded constellation building block. A second convolutional encoder (tiling encoder) is designed to ensure that the building block's MSED is maintained between building blocks once they are tiled onto an integer lattice. When this approach is applied to the trellis code of the WiMAX standard, a 3 dB coding is realized. Recall that Wei's 16-state 4D code suffered from a 1.36 dB due to constellation expansion, resulting in a net 4.66 dB coding gain. Our building block approach recovers 1.33 dB of this loss with only a minor increase in coding complexity. We then use the building block approach to derive simpler and more powerful higher dimensional codes that provide further gains still over the Wei family of multidimensional codes.

25 Claims, 30 Drawing Sheets

OTHER PUBLICATIONS

M. Isaka et al., "Multilevel coded 16-QAM modulation with multistage decoding and unequal error protection," Globecom 1998.

M. Isaka, et al., "Multilevel coded modulation for unequal error protection and multistage decoding—part II: asymmetric constellations," *IEEE Trans. Commun.*, vol. 48, No. 5, pp. 774-786, May 2000.

G.D. Forney, "Coset codes—part I: introduction and geometrical classification," IEEE Trans Inform. Theory, vol. 34, No. 5, pp. 1123-1151, Sep. 1988.

G.D. Forney, "Coset codes—part II: binary lattices and related codes," IEEE Trans Inform. Theory, vol. 34, No. 5, pp. 1152-1187, Sep. 1988.

H. Kaneko et al., "Nonsystematic M-ary asymmetric error correcting codes designed by multilevel coding method," Proc. $10^{th}$ IEEE Pac Rim Int. Symp on Dependable Computing, 2004.

D. Divsalar, et al., "Trellis coding with asymmetric modulations," IEEE Trans Comm., vol. COM-35, No. 2, pp. 130-141, Feb. 1987.

R.J. van der Vleuten and J. Weber, "Optimized signal constellations for trellis-coded modulation on an AWGN channels," IEEE Trans Comm., vol. 44, No. 6, pp. 646-648, Jun. 1996.

J. Huber, "Multilevel-codes: Distance profiles and channel capacity," ITG-Fachberichte, Oct. 1994.

U. Wachsmann, R. F. H. Fischer and J.B. Huber, "Multilevel codes: theoretical concepts and practical design rules," IEEE Trans Inform. Theory, vol. 45, No. 5, pp. 1361-1391, Jul. 1999.

J. Huber, U. Wachsmann, and R. Fischer, "Coded modulation by multilevel codes: overview and state of the art," ITG-Fachberichte, Mar. 1998.

R. Fischer, J. Huber and U. Wachsmann, "On the combination ofg multilevel coding and signal shaping," ITG-Fachberichte, Mar. 1998.

U. Wachsmann, R. F. H. Fischer and J.B. Huber, "Multilevel coding: use of hard decisions in multistage decoding," ITG-Fachberichte, Mar. 1997.

\* cited by examiner

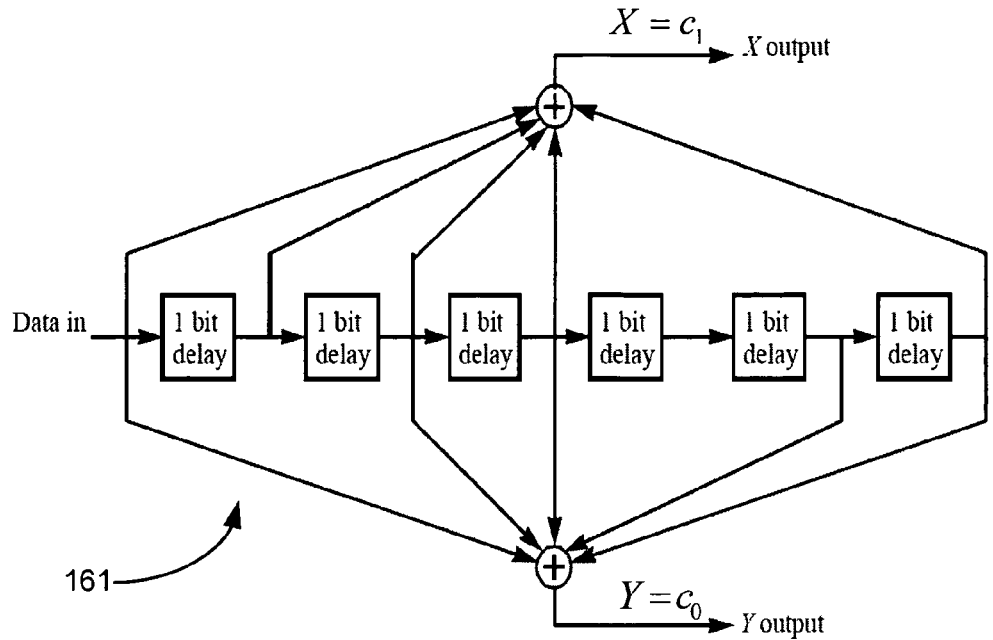
Figure 161—Binary rate 1/2 convolutional encoder
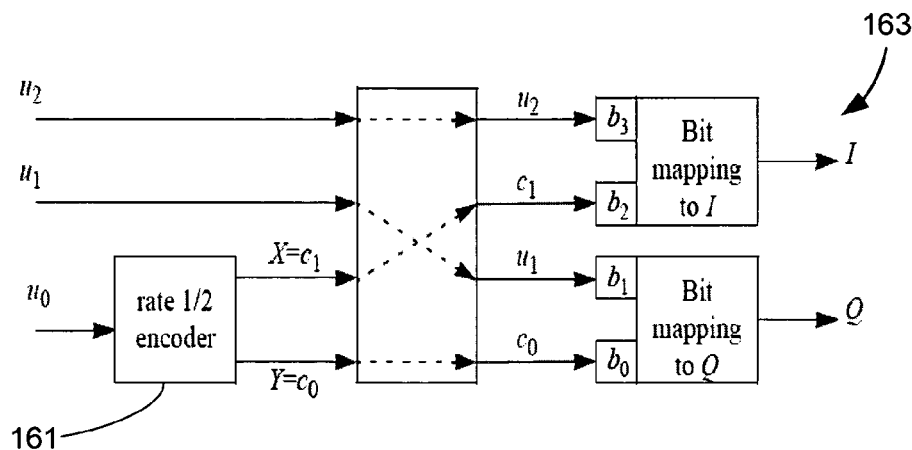
Figure 163—Pragmatic TCM encoder for rate 3/4 16-QAM
Figures 161 and 163 from IEEE 802.16a-2004
(PRIOR ART)
FIG. 1a

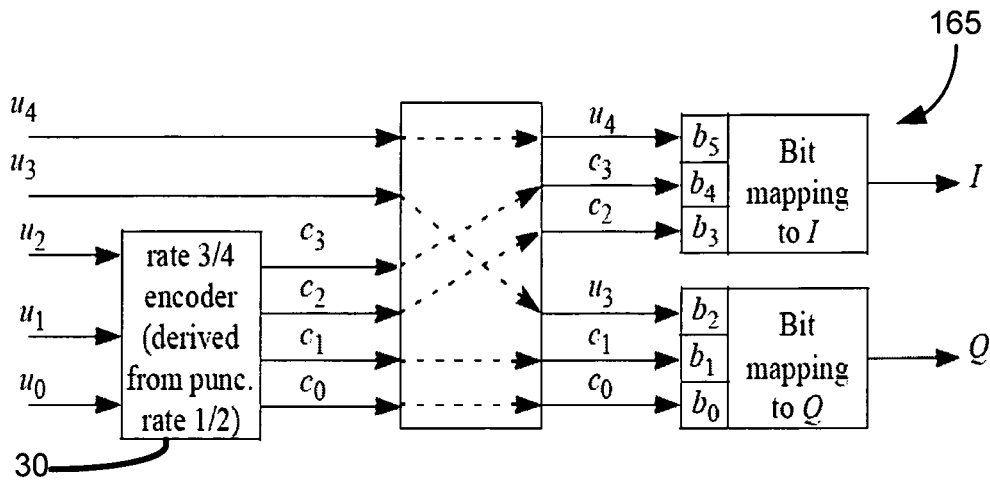
Figure 165—Pragmatic TCM encoder for rate 5/6 64-QAM
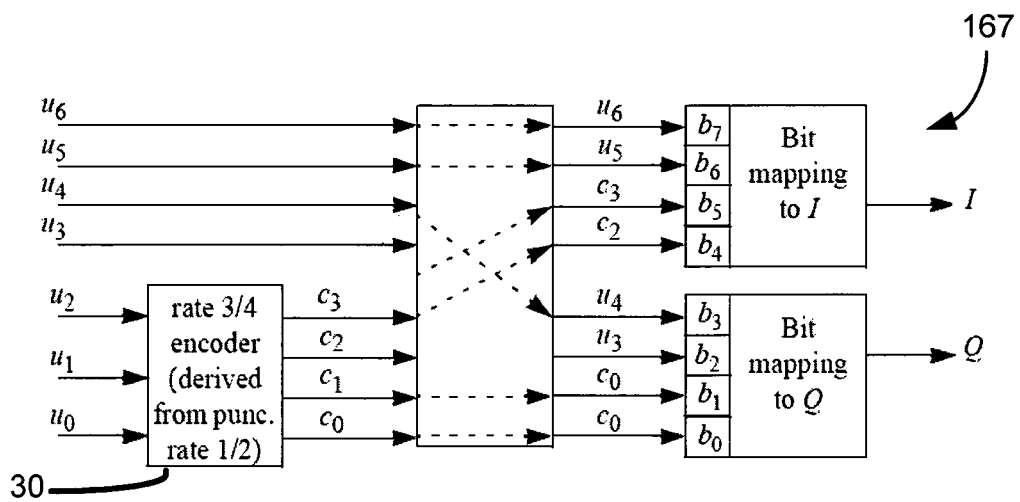
Figure 167—Optional pragmatic TCM encoder for rate 7/8 256-QAM
Figures 165 and 167 from IEEE 802.16a-2004
(PRIOR ART)
FIG. 1b Figure 174—Pragmatic maps for 16-QAM and 64-QAM constellations

Pragmatic 16-QAM and 64-QAM tiled constellations of IEEE 801.16a-2004

Figure 175—Pragmatic map for 256-QAM constellation

Pragmatic 256-QAM tiled constellation of IEEE 801.16a-2004

Figure 171—Gray maps for QPSK and 16-QAM constellations

4D Constellation encoder used in the 4D 16-state Wei code

NUMBER BENEATH EACH POINT  $Z2_{n+i}\ Z3_{n+i}\ Z4_{n+i}\ Z5_{n+i}\ Z6_{n+i}\ Z7_{n+i}\ (i=0,1,2,3)$

8D Constellation encoder used in the 8D 64-state Wei code

8D Constellation encoder used in the 8D 64-state Wei code

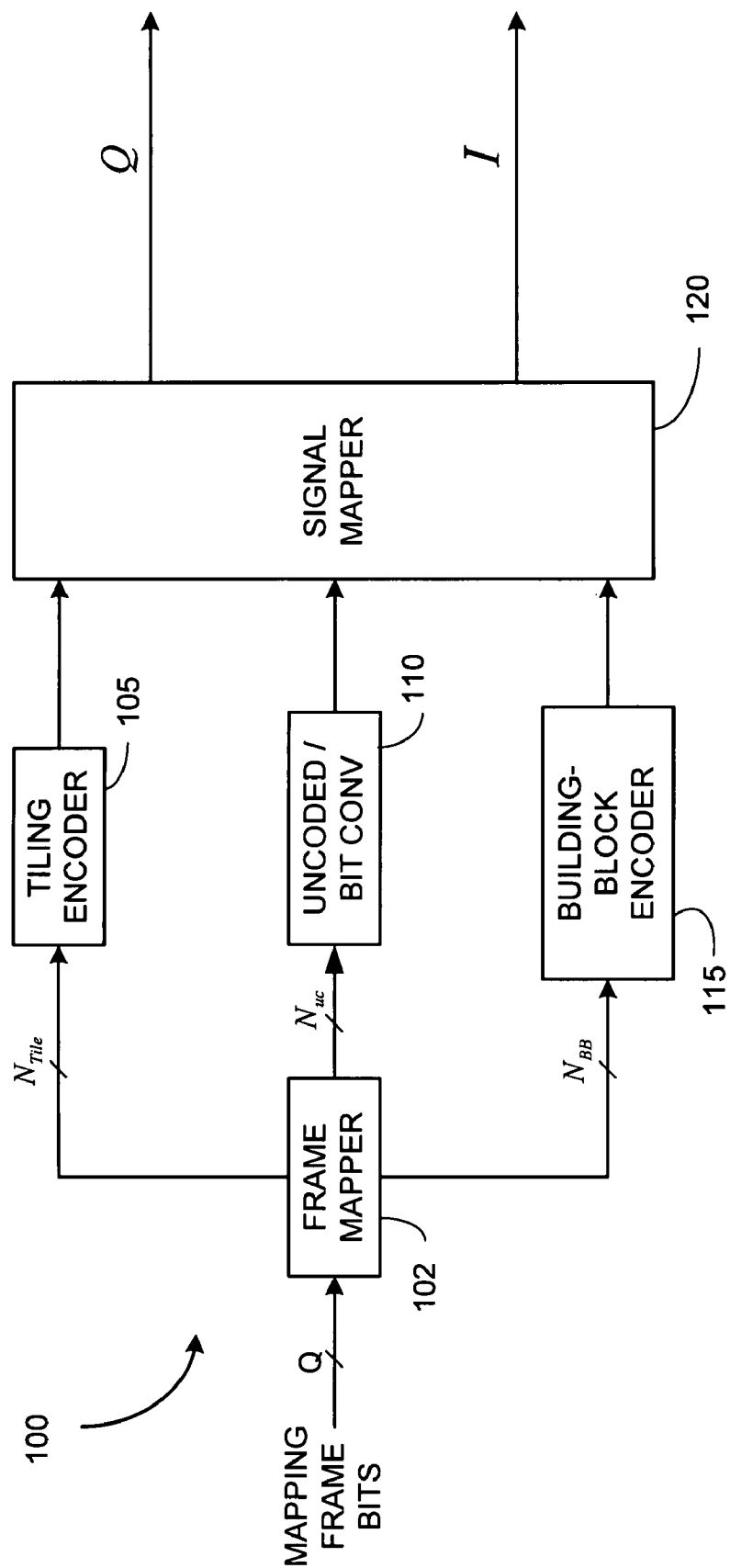

Comparison of LSB-Tiled 4D Building Block Trellis Code with:
1) Corresponding Uncoded Constellation, 2) WiMAX and 3) J.83

| Bits/2D interval | Tiling Constellation | Gain ($D^2=64$) | Gain ($D^2=48$) | Gain over WiMAX ($D^2=64$) | Relative Complexity re WiMAX ($D^2=64$) | Gain over J.83 ($D^2=48$) |
|---|---|---|---|---|---|---|
| 3.1 | 8-QAM | 5.815 | 4.566 | 2.013 | 0.51 | x |
| 4.1 | 16-QAM | 5.916 | 4.67 | 0.747 | 0.59 | x |
| 5.17 | 32 CR | 5.999 | 4.75 | 2.288 | 0.54 | x |
| 5.6 | 48 CR+ | x | x | x | x | 1.390 |
| 6.1 | 64-QAM | 6.041 | 4.79 | 0.652 | x | x |
| 7.15 | 128 CR | 6.09 | 4.84 | 2.263 | 0.64 | x |
| 7.6 | 192 CR+ | x | x | x | x | 1.423 |
| 8.1 | 256-QAM | 6.06 | 4.81 | x | x | x |

FIG. 15

TILED-BUILDING-BLOCK TRELLIS ENCODERS

BACKGROUND OF THE INVENTION

1. Field of the Invention

This invention relates generally to trellis coded modulation techniques for use in digital communication systems. More particularly, the invention relates to methods and apparatus for the encoding and decoding of two-dimensional and higher-dimensional trellis-encoded signal constellations using an efficient and practical multilevel form of trellis coded modulation.

2. Description of the Related Art

A family of WiMAX trellis codes is discussed in IEEE Std. 802.16a 2004 "WiMAX standard", which is incorporated herein by reference; see especially sections 8.2-8.4. Many relevant details of the WiMAX trellis codes are described herein. For example, see FIGS. 1a-1e herein which reproduce FIGS. 161, 163, 165, 167, 174, 175 and 171 from the IEEE 802.16a-2004 standard. In the disclosure herein, the term "trellis code" should be understood to refer generally to a single-level or multilevel trellis coded modulation scheme, i.e. a "trellis code" as used herein includes convolutionally encoded bits, optional uncoded bits, and a bit mapper that maps these bits to a trellis coded signal constellation.

FIG. 1a also shows a 64-state, rate-½ convolutional coder 161 that gives rise to a code with a free Hamming distance of $d_{free}=10$. This large free Hamming distance is desirable because it can be used to multiplicatively extend the minimum squared Euclidian distance (MSED) between adjacent signal constellation points. For example, if the uncoded MSED between neighboring constellation points in a small and compact signal constellation with no uncoded bits is $D^2$, the trellis encoder 161 can increase this to a coded MSED of $d_{free} \times D^2 = 10 \times D^2$. In larger constellations that also include uncoded bits, the actual MSED improvement is typically much less. A good source of reference to understand many theoretical aspects of the present invention is "Error control coding, $2^{nd}$ Ed.," by Shu Lin and Daniel J. Costello, Jr., Prentice Hall, 2004, ("the Lin and Costello reference"). Table 12.1 (pages 539-540) of the Lin and Costello reference tells how many states are needed for a convolutional code to achieve a given Hamming distance at a given coding rate, e.g., rate-½, rate-⅔, or rate-¾. These tables are very useful when designing trellis codes as discussed below.

FIG. 1a shows a prior art rate-¾ trellis encoder 163 constructed by mapping two coded bits produced by the rate-½ encoder 161 onto an I-component (in-phase) and a Q-component (quadrature-phase) to produce a trellis coded 16-QAM constellation 174a as shown in FIG. 1c. To better understand the operation of encoder 163 we start by defining what we call a 4-QAM (or, QPSK) "coded constellation building block," 20 which is illustrated in FIG. 2. This constellation building block can be thought of as a direct I/Q mapping of the X and Y outputs of the rate-½ convolutional encoder 161. That is, a 2D building block encoder 215 can be implemented using a rate-½ coder such as the coder 161 to generate the 2D 4-QAM building-block constellation 20. The X and Y outputs of the rate-½ convolutional encoder 161 respectively correspond to coded bits $c_1$ and $c_0$. The encoder 163 maps the encoder 161's coded bits along with two uncoded bits onto a 16-QAM constellation 174a as shown in FIG. 1c. The present invention is based in part on the observation that this 16-QAM constellation can be viewed as a tiling of four copies of the 4-QAM building block of FIG. 2 into the four quadrants of the I/Q plane, centered at the four points, (±2, ±2), which we call tiling points. More generally, in trellis coded modulated systems, a constellation building block typically corresponds to the lower order bits which are trellis coded, i.e., with no uncoded bits. As discussed in further detail below, the uncoded bits then have the effect of replicating this building block and tiling onto larger trellis coded signal constellations.

The minimum squared Euclidian distance (MSED) between uncoded constellation points within the 4-QAM coded building block 20 can be readily seen to be $D^2=4$. Any change of a single coded bit in FIG. 2 contributes to the Euclidian distance by an amount 4. Therefore, if the convolutional encoder 161 ($d_{free}=10$) is used to encode the input bits to the building block 20, that the MSED between coded trellis sequences on the 4-QAM building block 20 increases to $D^2=4\times10=40$. The encoder 163 maps the coded bits of the building block 20 along with two uncoded bits. As mentioned above, the addition of the uncoded bits has the effect of placing (or "tiling") one of the 4-QAM coded building blocks 20 in each quadrant of the constellation 174a, centered at the tiling points (±2, ±2). While the minimum distance between trellis sequences inside each of these 4-QAM building blocks 20 is $D^2=40$, the MSED between trellis sequences encoded onto the 16-QAM constellation 174a using encoder 163 is only $D^2=16$. It would be desirable to have an efficient and low cost way of improving upon this MSED, for example, to bring the MSED of the 16-QAM constellation 174a up to $D^2=40$ or higher.

FIG. 3 shows a block diagram of a prior art rate-¾ punctured encoder 30 used in the WiMAX standard. The encoder 30 generates a punctures the code 161 to generate the puncture-coded version of 16-QAM constellation 171 of FIG. 1e. That is, it uses a different rate-¾ encoding rule than the one used by encoder 163 and also maps this on to a Gray code enumerated signal constellation 171. FIG. 3 is not provided in the 802.16a-2004 standard but can be derived by studying FIGS. 161 and 165 and using Table 174 of the 802.16a-2004 standard (Table 174 not reproduced herein). Table 174 of the 802.16a-2004 standard identifies a specific puncturing pattern used by the punctured rate-¾ encoder 30 portion of an encoder 165 shown in FIG. 165 of FIG. 1b.

Because the encoder 30 does not map any uncoded bits, FIG. 3 can be viewed as directly generating a 16-QAM constellation building block which uses the Gray-coded 16-QAM constellation 171. The combination of the punctured coding 30 and the Gray code constellation enumeration allow the coded constellation 171 to achieve an MSED of $D^2=20$ instead of the 16-QAM constellation 173's MSED of $D^2=16$. The encoder 165 additionally takes in two uncoded bits which cause the bit mapper portion of the encoder 165 to tile four copies of the 16-QAM building block 171, one in each quadrant, to form the rate-⅚ trellis coded 64-QAM constellation 174b. This time the building blocks are bigger (16-QAM vs. 4-QAM), so they are centered at tiling points (±4, ±4). Because the tile centers are at (±4, ±4), the distance between 16-QAM tile centers is D=8 or $D^2=64$. This larger distance between tile centers does not affect the overall MSED, so that the 16-QAM building block 171 dominates and the MSED of the 64-QAM constellation 165 is $D^2=20$.

Also shown in FIG. 1b is a coder 167. The coder 167 also uses the same punctured rate-¾ encoder 30, but maps this along with four uncoded bits to provide an overall rate-⅞ trellis coded 256-QAM constellation 175 of FIG. 1d. The encoder 167 can be thought of as tiling sixteen copies of the 16-QAM building block 171 by mapping their centers to points (±4, ±4) and (±4, ±12), (±12, ±4) and (±12, ±12) of the constellation 175. Note that the distance between tile centers in both the 64-QAM and the 256-QAM constellations is D=8, or $D^2$=64. The 16-QAM building blocks 171 (or, "tiles") generated by the encoder 30 have an intra-block MSED of $D^2$=20 and an inter-block (or "inter-tile") MSED between tile centers of $D^2$=64. The MSED of the coded 256-QAM constellation 175 thus also achieves an overall MSED of $D^2$=20. This distance is lower because the encoder 30 is a rate-¾ coder and its effective free Hamming distance is five. However, since $D^2$=20<64, the MSED of this larger 16-QAM building block 171 is not diminished once it is tiled. That it, the 16-QAM building block 171's MSED is preserved after tiling in both the constellations 174b and 175 because the larger tile 171's centers are spaced far enough apart, i.e., $D^2$=64. It would be desirable to have an efficient and low cost way of improving upon this MSED by being able to efficiently tile smaller building blocks with higher MSED without loosing the benefit due to closer-space tiling points.

Another example of a trellis coded modulation scheme is the LSB (least significant bit) coding technique used in the ITU-J.83 digital television transmission standard. J.83 transmission is also used in the down link of DOCSIS cable modems. As illustrated in FIG. 4, in LSB-coded signal constellations, each of the I and Q dimensions of the QAM constellation are indexed independently in such a way that the LSB of each dimension alternates along the I and Q axes. In FIG. 4, note that the right-most bit of each signal point alternates between successive signal points along the Q-dimension and the next-right-most bit alternates between successive signal points along the I-dimension. LSB codes create an overall checker-board pattern where the different subsets correspond to the red and black squares of a checkerboard. The LSB codes treat the I and Q axes of the QAM constellation like separate real-valued PAM constellations. Constellation points in each of these component PAM constellations alternate between LSB=0 and LSB=1 subsets. For example in FIG. 4 going along the Q-direction, constellation points in any column can be grouped into an LSB=0 set if the LSB of the constellation point's corresponding right-most bit is 0, or into an LSB=1 set if the LSB of the constellation point's corresponding right-most bit is 1. Similarly, going along the I-direction, any row of constellation points can be grouped into the LSB=0 set if the next-rightmost LSB of the constellation point's corresponding bit sequence is 0, or into the LSB=1 set if the next-rightmost LSB of the constellation point's corresponding bit sequence is 1. When bits have been generally mapped in this way, we say that the LSB-coding bit mapping rule 40 has been employed. The MSED between the LSB=0 and LSB=1 subsets in each dimension can be increased applying the next-rightmost and right-most LSBs to respective I and Q convolutional coders. As discussed below, in this disclosure we use LSB coding for tiling operations, so we have labeled the axes of FIG. 4 to spread points twice as far apart as the J.83 standard. Using this labeling, the distance between adjacent constellation points is D=4 or $D^2$=16 (this relabeling will not change performance or normalized minimum distance but is useful herein). If the free Hamming distance of the convolutional code used in the LSB encoder is $d_{free}$, then MSED between the LSB=0 and LSB=1 subsets is increased by a factor $d_{free}$. In J.83, a pair of 16-state LSB encoders with a Hamming distances of three is used. This increases the MSED between the adjacent sequences corresponding to the same LSB subset to $D^2$=3×16=48. If an LSB coder with Hamming distance $d_{free}$=4 is chosen, then the distance between adjacent points in the same LSB subset increases to $D^2$=4×16=64. If a convolutional code with $d_{free}$>4 is selected for use with the LSB code, no further $d_{free}$ MSED will be obtained because bit errors in the next-least-significant (uncoded) bit correspond to a distance of $D^2$=64. Therefore if a tiling code with $D^2$>64 is desired, more than just the LSBs would need to be protected.

FIG. 5 shows a J.83 constellation encoder 12 that can generate the LSB-coded QAM constellation of FIG. 4 when $N_{uc}$=2 uncoded bits are used. When the J.83 trellis encoder 61a of FIG. 6 is used in the constellation encoder of FIG. 5, the MSED between adjacent constellation points is increased by a factor of three over an uncoded QAM constellation. As discussed in the 1998 Gather and Ali article (see accompanying IDS), other trellis encoders such as the 32-state encoder 61b or the 64-state encoder 61c can also be used with the constellation encoder of FIG. 5. The encoders 61b and 61c have a free Hamming distance of $d_{free}$=4 and thus multiply the MSED between adjacent sequences by a factor of four over an uncoded QAM constellation, giving $D^2$=4×16=64. Going to higher-state codes with $d_{free}$>4 cannot increase this distance further in the prior art LSB approach. This is because the squared distance between points in the LSB=0 and LSB=1 subsets is capped by $D^2$=64. While LSB codes are highly efficient and simple to implement, it would be desirable to have an improved trellis coded modulation system that can provide further gains over prior art LSB encoded systems such as the trellis codes used in the J.83 standard. It would also be desirable to use the above LSB codes to improve tiling performance of larger constellations created by tiling building blocks onto an integer lattice.

As used herein, "integer lattice" is generally $Z^N$ or a subset of $Z^N$, where $Z^N$ denotes the integer points of an N-dimensional vector space. In some cases the integer points may include complex integers (i.e., a+jb where a and b are integers). The vector space $C^N$ of complex numbers is generally taken to be an N-dimensional "signal space." Received signals in a receiver are processed and most often converted to points in the signal space. A decoder portion of the receiver attempts to map sequences of the received signal points in $C^N$ back onto complex integers of the integer lattice, e.g. $Z^N$. The integer lattice is also a subset of $C^N$. An integer lattice generally extends to infinity and a given trellis encoder maps bits to a signal constellation which is finite and is thus a subset of the integer lattice.

Yet another example of a trellis coded modulation scheme is the Wei family of multidimensional trellis codes. Such codes are described in detail in U.S. Pat. No. 4,713,817, which is incorporated herein by reference. FIG. 7a shows a constituent 2D signal constellation 70 used in the 4D Wei codes. FIG. 7b shows Wei's 4D coder 75 used to generate his 4D 16-state code. FIG. 8a shows a constituent 2D signal constellation 80 used in the 8D Wei codes. FIG. 8b shows Wei's 8D coder 85 used to generate his 8D 64-state code. While these codes are highly advantageous, their coding gain is limited by an inherent constellation expansion that comes about as an artifact of code construction. Note that Wei's 4D encoder 75 takes in fourteen bits each 4D mapping frame, i.e., m=7 bits per 2D signaling interval. To send seven bits using an uncoded constellation requires 128 constellation points, normally transmitted using a 128 CR (cross) constellation. Wei's 192-point constituent 2D constellation 70 has sixty-four more points than the uncoded 128 CR (cross) constellation that would be needed to send the same seven bits per interval if no coding were employed. The 128 CR constellation is made up of the 128 points inside the crosses drawn in FIGS. 7a and 8a. Cross constellations come about when an odd number of bits, m, are sent each 2D signaling interval. If an even number of bits is sent each 2D interval, the constellation typically has a square shape. If a fractional number of bits are sent each interval, the constellation takes on some other shape. For example, the signal constellation 70 has $2^7+2^7\times0.5=128+64=192$ points, and can thus carry 7.5 bits per interval, while the constellation 80 has $2^7+2^7\times0.25=128+32=160$ points and can thus carry 7.25 bits per interval.

On page 492 of Wei's IEEE Transactions on Information Theory article, Vol. IT-33, July 1987 ("Wei'87") (incorporated by reference herein), Wei explains that his 16-state 4D trellis code looses 1.36 dB due to constellation expansion. Col 2 of p. 492 of Wei '87 states: "[4.66 dB] is also the largest possible coding gain that can be achieved with the partitioning of the 4D rectangular constellation of Table I." Col. 2 of p. 496 states: "Given the partitioning of the 4D or 8D rectangular constellation of section IV-A or -B, it is impossible to increase the coding gain further or reduce the error coefficient of the 16-state or 64-state code of those two subsections." It would be desirable to recapture the bulk of this coding loss due to constellation expansion with increase in coding/decoding complexity on the order of some small amount like 25%-45%.

Another related area of art in need of improvement relates to multilevel codes. For example, see the articles provided in the accompanying IDS entitled "Multilevel Codes: Theoretical Concepts and Practical Design Rules," by Wachsmann et al, IEEE Transactions on Information Theory, vol. 45 no. 5, July 1999, and "Coded Modulation by Multilevel-Codes: Overview and State of the art, by J. Huber et al; and "Multilevel Codes: Distance profiles and Channel Capacity," 1994, by J. Huber. These articles discuss a family of multilevel coders and decoders. The coders described in these articles generally maintain specified coding rates on each of a plurality of bit lines, use long interleavers, have larger delays, are relatively complex to implement, and use a subset partitioning technique that creates subsets of points that are spread out at a lower level partitioning but are clustered at upper levels. It would be advantageous to have a multilevel coding scheme that could be characterized generally as a multilevel code, but that was much simpler to implement. It would be desirable to have a multilevel coding scheme assigns groups of points in lowest level partition to tight clusters around tile points in an upper level coding partition. It would be advantageous to provide efficient multilevel coding structures and methods that whose implementation complexity is on the same order as current trellis coded modulation schemes already used in various telecommunication standards. A simple and efficient family of multilevel coding and decoding schemes would be useful in improving existing trellises coded modulation schemes such as the ones found in various telecommunication standards.

SUMMARY OF THE INVENTION

The present invention solves these and other problems by providing systems and methods to construct and decode a novel family of codes, which we call "tiled-building-block trellis codes." In one aspect of the invention we define a first code to be a "building-block trellis code," and we define a second code to be a "tiling code." The building-block-trellis code is used to construct a small compact signal constellation building block which is called a "coded-constellation-building block," or, a "building block" for short. The tiling code is employed to allow the small powerful building blocks to be closely tiled to form larger constellations while preserving the building block's MSED. Like any other trellis code, the tiling code has a signal constellation, but at each constellation point of the tiling code is placed a copy of a selected constellation building block. For this reason, we refer to each constellation point of the tiling code as a "tiling point," and we refer the set of all such tiling points as a "tiling constellation." The "intra-block MSED" is defined as the MSED between constellation points within a building block, and the "tiling MSED" is defined as the MSED between the centers of the tiled building blocks, i.e., the MSED between tiling points in the tiling constellation. In terms of coded sequences, the intra-block MSED is the distance between coded sequences of constellation points within a building block and the tiling MSED is the distance between coded sequences of tiling points (tile center locations).

Although not a requirement, we prefer that the MSED between tiling sequences of the tiling code be equal to or greater than the intra-block MSED of the constellation points within the building block. This way the MSED of the composite constellation after tiling will be at least approximately equal to the intra-block MSED supplied by the building block. We find that LSB codes such as the ones used in the J.83 cable modem standard are well suited for use as a tiling code, but that any set-partitioning-based code such as a Wei code or some other Ungerbock-type code can also be used.

A preferred method of the present invention can be described as follows: 1) define a building-block trellis code and construct a trellis-coded constellation building block whose signal points enjoy a large intra-block MSED, 2) select a tiling code (subset partitioning) whose tiling MSED is equal to or greater than the intra-block MSED of the building block, 3) Place a copy of the building block at each tiling point of the tiling code to construct the tiled signal constellation; so that 4) the MSED between individual constellation points of the tiled set of building blocks is preferably as large as the intra-block MSED of the building block before it was tiled. If the MSED of the building block is selected to be larger than the MSED of the tiling code, desirable systems can be constructed, but the overall MSED of the system will be limited by the MSED of the tiling code. As a general rule it is often best to select the tiling code and the building block code to have the same MSED so that neither the tiling code nor the building-block trellis code pulls down the performance of the other. We call such code pairs "well balanced." In some cases we perform Monte Carlo simulations and determine whether secondary effects due to error coefficient are limiting performance, and if so, we may optionally increase the MSED in either the building block code or the tiling code or both to offset these effects.

A key aspect of the present invention provides a systematic and geometric approach to develop trellis coded modulation schemes whose coding gains are significantly better than the best and most practical codes found in widespread use (e.g., standardized products such as V.34 dial-up modems, J.83 digital television, DOCSIS cable modems, G.991 DSL modems, 802.11 wireless LANs, and 802.16a wireless MANs). In one aspect of the present invention, codes like the WiMAX family of trellis coded constellations are improved upon by increasing coding gain, and/or increasing the data rate with a 35%-50% decrease in computational complexity. When applying the present invention to WiMAX codes, the starting code to be improved upon already uses a building-block trellis code, but without a tiling code. In such cases one can optionally redesign the building block and add then a tiling code. Codes redesigned in this way generally demonstrate a coding gain over the prior-art. By going to a multidimensional building block, we can also increase the data rate as compared to prior art WiMAX codes and other codes as discussed below. Coding/decoding complexity is reduced by 35%-50%.

In another aspect of the present invention, a starting code to be improved upon (e.g., Wei code or other type of Ungerbock code) can be viewed as a tiling code. In these cases, additional coding gain is achieved by inserting a coded constellation building-block at each point of the prior art code. As discussed below, coding gain can be achieved in such cases because the building block can be designed to transmit some information bits, thereby leading to a contraction of the tiling constellation. Removal of the outer layer, higher energy constellation points in the tiling constellation is a potential source of coding gain. In reality, more constellation points are added by placing a building block at each tiling point, but this leads to an overall constellation reshaping that often leads to significant coding gains. The designer has the ability to increase the data rate with moderate improvements in coding gain or to more significantly increase the coding gain while leaving the data rate the same or slightly improving upon it. In the case of the Wei codes, the coding/decoding complexity is increased by 25%-45% depending on the specific type of embodiment. The building block approach of the present invention provides the designer with a tool set to build up trellis codes to meet a variety of design needs, as is demonstrated herein.

In general, new codes can be constructed by appropriately selecting compatible pairs of building-block trellis codes and tiling codes. Although in Wei'87 it was explicitly stated such improvements were impossible, we constructed a tiled-building-block version of Wei's 4D code that recovers 1.33 dB of Wei's 1.36 dB constellation expansion loss, thereby providing a coding gain of 5.99 dB (over the uncoded 128 CR constellation) with a 41% increase in decoding complexity. Even more significant gains are realized when the approach is applied to Wei's well known 64-state 8D code. Coding complexity is kept under control because the tiling decoder reuses the branch metrics from the building-block decoder and the tiling constellation is contracted.

BRIEF DESCRIPTION OF THE DRAWINGS

The various novel features of the present invention are illustrated in the drawings listed below and described in the detailed description that follows.

FIG. 1a shows FIGS. 161 and 163 from the IEEE 802.16a standard; these figures illustrate the rate-½ and rate-¾ coder architectures used in WiMAX.

FIG. 1b shows FIGS. 165 and 167 from the IEEE 802.16a standard; these figures illustrate the rate-⅚ and rate-⅞ coder architectures used in WiMAX.

FIG. 9 is a block diagram illustrating a novel tiled-building-block trellis encoder in accordance with a preferred embodiment of the present invention.

FIG. 15 is a table that compares various performance measures of the encoder 300 to WiMAX and J.83 codes.

DETAILED DESCRIPTION OF THE PREFERRED EMBODIMENTS

Figure 1C:
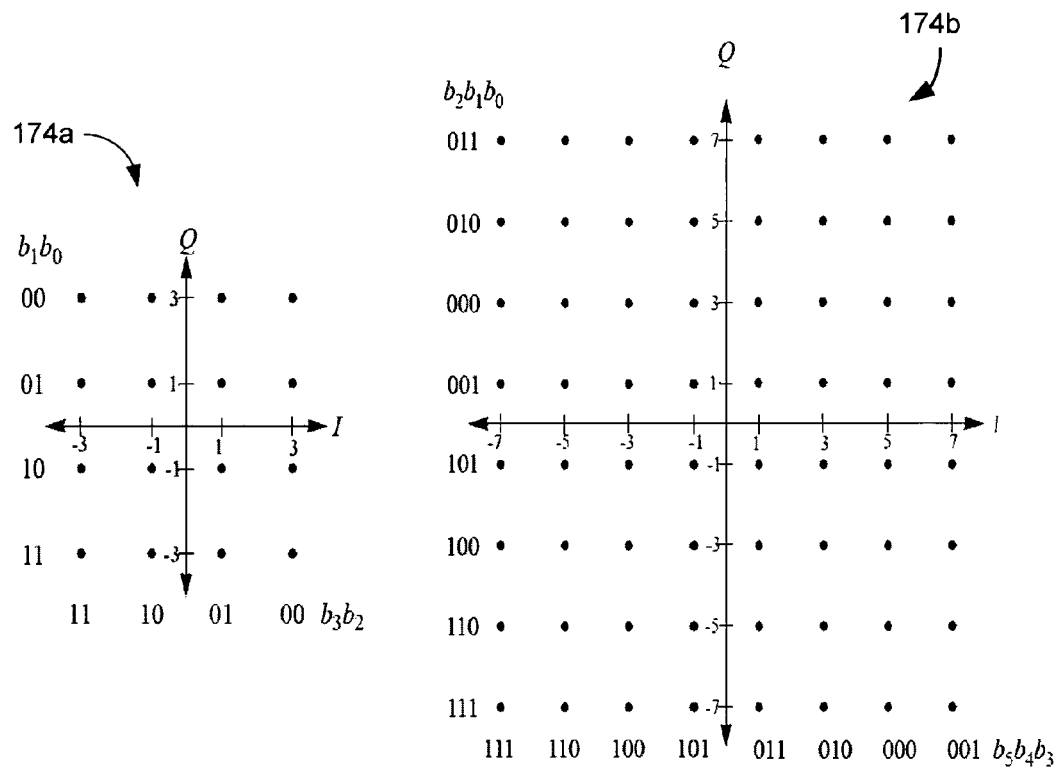
FIG. 1c is a constellation diagram showing a WiMAX rate-¾ coded 16-QAM constellation 174a and a WiMAX rate-⅚ coded constellation 174b.
Figure 1D:
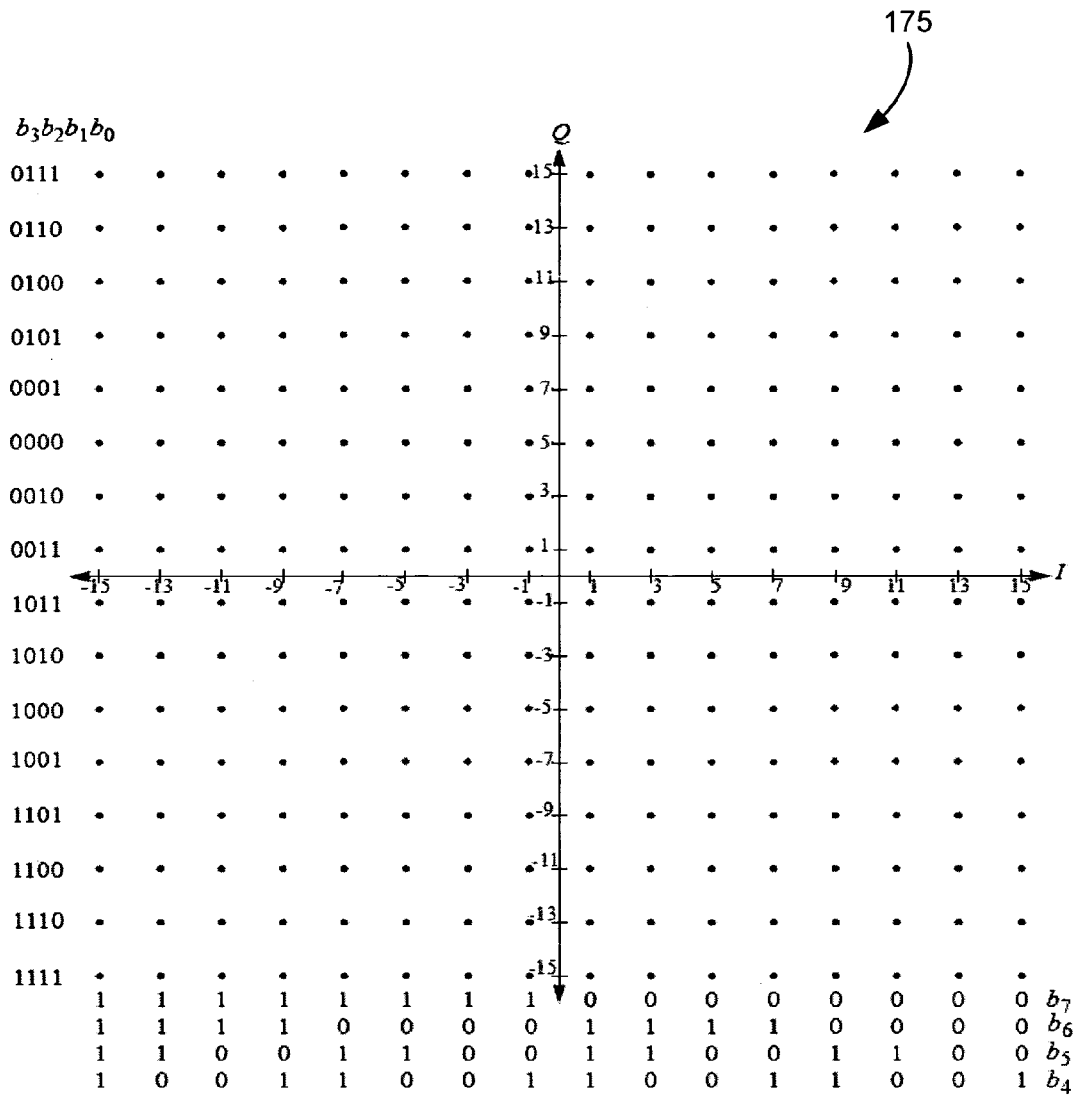
FIG. 1d is a constellation diagram showing a WiMAX rate-⅞ coded 256-QAM constellation 175.
Figure 1E:
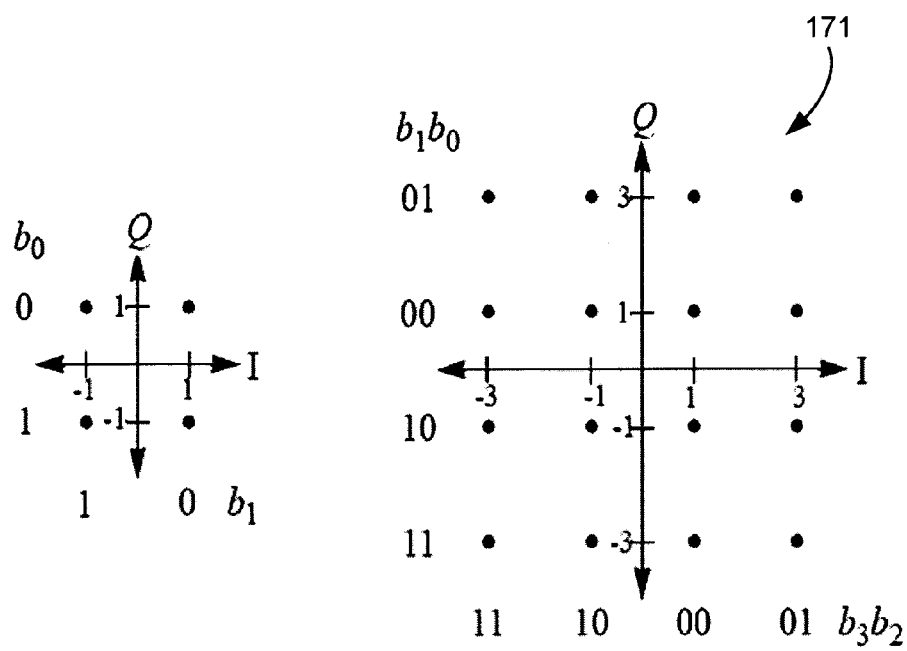
FIG. 1e is a constellation diagram showing a punctured rate-¾, Gray-code-enumerated 16-QAM constellation building block tiled within the WiMAX constellations 174b and 175.

To understand the general framework of the present invention, once again consider FIG.'s 1a-1e from the IEEE 802.16a-2004 standard ("WiMAX"). Recall in WiMAX the 16-QAM constellation 174a can be viewed as tiling into each quadrant a copy of the 4-QAM building block 20 whose inter-block MSED is $D^2=40$. As observed by the present invention, though, the WiMAX encoder 163 sub optimally tiles the building block 20 without using a tiling code, so that the coded 16-QAM constellation 174a's MSED is lowered to $D^2=16$. Similarly, the 64-QAM constellation 174b and 256-QAM constellation 175 are built up from tiling a larger and less powerful ($D^2=20<40$) 16-QAM building block 171 as generated by the WiMAX punctured encoder 30.

Figure 2:
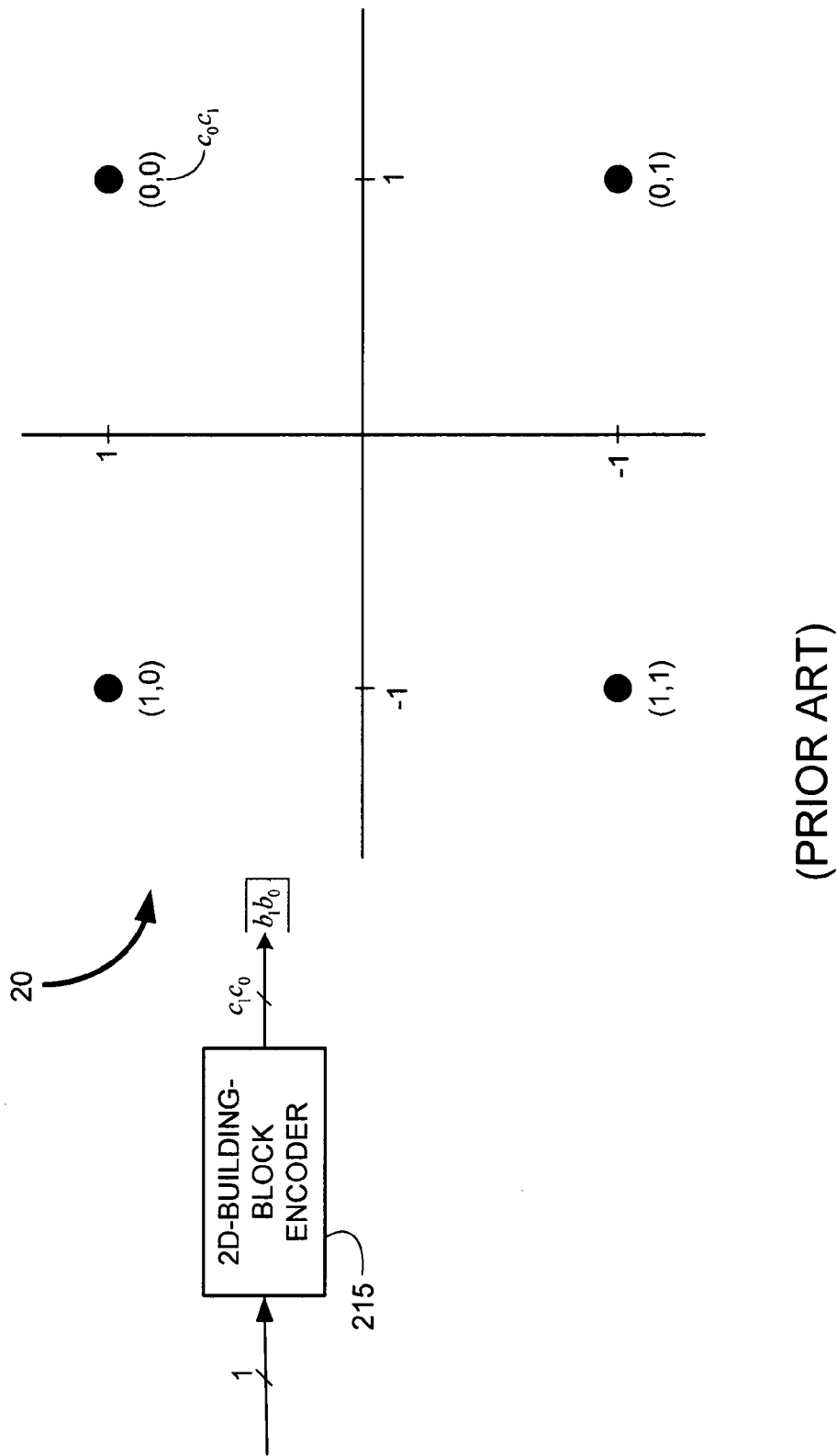
FIG. 2 is a block diagram illustrating a 2D 4-QAM coded constellation building block.
Figure 3:
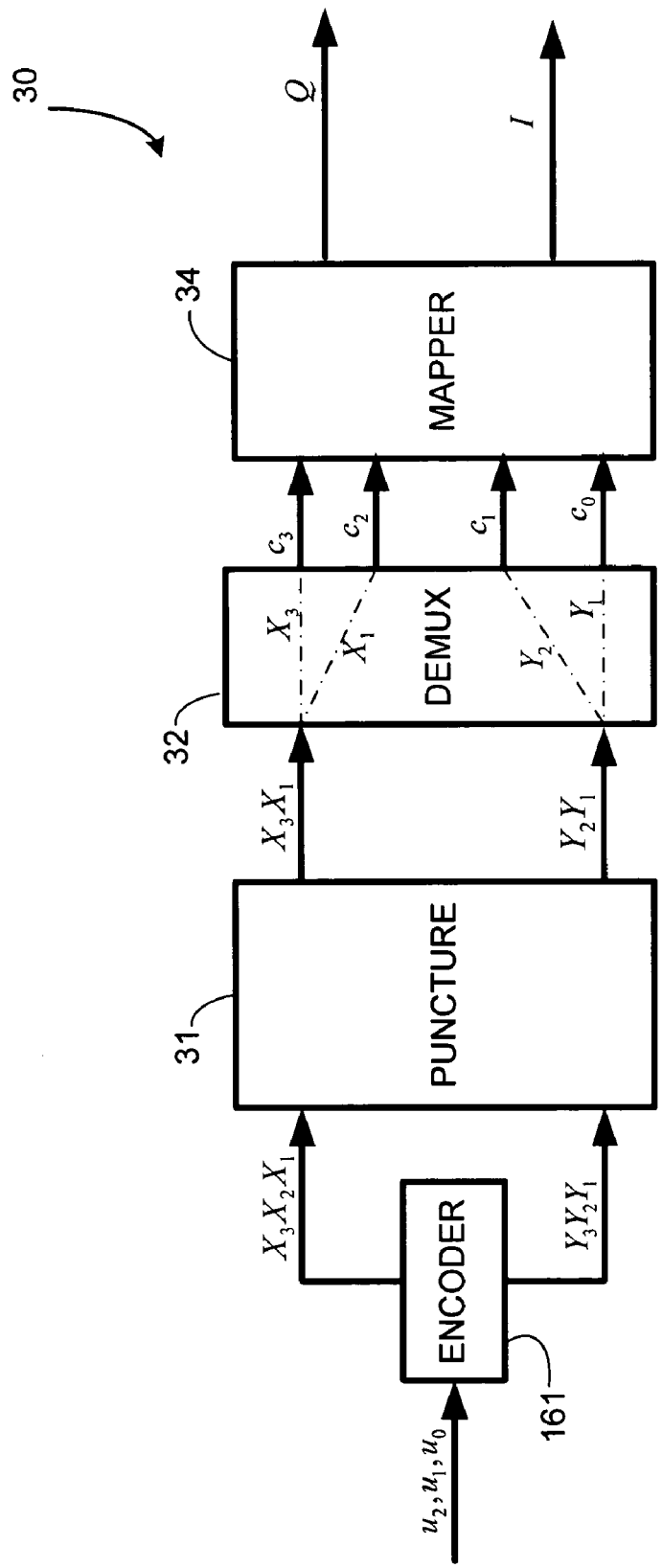
FIG. 3 shows a block diagram of a prior art punctured rate-¾ encoder used in the WiMAX standard.

Consider the 4-QAM building block 20 of FIG. 2. Because each of the four constellation points in the building block 20 are located at ($\pm 1, \pm 1$), we see that the raw uncoded minimum distance between adjacent constellation points is D=2, or $D^2=4$. Based upon the bit encodings of FIG. 2 of these four constellation points, each single bit of change in mapping bits causes movement to an adjacent constellation point, giving rise to a movement of $D^2=4$ in the constellation. Hence when encoding is applied, the MSED of the building block is $D^2=4 \times d_{free}$. Recall that the X and Y output bits of the encoder 161 are used to select one of the four constellation points of the 4-QAM building block 20. In particular, the 64-state, rate-½ convolutional code 161 has a free Hamming distance of $d_{free}=10$. Therefore, when the two input bits of the four-point building block 20 are generated by the convolutional encoder 161, the MSED of the resulting coded building block 20 is $D^2=4 \times 10=40$. As is explained in Table 12.1 (pages 539-540) of the Lin and Costello reference, the number of states needed to generate a given $d_{free}$ increases with the code's rate and with $d_{free}$. Once this building block is identified, it can be seen that the constellation mapper 163 merely places one such coded building block 20 in each of the four quadrants of the I/Q plane, resulting in the 16-QAM constellation of FIG. 174a. However, as previously mentioned the MSED of the 16-QAM constellation produced by FIG. 163 is only $D^2=16$. That is, the MSED of $D^2=40$ of the 4-QAM building block placed in each quadrant is diminished in the prior art due to suboptimal tiling. We could more efficiently obtain a coded 16-QAM constellation with an MSED of $D^2=16$ by selecting an 8-state convolutional coder to code the building block 20. This would provide a building block with an MSED of $D^2=16$. When this less powerfully coded building block is tiled into the four quadrants, the MSED inside each building block is $D^2=16$ and the minimum distance between different tiles is $D^2=16$, so the overall 16-QAM constellation maintains an MSED of $D^2=16$.

The present invention is based upon the observation that the reason the MSED of the constellation generated by the encoder 163 drops down from $D^2=40$ to $D^2=16$ is because the inter-block distance between different building blocks dominates the minimum distance. Note that the centers of the 4-QAM building blocks 20 located in each quadrant of the 16-QAM constellation 174a are located at points ($\pm 2, \pm 2$). That is, the distance between building-block centers is D=4, or $D^2=16$. This shows an imbalance, i.e., the intra-block points are protected with a powerful 64-state code and enjoy an MSED of $D^2=40$ in each quadrant, but the overall 16-QAM constellation 174a's performance is limited by to the lesser distance between tile centers, i.e., $D^2=16$. This is because a movement of $D^2=16$ within the constellation 174a gives rise to a bit error in one of the two uncoded bits of the WiMAX encoder 163. This is the limiting factor that needs to be corrected and is addressed by the present invention. That is, the present invention recognizes a "tiling loss" to be the limiting factor in many practical trellis coded systems. The present invention adopts the general framework of multilevel codes to solve this problem, but uses a unique partitioning that places a set of coded building blocks at a set of coded tiling points. This difference in approach leads to very practical codes that provide near-optimal results with very low cost. In some cases a small increase in complexity is needed (e.g., 27% for the 16-state 4D Wei code). In other cases, such as the WiMAX codes, the gains of the present invention can be realized technique with a modest increase in complexity on the order of 18%-33%.

To develop the general approach of the present invention, we first show how the building block 20 can be tiled without tiling loss. Our design goal is to redesign the WiMAX constellations 174a, 174b and 175 in such a way that the redesigned constellations all achieve the smaller building block 20's MSED of $D^2=40$. To redesign the 16-QAM constellation 174a, we map the two uncoded bits of the encoder 163 to a 4-QAM tiling constellation whose tiling points are enumerated according to the LSB enumeration policy 40. Next we tile the 4-QAM building block 20 at each tiling point of this 4-QAM tiling constellation. We then LSB-encode each axis of the 4-QAM tiling constellation with a simple 16-state LSB encoder 61a to LSB-encode what were previously the uncoded bits in the encoder 163. Note that the rate-⅘ convolutional encoders 61a have a free Hamming distance of $d_{free}=3$. Therefore, the MSED between tiling-point trellis sequences rises to $3 \times D^2=3 \times 16=48$. With this increase, the MSED of the entire constellation is now limited by the building block's intra-MSED of $D^2=40$; that is the MSED of the redesigned version of the 16-QAM constellation 174a has increased to $D^2=40$ and the tiling loss has been eliminated.

In the decoder, it will take a 64-state decoder to decode the 4-QAM building block 20, and this will be the same as what is needed to decode the WiMAX code 163. Also required are two 16-state LSB decoders. Note these decoders are 16-state as opposed to 64-state, use real arithmetic, only have two branches per state, and in the 16-QAM case, only operate on two PAM tiling points each. Importantly, these decoders reuse the branch metrics already computed by the 64-state building block decoder. Therefore there is coding complexity is kept under control. As we show, the decoding complexity is reduced by 35%-50% as compared to the WiMAX codes codes.

Figure 4:
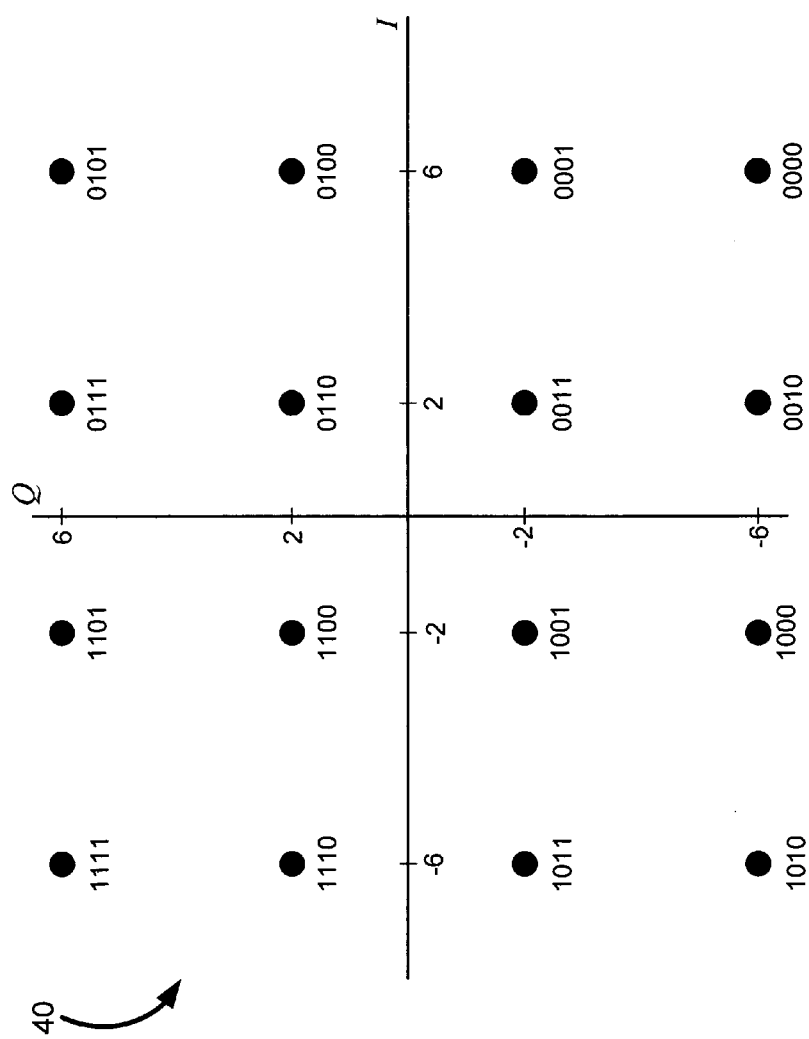
FIG. 4 illustrates a constellation mapping for an LSB-mapped 16-QAM constellation. This constellation can be used as a tiling code in the context of the present invention and defines an LSB bit mapping rule.
Figure 5:
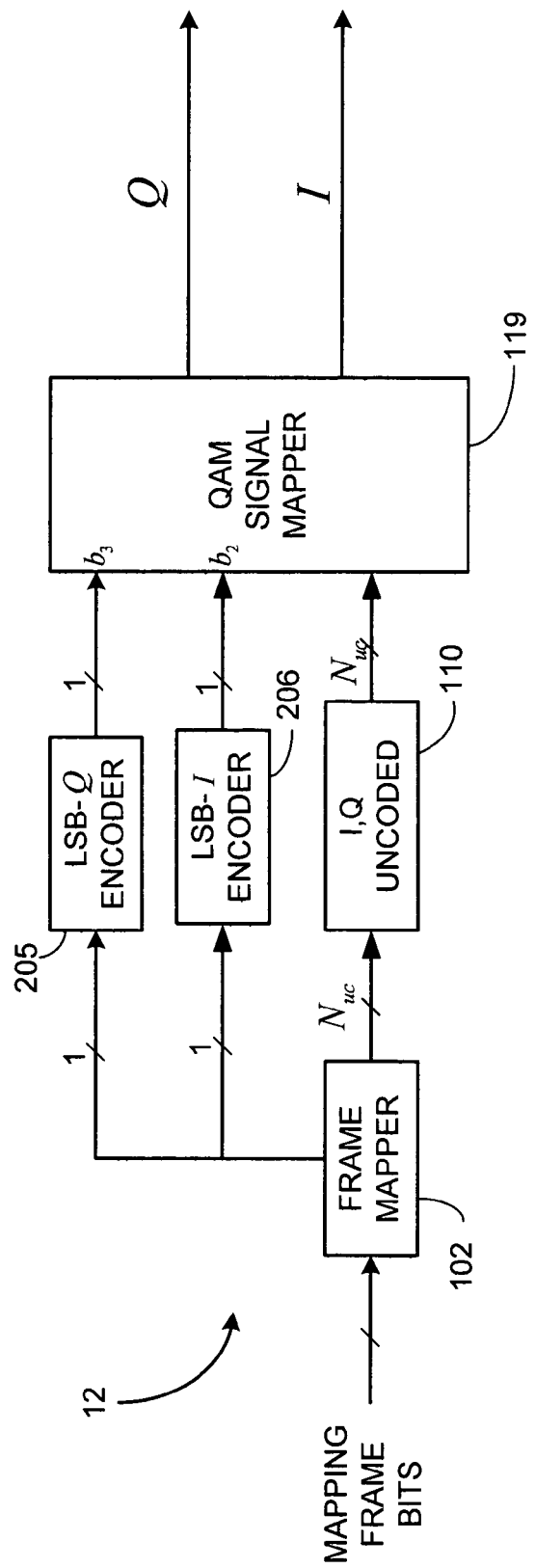
FIG. 5 illustrates a constellation mapper used to generate LSB-encoded QAM constellations in the J.83 standard.
Figure 6:
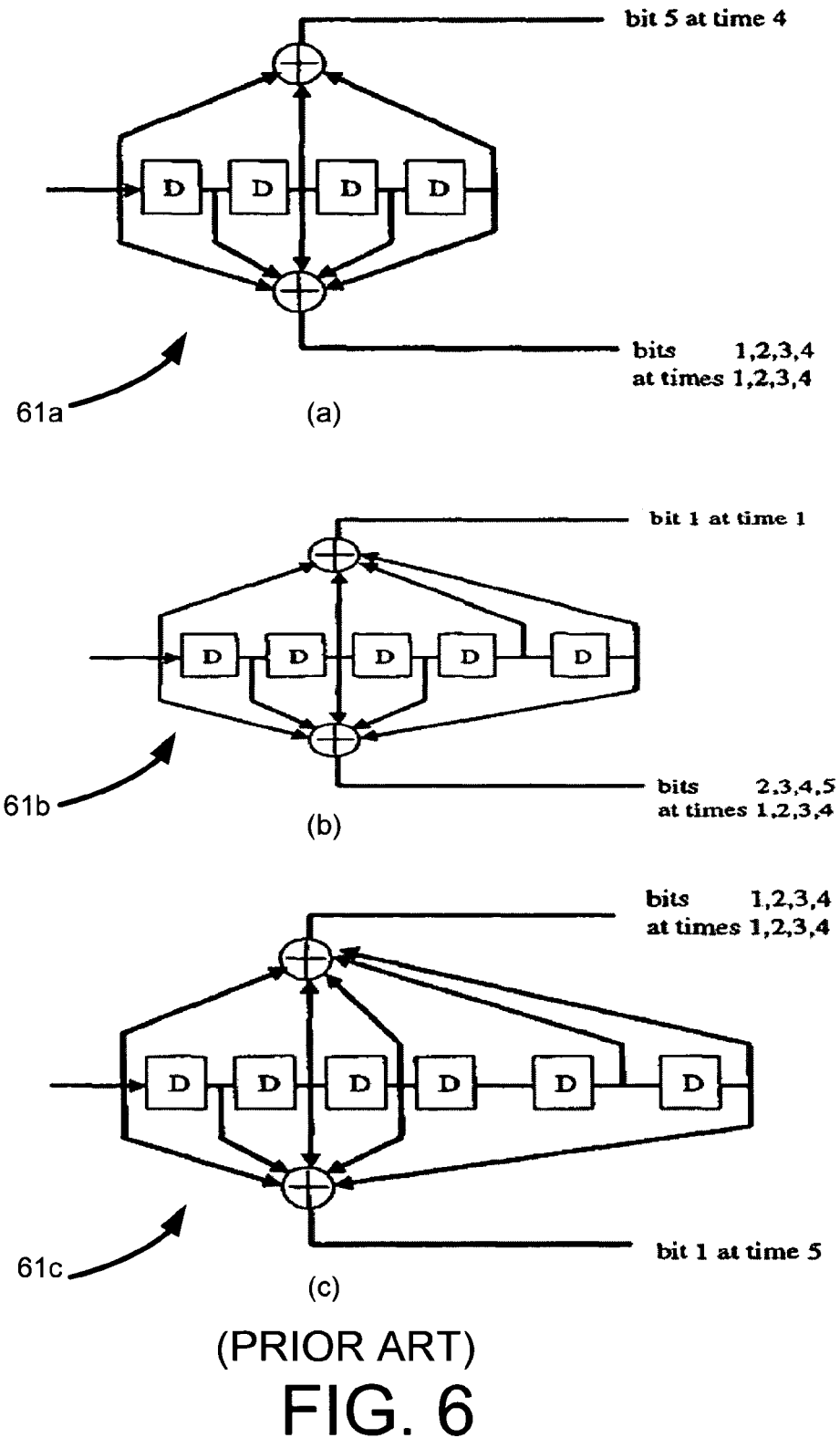
FIG. 6 illustrates a 16-state rate-⅘ encoder used in the J.83 standard to increase the MSED between adjacent signal points in the LSB-mapped QAM constellation of FIG. 4 by a factor of three, a 32-state rate-⅘ encoder that is able to increase the MSED between adjacent signal points in the LSB-mapped QAM constellation of FIG. 4 by a factor of four, and a 64-state rate-⅘ encoder that is able to increase the MSED between adjacent signal points in the LSB-mapped QAM constellation of FIG. 4 by a factor of four.

To now improve the coding of the 64-QAM constellation 174b, place the coded 4-QAM building block 20 at each point of a 16-QAM tiling constellation whose sixteen tiling points are located at ($\pm 2, \pm 2$), ($\pm 2, \pm 6$), ($\pm 6, \pm 2$) and ($\pm 6, \pm 6$). In this example the tiling constellation is exactly the LSB-mapped constellation 40 as illustrated in FIG. 4. The raw uncoded MSED between tiling points of the 16-QAM tiling constellation 40 is D=4 or $D^2=16$. Next encode one uncoded bit in each of the I and Q directions, e.g., the next-to-right-most and right-most bits shown in the constellation 40 using the encoder 61a. This will increase the distance between adjacent tiling points in the 16-QAM constellation to $D^2=48$. As in the 16-QAM 174a case, this additional coding increases the MSED of the coded 64-QAM constellation 174b to $D^2=40$. Likewise, the 256-QAM constellation 175 can be viewed as 64-QAM tiling constellation with the 4-QAM building block 20 placed at each point. Again, the uncoded distance between tiling points is $D^2=16$. Therefore the same LSB constellation mapping and encoding rule can be used to increase the distance between adjacent tiling points in the 16-QAM constellation to $D^2=48$. Using this same approach, the MSED of the coded 256-QAM constellation is thereby increased to $D^2=40$. In the receiver, the same two LSB decoders as discussed in the context of the 16-QAM 174a example will be used, except with four and sixteen tiling points respectively instead of two. As will be explained below, this results in a very minor increase in coding computations relative to WiMAX, e.g., six percent for the 16-QAM constellation 174a and 2 percent for the 256-QAM constellation 175. As also explained below, the computational load actually drops below WiMAX levels when a 4D building block is employed instead of the 2D building block 20.

FIG. 9 is a block diagram representing an illustrative embodiment of a tiled-building-block trellis encoder 100 in accordance with the present invention. A set of Q input bits enter the encoder each mapping frame. A frame mapper 102 distributes the Q input bits to different encoder components each mapping interval as discussed below. A mapping interval is defined as a time frame in which a constellation symbol is produced. For example, if the constellation is a trellis encoded 2D-QAM constellation, a mapping interval is one 2D-QAM signaling interval. If the constellation is a trellis encoded 4D-QAM constellation, a mapping interval is two 2D-QAM signaling intervals. If the constellation is a trellis encoded 2N-dimensional QAM constellation, then the mapping interval is N 2D QAM signaling intervals. In some systems, mapping frames with multiple coded symbol mapping intervals per mapping frame can be defined. This is because it may be advantageous to implement an energy set mapping scheme over more than one symbol's mapping interval. Energy set mapping techniques are discussed below in the context of specific examples.

The frame mapper 102 passes a set of $N_{BB}$ (BB=building block) input bits each mapping interval to a building-block trellis encoder 115. The building-block trellis encoder 115 generates a set of coded bits to be mapped by a signal mapper 120 onto a coded constellation. A coded constellation building block will be tiled onto a larger signal constellation by placing a copy of the coded constellation building block at each its tiling point of a tiling constellation. The frame mapper 102 passes a set of $N_T$ (T=tiling) input bits each mapping interval to a tiling encoder 105. As discussed in further detail below, the tiling encoder 105 increases the MSED between coded tiling sequences. The frame mapper 102 also passes an optional set of $N_{uc}$ (UC=uncoded) bits to an optional bit converter 110. For example, if the tiling encoder is implemented as a pair of LSB encoders, once the lower order tiling bits are protected, additional uncoded bits may be added without introducing any tiling loss. Often the optional bit converter 110 is implemented as a straight pass-through of uncoded bits, but can also implement logical operations, for example, to differentially encode or to shape the constellation produced by the signal mapper 120 and/or to otherwise minimize average bit energy.

The building-block-trellis encoder 115 can be implemented using the WiMAX encoder 161, and can be configured to so that the mapper 120 maps the coded bits $c_1c_0$ onto a selected tiled copy of the 2D 4-QAM building block 20. Different convolutional encoders beside the encoder 161 can be generally used by the building block encoder 115. Similarly, we could select a rate-⅔ convolutional coder or a rate-¾ convolutional encoder to be used in the building block encoder 115. The specific choice of coding rate, the convolutional code used in the building block and the 2D or higher constellation geometry of the building block implemented by the mapper 120 are left to the designer. Design guidelines are illustrated in several examples below.

Figure 10:
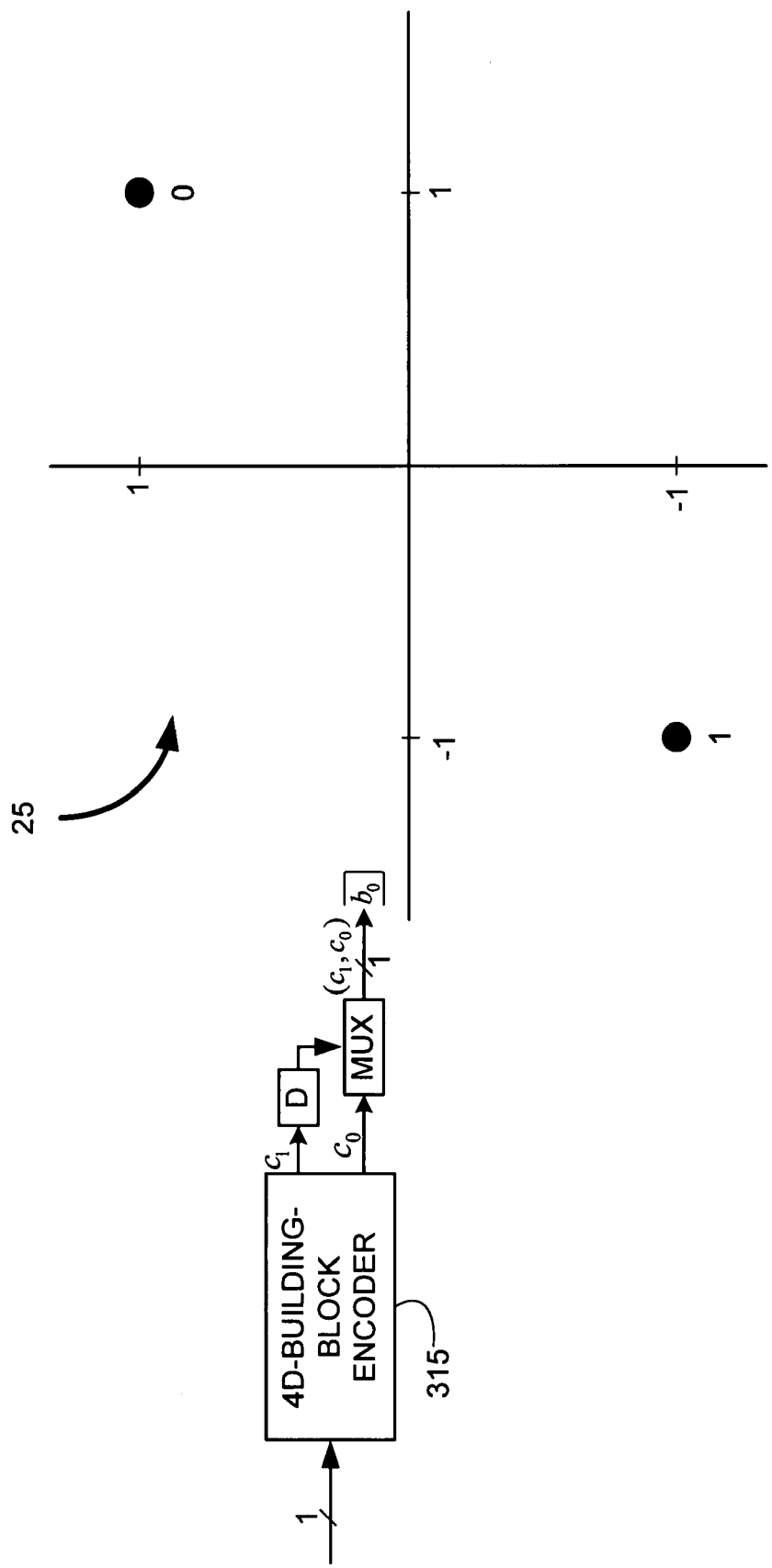
FIG. 10 illustrates a constituent 2D constellation of a 4D building block, constructed according to an aspect of the present invention.

In accordance with an aspect of the present invention, as illustrated in FIG. 10, the building block encoder 115 may be embodied as a 4D building block encoder 315. A constituent 2D constellation 25 is generated by the 4D building block encoder 315 each 2D signaling interval. The building block encoder 315 generates a pair of constituent 2D constellations 25 each 4D mapping interval to create a coded 4D constellation building block. As can be seen from FIG. 10, the raw uncoded distance between adjacent signal points corresponding to a single bit separation is $D=2\sqrt{2}$, or $D^2=8$ (as opposed to $D^2=4$ in FIG. 2). Once this building block is trellis encoded using a convolutional code with a free Hamming distance of $d_{free}$, the intra-block MSED of the 4D building block becomes $D^2=8\times d_{free}$. That is, a less complex 32-state convolutional code with a free Hamming of $d_{free}=8$ can be selected, in which case the intra-block MSED between coded building-block sequences becomes $D^2=64$. This is in contrast to the 2D 4-QAM building block 20 which used the more powerful 64-state code 161 with $d_{free}=10$ just to achieve an MSED of $D^2=4\times 10=40$. That is, the increased uncoded MSED of the 4D building block allows us to select a 32-state code instead of a 64-state code, while at the same time, increasing the inter-block MSED to $D^2=64>40$.

Referring now to FIG. 10, the 4D building block encoder 315 takes in one input bit per 4D mapping interval. In an exemplary embodiment, this input bit is then passed through a 32-state rate-½ convolutional encoder to produce two coded output bits, c0 and c1. Each 4D symbol interval, the c0 bit is mapped onto a first constituent 2D building-block constellation 25 in a first 2D signaling interval and the c1 bit is mapped onto a second constituent 2D building block constellation 25 in a second 2D signaling interval. The two coded output bits of the rate-½ 4D building block trellis encoder 315 are mapped by the mapper 320 into consecutive 2D signaling intervals using the delay element and multiplexer/selector at the output of the 4D building block encoder 315. Together the two coded bits are mapped onto a corner of a small compact 4D hypercube. As discussed above, if a 32-state trellis encoder with Hamming distance $d_{free}=8$ is used in the 4D building-block encoder 315, this provides an MSED of $D^2=64$ inside the 4D building block. While the 4D building block 40 enjoys a distance advantage over the building block 20, the 4D building block 40 only carries 0.5 bits per interval while the building block 20 carries 1 bit per interval. In general, different dimensioned building blocks can be used, or larger or smaller building blocks with more than or less constellation points per symbol can be defined.

The tiling encoder 105 is configured to increase the MSED between near-by tiling points. The signal mapper 120 inserts a coded building block into each tiling point of a selected tiling constellation. The tiling encoder has the effect of increasing the MSED between tile centers. This becomes important when the uncoded MSED between tile centers is less than the intra-block MSED within the building block placed at each tiling point. If the tiling encoder 105 is selected to raise the tiling MSED to the building block's intra-block MSED, the resulting tiled-building-block trellis code will be well balanced and will not suffer a tiling loss. In some cases the MSED of the tiling code can be less than or greater than the intra-block MSED of the building block to account for secondary effects such as error coefficient or for efficiency of implementation.

Figure 11:
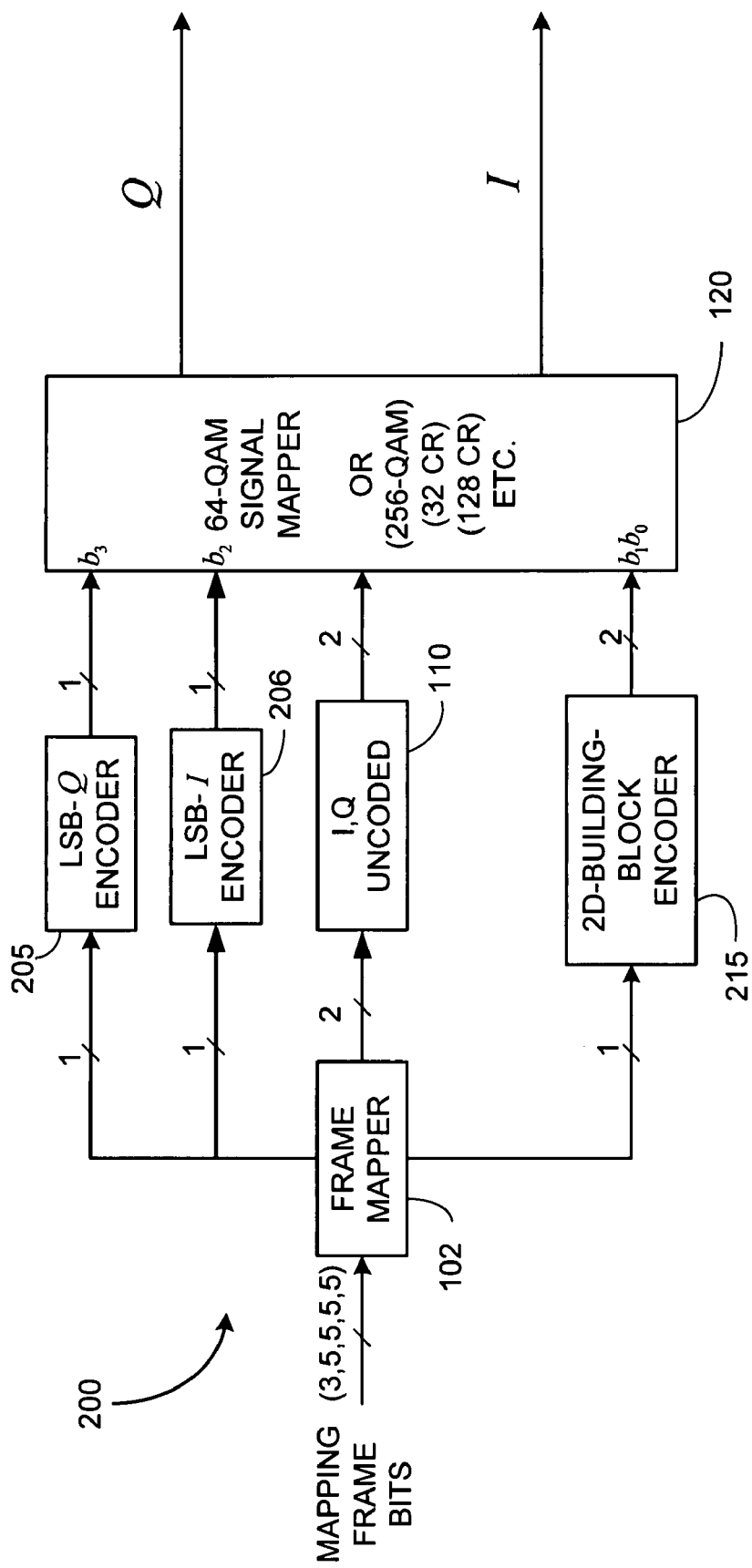
FIG. 11 is a block diagram illustrating an exemplary embodiment of tiled-building-block trellis encoder that uses a 3×MSED multiplying LSB encoder as a tiling encoder and with the WiMAX 64-state rate-½ coder used as a 2D building block encoder.

Turning now to FIG. 11, a specific embodiment of a tiled-building-block-trellis encoder is provided in block diagram form. This is the embodiment discussed above that tiles the 2D 4-QAM building block 20 while maintaining the building block 20's MSED of $D^2=40$ over a larger tiled constellation, e.g., 16-QAM, 64-QAM or 256-QAM. FIG. 11 shows the specific case mapping m=5 bits per interval to a coded 64-QAM constellation. An encoder 200 receives 23 input bits which it transmits over five 2D signaling intervals. Five information bits are transmitted during the first four 2D signaling intervals, and three information bits are transmitted along with two tiling encoder parity bits in the fifth 2D signaling interval. This is because in this embodiment the tiling encoder 105 is implemented using I and Q LSB encoders 205, 206 that each use the 16-state, rate-⅘ convolutional encoder 61a. The frame mapper 102 distributes five bits per signaling interval as shown in FIG. 11, except in the fifth signaling interval no input bits are sent to the LSB encoders 205 and 206 because this is when these rate-⅘ encoders transmit their parity bits. The frame mapper 102 sends one information bit to the 2D building block encoder 215 each 2D signaling interval. Each 2D signaling interval, 2D block encoder 215 generates a constellation point of the 2D building block 20 of FIG. 2. In the 64-QAM example shown in FIG. 11, there are also two uncoded bits. The bit converter 110 preferably passes the two uncoded bits straight through without modification, or, no bit converter is used. Each 2D mapping frame the signal mapper 120 maps a total of four tiling bits and two building-block bits to a 64-QAM constellation point of the constellation 174b. This causes the building block 20 to be placed on each point of the 16-QAM LSB-encoded constellation 40 of FIG. 4. If the two uncoded bits are removed, then the coder 200 maps the 4-QAM building block onto a 4-QAM tiling code and thus produces a modified-coded version of the 16-QAM constellation 174a. If the number of uncoded bits is increased to four, then each 2D signaling interval the signal mapper 120 maps six tiling bits and two building-block bits onto the 256-QAM constellation 175.

Because the 4-QAM building block has an MSED of $D^2=40$, we desire a tiling code with an MSED $D^2 \geq 40$. Recall that the 16-state rate ⅘ encoder 61a is able to increase the effective separation between LSB-coded QAM constellation points in the constellation 40 to $3*D^2$. Therefore, the pair of encoders 205, 206 increase the separation between adjacent tiling points from $D^2=16$ to $D^2=3*16=48$. That is, the overall MSED of the tiled-building-block encoder 200 is limited by the coded constellation building block 20's MSED of $D^2=40<48$. Any of the 16-QAM, 64-QAM or 256-QAM constellations of FIGS. 174 and 175 can now be employed with an MSED of $D^2=40$ as opposed to $D^2=16$ or $D^2=20$ as per the WiMAX standard. It can be shown that the addition of the tiling coder respectively increases the performance of the rate-¾, rate-⅚, and rate-⅞ coders of FIGS. 163, 165, and 167, respectively, by 3.36 dB, 2.65 dB, and 2.75 dB. It can be also shown that the addition of the tiling coder respectively decreases the decoding complexity of the rate-¾, rate-⅚, and rate-⅞ coders of FIGS. 163, 165, and 167, respectively, by 49%, 46% and 36%.

The above schemes constructed using the 2D building block 20 targeted data rates 3, 5 and 7 bits/interval, but ended up transmitting data rates 2.6, 4.6 and 6.6 bits/interval. The reduction in the data rate is due to LSB coding. If the constellations are expanded to accommodate the WiMAX data rates of 3, 5, and 7 bits per interval, the respective coding gains can be shown to be 1.6616 dB, 1.4387 dB, and 1.4490 dB above the WiMAX standard. Some detailed examples of how constellations are expanded and contracted to match to meet a selected target data rate are provided below.

The above coding gains are a bit optimistic because the encoder 200 does not achieve the same 5 bits/interval transmission rate of the WiMAX standard. As shown in FIG. 11, for each twenty-five input bits we loose two bits to LSB encoding overhead. If no uncoded bits are used then the data rate is 13/5=2.6 bits per interval as opposed to 3 bits per interval obtained by the WiMAX rate-¾ code 163, 174a. If two uncoded bits are used as shown in FIG. 11, then the data rate is 23/5=4.6 bits per interval as opposed to 5 bits per interval obtained by the WiMAX rate-⅚ code 165, 174b. If four uncoded bits are used instead, then the data rate is 33/5=6.6 bits per interval as opposed to 7 bits per interval obtained by the WiMAX rate-⅞ code 167, 175. As mentioned above, the added coding/decoding cost is very low, on the order of a few percent. This is because the added LSB encoders are 16-state as opposed to 64-state, only have 2 branches exiting and entering each state as opposed to 64 (including parallel paths) for the 64-state WiMAX encoder, the branch metrics from the 64-state encoder are reused by the 16-state LSB encoders and the branch metrics used by the LSB decoder use real arithmetic.

Figure 12:
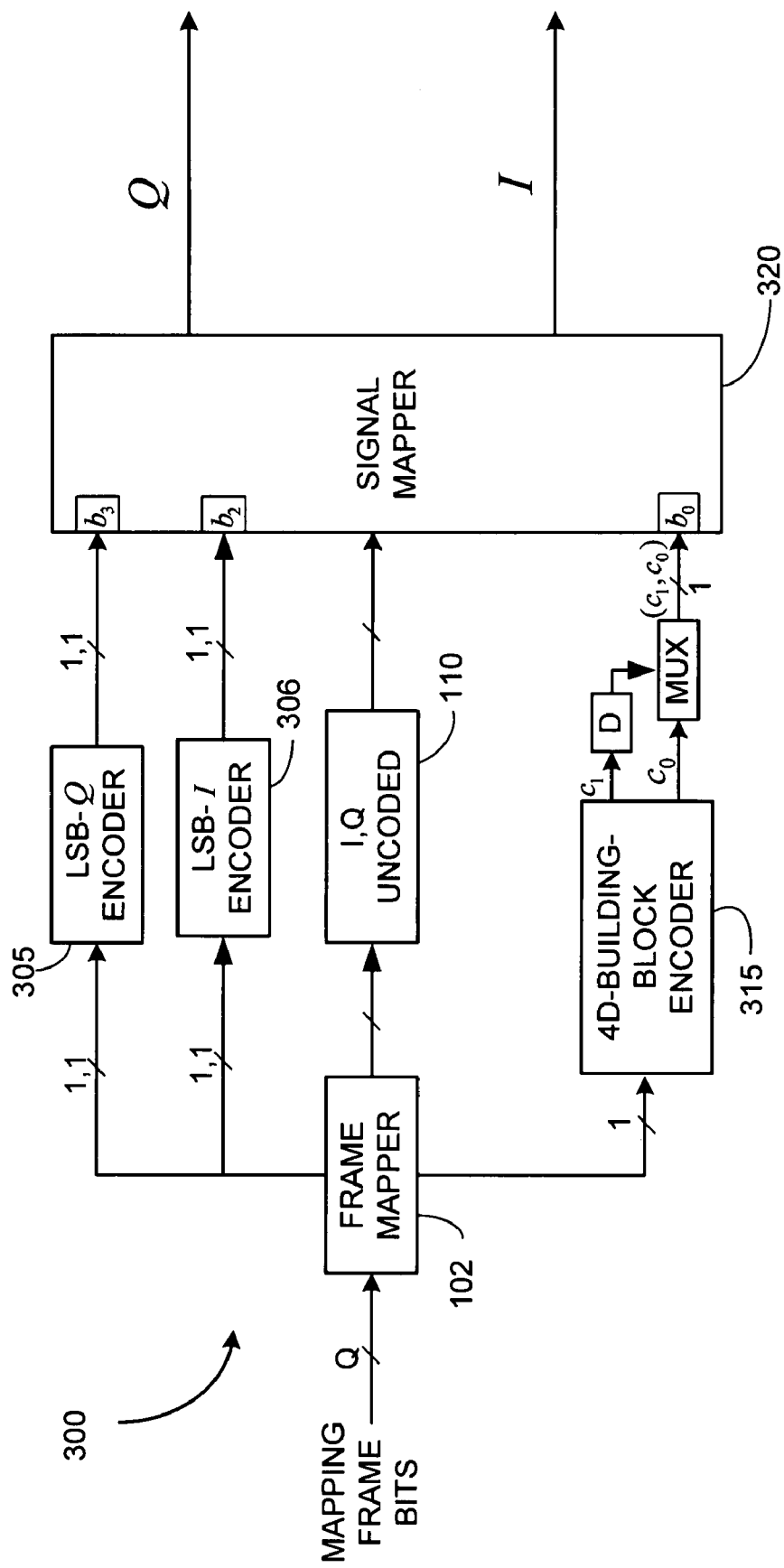
FIG. 12 is a block diagram illustrating a exemplary embodiment of tiled-building-block trellis encoder that uses an enhanced 4×MSED multiplying LSB encoder as a tiling encoder and with a novel 32-state rate-½ 4D building-block trellis encoder.

FIG. 12 shows a tiled-building-block trellis coder 300 that replaces the 2D building block encoder 215, 20 with the 4D building block encoder 315, 25. As discussed in connection with FIG. 10, the 4D building block 25 is less costly to implement than the 2D building block 20 because the 4D building block obtains an MSED of $D^2=64$ using just a 32-state convolutional encoder with a free Hamming distance of $d_{free}=8$. This reduces the decoding complexity relative what is needed to decoder the 64-state code 161 used in the WiMAX, not only by having fewer states, but by only needing to perform selections and comparisons for two branches per state instead of eight branches per state needed to decode the punctured WiMAX code 30, 171, 174b, 175. In the encoder 300, two 32-state rate-⅘ LSB coders 305, 306 are used (61b, or the 64-state coder 61c can be used for improved error coefficient) to implement the tiling encoder function. These 32-state LSB encoders are selected because they provide a distance improvement factor of $4D^2$, instead of $3D^2$ as was provided by the 16-state J.83 LSB encoder 61a used in the encoder 200. That is, the tiling coders are selected to increase the MSED of the tiling code to $4D^2=4 \times 16=64$. This balances the MSED between tile centers with the intra-block MSED of the points within each 4D building block.

As discussed in further detail below in connection with FIG. 14, the frame mapper 102 in FIG. 12 does a bit conversion operation to generate the pair of 1-bit inputs to a respective pair of I and Q LSB encoders 305, 306. The frame mapper 102 also produces independent sets of independent I and Q mapping bits to be processed along the uncoded bit channel 110. We next configure the encoder 300 to transmit on the order of 5 bits per interval in order to be comparable to the WiMAX rate-⅚ 64-QAM encoder. In such an embodiment, each interval the bit mapper 102 processes five bits and outputs two sets of three bits each which will be independently mapped to the I and Q channels to select a tiling point. In this case the tiling constellation is a 32 CR and the two sets of 3 bits each collectively select a tiling point on the 32 CR constellation. When the parity bits of the rate-⅘ tiling encoders are taken into account, each bit of each of the two independent 3-bit I and Q mapper words transmit 2.8/3 bits of information. Since we do not use any points outside the 32 CR and since we map five bits onto these reduced data rate bits, the overall data rate carried by each constituent 2D tiling constellation becomes 5×2.8/3=4.6667 bits per interval. The frame mapper 102 also dispatches 0.5 information bit per 2D interval to the 4D building block encoder 315, so the total data rate becomes 5.167 bits per interval. This is comparable to the WiMAX data rate of 5 bits/interval of the encoder 165 and the constellation 174b. Similarly, to target a 7 bits/interval data rate, we start by mapping 7 bits/interval onto a 128 CR constellation. These 7 bits/interval are converted into two independent 4-bit mapping nibbles to separately select I and Q components of a tiling point in the 128 CR tiling constellation. Care should be taken to only use a subset of possible combinations available by the nibbles. The nibbles provide independent I and Q control, but offer some combinations that should not be used. If these combinations are used, the constellation will unduly expand.

The LSBs of each of the I and Q mapping nibbles are sent to respective LSB encoders 305, 306. Taking into account the data rate reduction due to the rate-⅘ LSB encoders, each bit in each of the I and Q mapping nibbles carries 3.8/4 bits of information. Since we map 7 bits per interval to the tiling encoder and do not use any tiling points outside the 128 CR, the total data rate supported by the tiling constellation is 7*(3.8/4)=6.65 bits/interval. The frame mapper 102 also dispatches 0.5 information bit per 2D interval to the 4D building block encoder 315, so the total data rate of this design becomes 6.65+0.5=7.15 bits per interval. This is comparable to the rate-⅞ WiMAX encoder 165 and its constellation 175.

Figure 13:
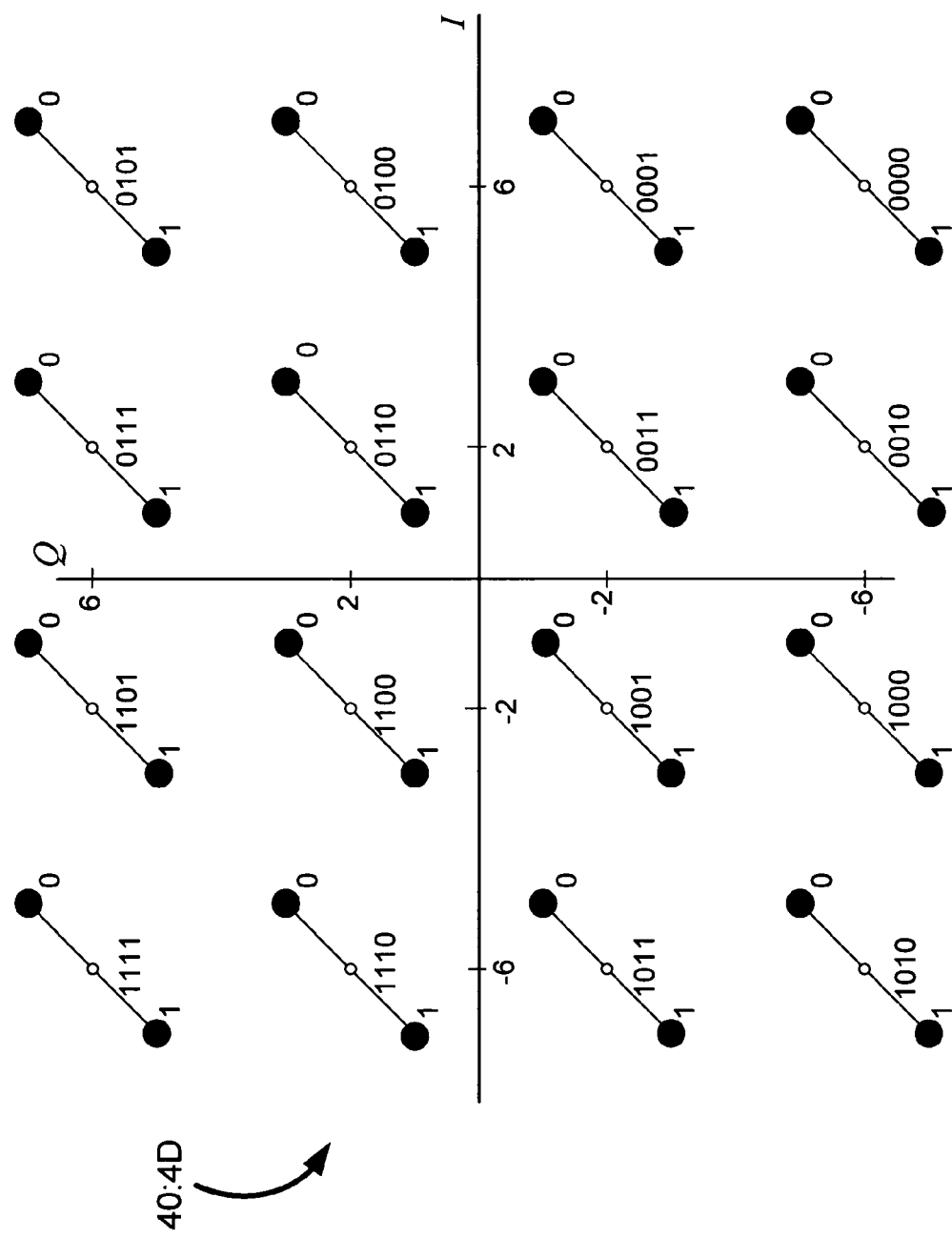
FIG. 13 is a constellation diagram showing a constituent 2D constellation of a 4D coded constellation that is tiled using a 4D constellation building block.

FIG. 13 shows a constellation generated by the encoder 300 in an embodiment configured to send 4.1 information bits per interval. The frame mapper 102 is configured to dispatch two bits per 2D interval to determine and I component of a 16-QAM tiling point and two bits are dispatched to determine the Q component. The I and Q LSBs of these two bit sets are LSB encoded. As shown in FIG. 13, the encoder 300 configured this way produces a 16-QAM tiling constellation with a constituent 2D constellation 25 of the 4D building-block placed at each tiling point. The tiling points of the tiling constellation are represented by small circles which are at the center of the 2D constituent building block constellations 25. Note the small circles of the tiling constellation correspond to the LSB-enumerated 16-QAM constellation 40 of FIG. 4. When the LSB codes are used as a tiling code in this way, an overall tiled constituent 2D constellation results which we label 40:4D in FIG. 13. Each 2D interval, two uncoded tiling bits and two LSB encoded tiling bits combine to select a 16-QAM tiling point. Each coded output bit of the 4D building block trellis encoder 315 further specifies whether the upper-diagonal or lower-diagonal building-block-constellation point will be sent. As can be seen from FIG. 13, when the 4D building block is used, the number of points in the total constellation is double the number of points in the tiling code.

Note that the average symbol energy of the scheme shown in FIG. 13 is $E_{avg}$=42 (40 from the tiling constellation and 2 from the building block). As mentioned above, 4.1 information bits are transmitted per interval on average. Hence, the average bit energy is given by $E_{avg,b}$=42/4.1. Recalling that $D^2$=64, the normalized MSED is given by $d_{min}^2 = D^2 / 2E_{avg,b}$=3.312. If this is compared to uncoded 16-QAM which is known to have $d_{min}^2$=0.8, it can be seen that the signaling scheme of FIG. 13 performs 5.9159 dB better than uncoded 16-QAM, i.e., the uncoded version of the underlying tiling constellation. This near-6 dB improvement makes sense since the MSED of the constellation 40:4D is $D^2$=64 and the MSED of the uncoded 16-QAM tiling constellation is $D^2$=16. This factor of four improvement accounts for 6 dB of coding gain. The final overall gain needs to be calculated by considering the slight increase in the transmitted symbol energy (from 40 to 42) and the change in the data rate (from 4 to 4.1 bits/interval).

If two uncoded bits are added, one to the I and one to the Q component, the encoder 300 transmits 6.1 bits per signaling interval using a square 64-QAM tiling constellation similar to FIG. 13, with the constituent 2D building block constellation 25 at each tiling point. This constellation has the same MSED of $D^2$=64, but in this case $E_{avg}$=170 (168 from the tiling constellation and 2 from the building block), and $E_{b,avg}$=170/6.1, so that $d_{min}^2 = D^2/2E_{b,avg}$=1.148. The uncoded 64-QAM tiling constellation has $d_{min}^2$=0.2857, so that the above scheme performs 6.041 dB better than uncoded 64-QAM. This is greater than 6 dB because the effect of constellation expansion is less and there is a slight increase in data rate. Also note that the rate-⅚ WiMAX code 165 has a normalized MSED of $d_{min}^2$=1.191. This is just slightly more than the $d_{min}^2$=1.148 of the above scheme that transmits 6.1 bits/interval as opposed to 5 bits per interval.

If two more uncoded bits are added, one to the I and one to the Q component, 8.1 information bits per 2D signaling interval are transmitted using a square 256-QAM tiling constellation, with the constituent 2D building block constellation 25 at each tiling point. This constellation has the same MSED of $D^2$=64, but in this case $E_{avg}$=682, so that $d_{min}^2$=0.380. The uncoded 256-QAM tiling constellation has $d_{min}^2$=0.0941, so that the above scheme performs 6.062 dB better than uncoded 256-QAM.

We now compare the encoder 300 to the three WiMAX encoders 163, 165 and 167 which respectively transmit 3, 5 and 7 information bits per interval (i.e., and odd number of information bits per 2D interval). These three WiMAX encoders respectively use the 16-QAM constellation 174a, 64-QAM constellation 174b and 256-QAM constellation 175. The encoder 300 at the corresponding data rates of 3.1, 5.167 and 7.15 information bits per interval respectively transmit their data using 8-QAM, 32 CR and 128 CR tiling constellations. These tiling constellations are tiled with two constellation points per tile (similar to the constellation 40:4D). It can be shown that the encoder 300 using of the 4D building block and the 32-state LDB tiling coders increase the coding gain relative to the rate-¾, rate-⅚, and rate-⅞ WiMAX coders of FIGS. 163, 165, and 167, respectively, by 2.013 dB, 2.259 dB, and 2.263 dB. Using the calculations discussed above, it can readily be shown that the 5.167 bits/interval version obtains 5.999 dB over the uncoded 32 CR tiling constellation and the 7.1 bits/interval version obtains 6.086 dB above the uncoded 128 CR tiling constellation.

These gains come with no loss in data rate but instead a slight increase in data rate relative to their comparable WiMAX counterparts. Also, while two extra decoders are needed, the decoding complexity actually decreases on the order of 36%-49% relative to what is needed to decode the output of the WiMAX encoders 163, 165 and 167. This is because the constellation sizes remain the same so no extra branch metrics are introduced, but the 64-state decoder used in WiMAX is traded for a 32-state decoder with many fewer branches per state to evaluate, with the additional two 32-state LSB decoders only involve real arithmetic, only have 2 branches per state, and reuse a set of metrics already computed for the 32-state building-block decoder. Also, the LSB decoders only operate in a relatively small (square root complexity) PAM constellation.

Figure 14:
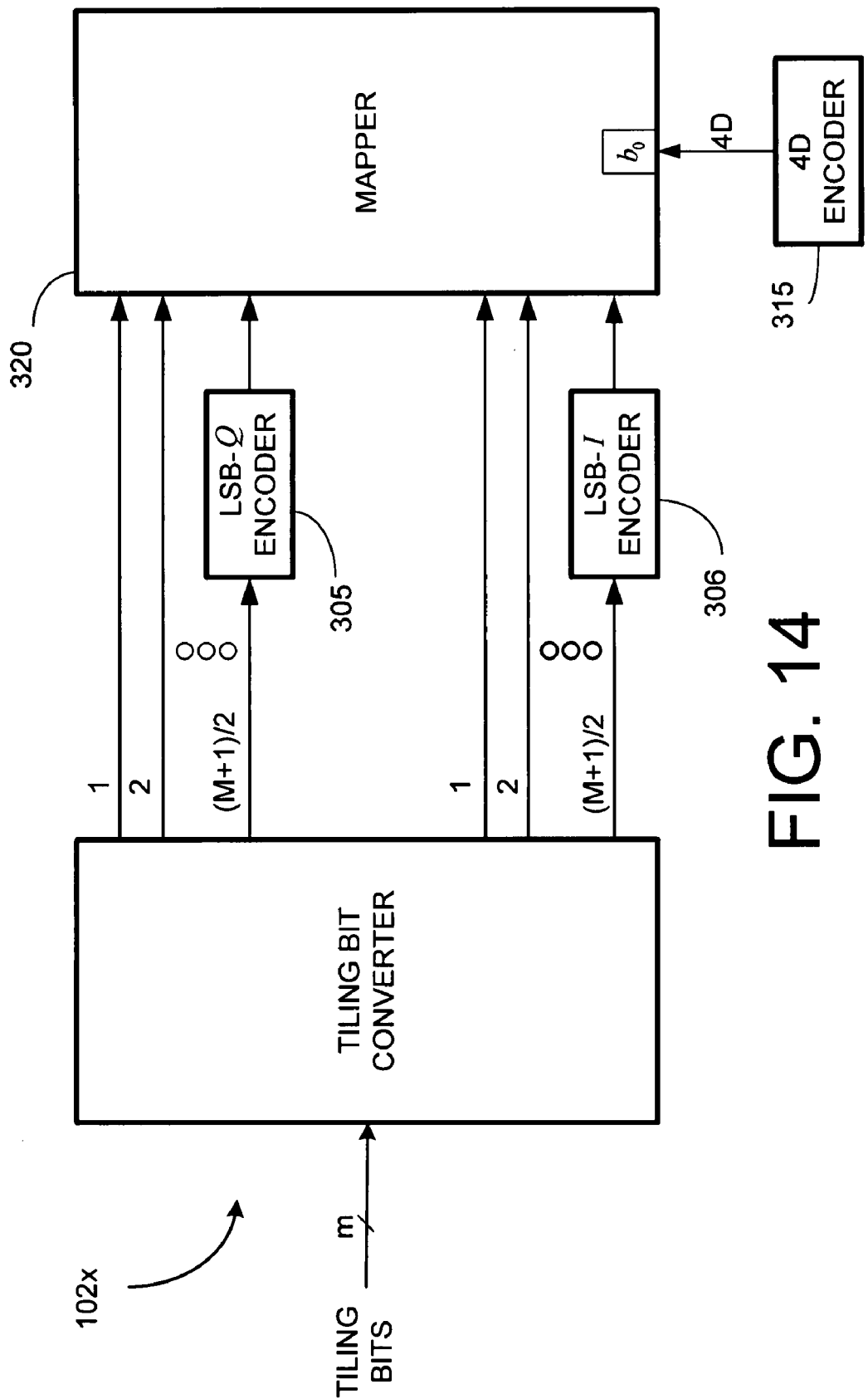
FIG. 14 is a block diagram illustrating an embodiment of a tiling bit converter that is configured to operate with an LSB coded tiling constellation.

Referring now to FIG. 14, next consider the implementation details of LSB coding the 32 CR tiling constellation that arises in the 5.167 bits/interval version of the encoder 300. When m is odd (e.g., m=3, 5, 7), special care need to be taken to LSB-encode the non-square shaped (e.g. 32 CR) tiling constellation. In order to LSB-encode the I and Q channels separately, we use a tiling constellation bit converter 102x to map each 32CR constellation point onto a 6 bit combination. This is because the 32 CR can be viewed as a subset of the square 64-QAM constellation. Once the bit converter has converted the m bits to correspond to six bits of a 64-QAM constellation by splitting them into two groups of three bits each, these two groups can be viewed as separately generating the I and Q components of the 64-QAM constellation. This allows the two LSB encoders to operate as though they were encoding a 64-QAM constellation, even though they never encode any points beyond boundaries of the embedded 32 CR. The function of the bit converter 102x portion of the frame mapper 102 can be viewed as taking the m=5 information bits and assigning an integer value 0 through 31 for each combination. These 32 points are viewed as a subset of the 64-QAM constellation which is enumerated according to known LSB encoding methods. Also the mapping should be done carefully making sure that after LSB coding, even if the LSB code reverses any LSB bit, the LSB coded bits also correspond to a constellation points of the selected 32CR constellation. If the mapping policy is not properly chosen, the constellation can be expanded after LSB coding. In this example, m=5 bits are mapped onto six bits, and these six bits pass through the same two rate-⅘ LSB encoders 305 and 306, providing an average tiling code data rate of 5×(2.8/3) =4.6667 bits/interval. The building block encoder 315 adds 0.5 bits/interval, so that the overall data rate of the above scheme is 5.167 bits/interval, which exceeds our target of 5 bits/interval.

The same tiling bit converter 102x can be applied to frame mapping embodiments when m=7. In this case the $2^7$=128 constellation points of the 128 CR constellation are considered to be a subset of the square 256-QAM constellation. LSB coding is performed as it was over the 256-QAM constellation using the same approach. Care is taken to ensure that the 128 CR is closed over inversions of the two LSBs. This provides an average tiling code data rate of 7×(3.8/4)=6.65 bits/interval. The building block encoder 315 adds 0.5 bits/interval, so that the overall data rate of the above scheme is 7.15 bits/interval, which exceeds our target of 7 bits/interval. The same structure applies to higher values of m as well for the case where m is odd.

So far we have constructed building block trellis codes that maintain an MSED of $D^2$=64 using a 32-state rate-½ convolutional code. We then employed a pair of 32-state LSB encoders to ensure this MSED was maintained once the building block was tiled onto larger constellations of various sizes. Alternatively, we could also target a lower MSED in order to further lower the coding complexity. For example, we can maintain an MSED of $D^2$=48 in the building block by using a convolutional code with $d_{free}$=6, i.e., an 8-state, rate-½ code. Two of the 16-state LSB encoders 61a would be sufficient maintain this $D^2$=48 between tiling points.

FIG. 15 provides a table that quantifies the coding gains of the encoder 300 at different data rates. Coding gains over the uncoded tiling constellations and over the WiMAX and J.83 standards are listed. The relative decoding complexity required to decode the signal 300 as compared to what is required to decode a corresponding WiMAX signal is also provided. As we see, the encoder 300 achieves significant gains over the WiMAX and J.83 standards while reducing decoding complexity by 36%-49%.

Note that the table of FIG. 15 compares the tiled 4D building block approach to J.83, which has a data rate of 5.6 bits/interval and 7.6 bits per interval. Once the data rate is matched as discussed below, the 4D building block approach using $D^2$=48 improves the J.83 LSB encoder by 1.390 dB at the 5.6 bits/interval data rate and by 1.423 dB at the 7.6 bits/interval data rate. If the $D^2$=64 version of the code is used and J.83 is similarly upgraded to one of the LSB encoders 61b or 61c, then 4D building block approach still maintains these same gains over the upgraded version of J.83, i.e., an upgraded version of J.83 that employed one of the more powerful LSB encoders 61b or 61c.

J.83 uses LSB-encoded 64-QAM and 256-QAM constellations, but looses 0.4 bits per interval due to the parity bits added by two rate-⅘ LSB encoders. To perform the above comparisons, we configured the encoder 300 at the 5.6 and 7.6 bits/interval rates. To target 5.6 bits per interval, the frame mapper 102 processes 11 bits per 4D mapping frame to select a pair of tiling points and sends one bit to the building block encoder 315. Each 2D interval, two 3-bit tiling point selector words are generated to provide independent I and Q control for tiling point selection on each of the two constituent 2D tiling constellations. Since each constituent 2D tiling constellation must carry 5.5 bits, we add 16 points to the 32 CR constellation to arrive at the 48 CR+ constellation illustrated in FIG. 16. Since the two LSBs are coded at rate-⅘, the LSB lines only carry 0.8 bits per interval and the net tiling data rate drops to 5.1 bits per interval. Since the building block encoder 315 carries 0.5 bits per interval, the total data rate comes to 5.1+0.5=5.6 bits per interval. If two uncoded bits are added the same logic applies and the tiling constellation carries 7.1 bits per interval and the overall encoder 300 carries 7.1+0.5=7.6 bits per interval.

Focusing on the 5.6 bits/interval embodiment, the 48 CR+ constellation adds 16 more points to the outside of the 32 CR in such a way as to add as little extra average energy as possible while accommodating the extra half of a bit per interval. Also, expanding the 128 CR constellation by 50% adds 64 constellation points and yields what we call a 192CR+ constellation. The 192 CR+ constellation adds 64 more points to the outside of the 128 CR in such a way as to add as little extra average energy as possible. As discussed below, the expanded constellations we use in this type of embodiment are slightly less energy efficient then Wei's expanded constellations in order to make LSB encoding easier.

Figure 16:
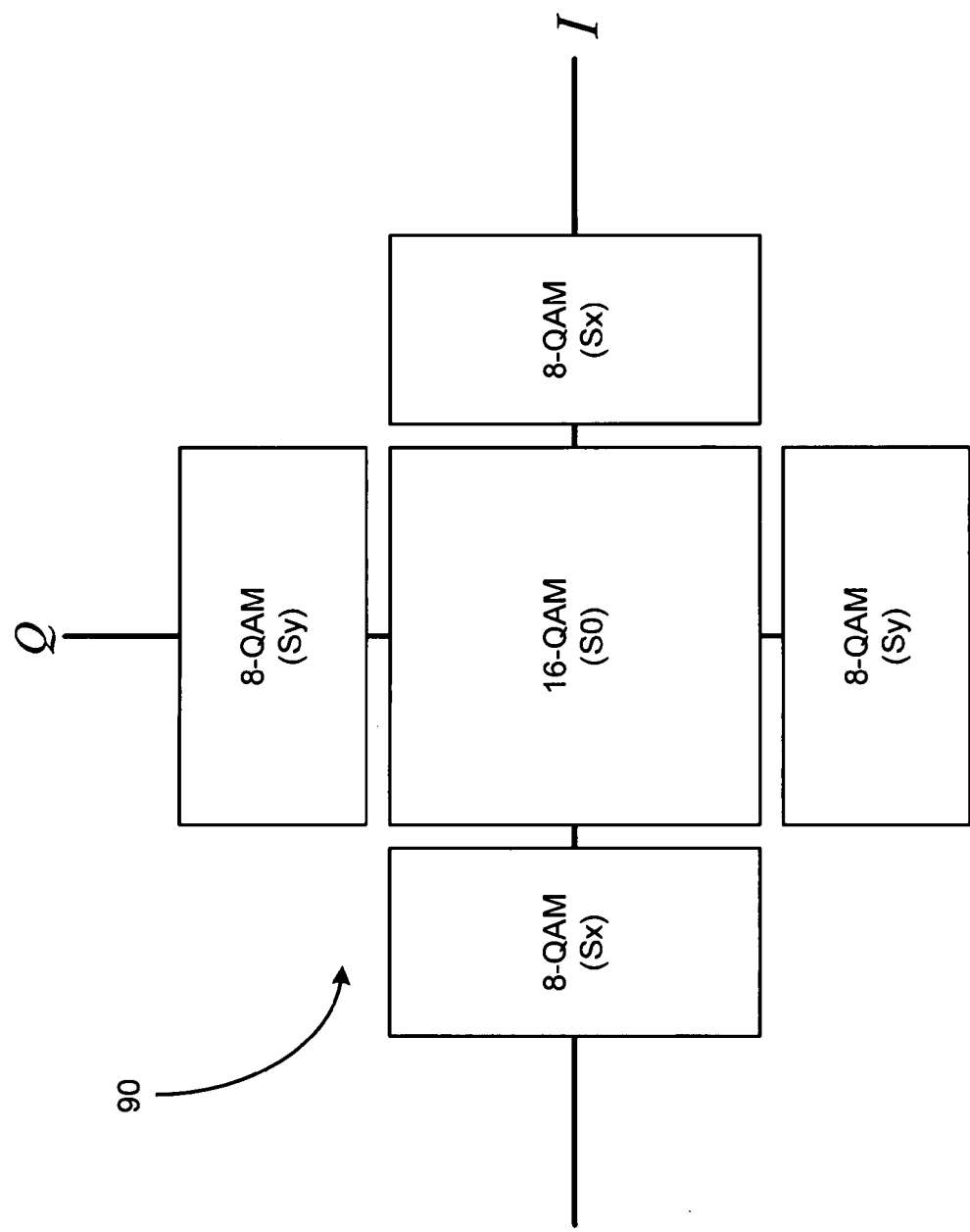
FIG. 16 is a constellation partitioning diagram illustrating a partitioning of a 48CR+ constellation.

The bit converter 102x is preferably configured to also perform energy set mapping. We use the 5.6 data rate version of the 4D block encoder 300 to illustrate how this is done. FIG. 16 shows a 48 CR+ constellation that has slightly more energy than a minimum energy 48 CR+ constellation, but this version is well suited to LSB encoding. The 48 CR+ constellation can be considered as being an embedded portion of an LSB-enumerated 64-QAM constellation using the enumeration style of FIG. 4. Beside the other operations performed by the frame mapper 102, the tiling bit converter 102x sub-portion is additionally configured to perform energy set mapping and to map as few bit combinations as possible to the 32 high energy points outside the 16-QAM center constellation of the constellation 90 of FIG. 16. As shown in FIG. 16, we group the 48CR+ constellation 90 into three sets of 16 points each. Set S0 corresponds to the standard 16QAM square inside the 32 CR, set Sx corresponds to the two sets of eight points each on the left and right outer cross portions of the 48CR+ constellation, and set Sy corresponds to two sets of eight points each on the upper and lower outer portions of the 48CR+ constellation. The average symbol energy of these sets is 40, 168 and 168 respectively. While it is possible to select set Sx to be the 16 outer-cross points of the inner 32 CR constellation and set Sy to be the 16 points outside of the inner 32 CR constellation to achieve superior energy granularity, the choice of sets as shown in FIG. 16 is exemplary only. This partitioning was selected because it preserves independent mapping on I and Q channels as is used with LSB coding, e.g., as illustrated in FIG. 4. The bit converter 102x is configured to select energy set combinations, $(S_1,S_1)$ over the 2 intervals (one pair of energy sets selected for each 4D block). In this embodiment, the bit converter 102x takes in eight uncoded bits (4 in each 2D interval). Three bits are used each 4D mapping interval to select a pair of sets, $(S_1, S_2)$ (nine combinations with the (Sy,Sy) combination discarded). The design of the energy mapping truth table is straight forward. The 4D block encoder of the '817 patent is based on this same principle.

Each 4D interval twelve information bits are processed. Every fifth 2D interval two less information bits are received as inputs because these bits are generated as parity bits by the LSB encoders during these intervals. Of the 12 bits to be mapped each 4D symbol interval, one is passed to the 4D building block trellis encoder 315. The eleven remaining bits are sent to the tiling bit converter 102x. Three of these eleven bits are used to select a pair of energy sets. Of the remaining eight bits, four are mapped each 2D interval to select one of the sixteen points in each energy set. The bit converter 102x is configured to map these remaining four bits per interval in two-bit pairs as independent I-coordinate and Q-coordinate selectors in accordance with LSB coding practice. By evaluating normalized minimum distance and the average bit energy it can be shown that this scheme performs 1.390 dB better than enhanced version of the J.83 standard that uses the LSB encoders 61b or 61c at 5.6 bits per interval. Likewise, if the less complex $D^2=48$ version of the tiled 4D building block code is used, this performs 1.390 dB better than the current J.83 standard.

Figure 7A:
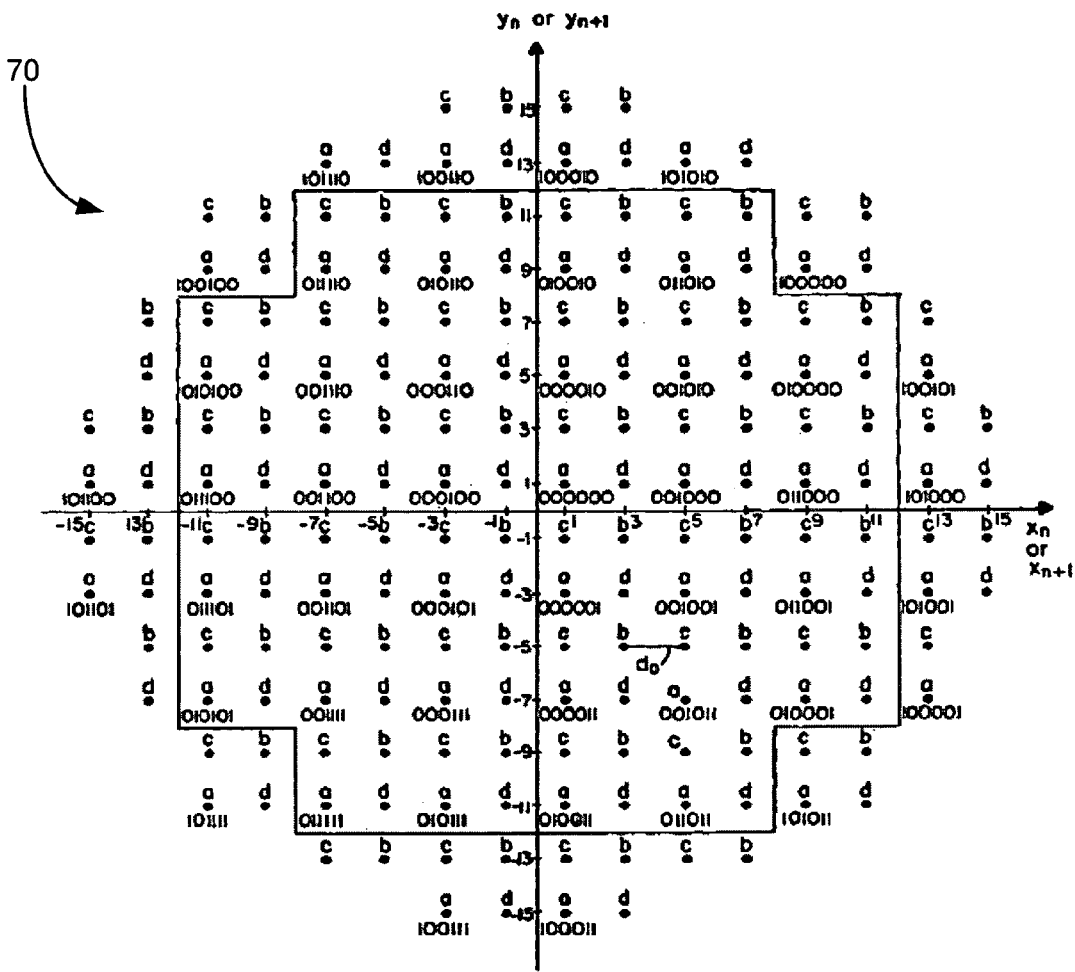
FIG. 7a illustrates a 192-point constituent 2D signal constellation used in Wei's 4D codes.

The bit converter 102x is similarly configured to transmit 7.6 bits per 2D signaling interval using the 192 CR+ constellation 70 of FIG. 7a. A modified 192 CR+ constellation which is a scaled version of the constellation 90 of FIG. 16 has been used to make LSB coding more straight forward. This modified 192 CR+ constellation can be considered to be a sub-portion of an LSB-enumerated 256-QAM constellation using the enumeration style of FIG. 4. Each 4D interval sixteen information bits are processed. Every fifth 2D interval two less information bits are received as inputs because these bits are generated as parity bits by the LSB encoders during these intervals. Of the sixteen bits to be mapped each 4D symbol interval, one is passed to the 4D block encoder. The fifteen remaining bits are sent to the tiling bit converter 102x. Three of these bits are used to select a pair of energy sets as in the 5.6 bits per interval example above. This time each energy set has 64 points, but otherwise looks similar to the constellation partitioning 90. Of the remaining twelve bits, six are mapped each 2D interval, three at a time, to independently select I and Q components of one of the 64 points in each energy set. By evaluating normalized minimum distance and the average bit energy it can be shown that this scheme performs 1.423 dB better than enhanced version of the J.83 standard that uses the LSB encoders 61b or 61c at 7.6 bits per interval. Likewise, if the less complex $D^2=48$ version of the tiled 4D building block code is used, this performs 1.423 dB better than the current J.83 standard.

It should be noted that the above energy set mapping policy can be improved upon by going to smaller energy sets. For example, the 192 CR+ constellation 70 can be partitioned into twelve energy sets of 16-point points each. Twelve energy sets per interval leads to 144 possible energy set pairs per 4D interval. If we assign seven bits per 4D interval to energy set selection, then we can select 128<144 energy set pairs that have the lowest energy. That is, we can eliminate more higher energy combinations. Since we started with 16 bits and sent one to the building block encoder and five to the energy set selector, that leaves 16−1−7=8 bits for point selection within each energy set. That is, we use 4 bits each 2D interval, two at a time, to independently select I and Q components one of the 16 points in each selected energy set. This kind of embodiment can be used to lower the average bit energy and thus increase the coding gain. As we have seen, the LSB encoding rule causes us to independently encode the I and Q dimensions and thus affects the way we partition the energy sets. In reality, the LSB decoders are very efficient because they only need to decode relatively small PAM constellations using two branches per state with real arithmetic. However, in general, any Ungerbock code could alternatively be selected to be the tiling code. For example an Ungerbock code with two, four, eight, or sixteen subsets with equal numbers of points in each subset found in each energy set is a preferred embodiment of the present invention. Again, the bit converter 102x is reprogrammed with a truth table that implements a desired mapping policy to conform with the tiling code. The bit converter 102x can be implemented using any programmable logic circuit, in software, or as a lookup table.

Figure 17:
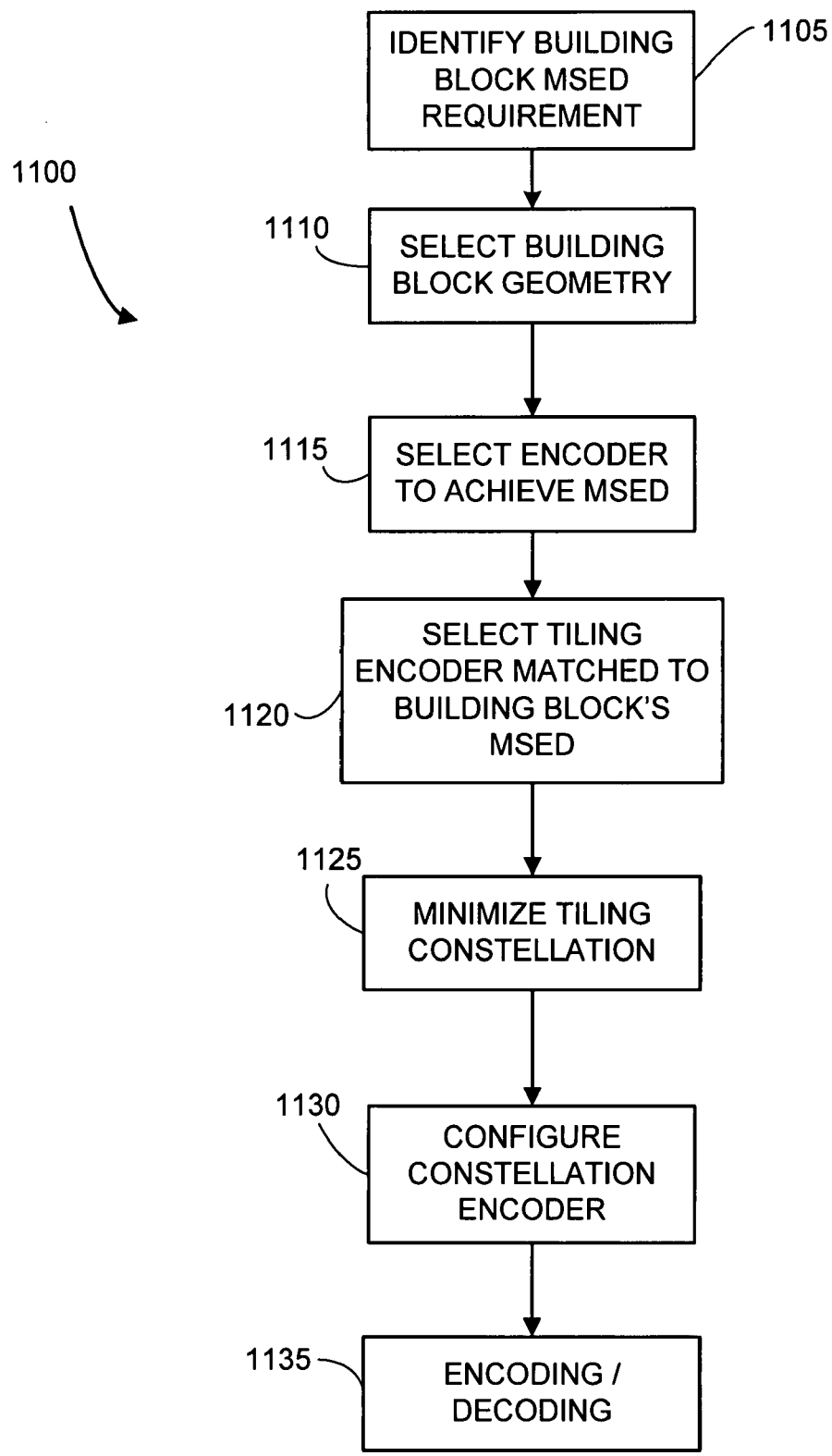
FIG. 17 is a flow chart illustrating a first general design method of designing tiled-building-block trellis coded systems.

The developments thus far lead to a general method to design trellis coded modulation systems. First select a building block of some selected dimensionality, e.g., 2N-dimensional where N is a positive integer. Select a building-block trellis encoder to obtain a desired MSED inside the building block and/or to provide a data rate advantage. Next select a tiling code who's MSED is equal to the MSED inside the building block and use that tiling code to tile the building block to form a tiled-building-block trellis encoded signal constellation that preserves the MSED inside the building block. This design policy is illustrated in FIG. 17. While the MSED of the tiling code need not be identical to the MSED of the building block, this is a preferred mode of operation, and the tiling code MSED and the building block's intra-block MSED should at least be close or otherwise matched to meet some specific design goal. In some cases it may be desirable to purposefully mismatch the tiling MSED and the intra-block MSED due to the addition of some other coding, interleaving, or modulation component in the system.

Referring now to FIG. 17, a method of trellis encoded modulation system design 1100 is presented. In a first step 1105 a target MSED requirement for a tiled-building-block constellation is identified. In a second step 1110 a building block geometry is identified. For example, either the 2D building block 20 as per FIG. 2 or the 4D building block 25 as per FIG. 10 could be selected. Likewise, some other building block such as an 8D concatenation of two of the previously discussed 4D building blocks could be used, or an 8D building block could be constructed with four constituent 2D building block constellations 25, but coded using a rate-¾ convolutional encoder so as to carry three information bits and one parity bit per 8D symbol. Similarly, for example, an 8D building block could be constructed using a rate-¾ convolutional encoder by transmitting the constituent 2D building block constellation 25 each interval to carry three information bits per 8D mapping interval, i.e., 0.75 information bits per 2D signaling interval. Like the 4D building block, the MSED of this 8D building block would be $D^2=8\times d_{free}$, where $d_{free}$ is the free Hamming distance of the rate ¾ convolutional code. Once the building block geometry is decided, in a step 1115 a trellis encoder is selected to meet the MSED requirement for the selected geometry. This will involve looking in Table 12.1(a)-(e) provided in the Lin and Costello reference to select a coder to achieve a target free Hamming distance. In practice there can be some iteration between steps 1105-1115 to arrive at convenient combination. While the encoder selected in step 1115 (and 1125 below) is preferably a trellis encoder, other types of encoders such as block encoders, combinations of trellis encoders with block encoders, or concatenated encoders such as block turbo coders or convolutional turbo coders are also contemplated as viable options. Once the building block is selected, a tiling coder is selected in step 1120 to ensure that the overall constellation, once tiled, maintains a target MSED requirement. Normally the tiling coder's MSED is chosen to be equal to or greater than the building block's MSED, although this is not required and is left to the designer to decide on an implementation by implementation basis. In a step 1125 the tiling constellation is shaped to minimize tiling points and to minimize the usage of sets of higher energy tiling points to reduce the average bit energy of the tiling constellation as much as possible or practical in light of other constraints such as coding rules introduced by the tile encoder and/or the building block encoder. As discussed above, if the data rate needs to be adjusted, the steps 1125 and 1130 may need to be revisited to perform additional constellation shaping and to reconfigure the bit converter 102x to perform energy set mapping for the reconfigured constellation. If the tiling code is an LSB code, the energy mapper should have independent I and Q bit mapping functions to conform to the LSB coders' constellation point enumerations policies. Finally, in step 1135 a tiled-building-block trellis encoder is constructed using the general structure of FIG. 9.

Figure 18:
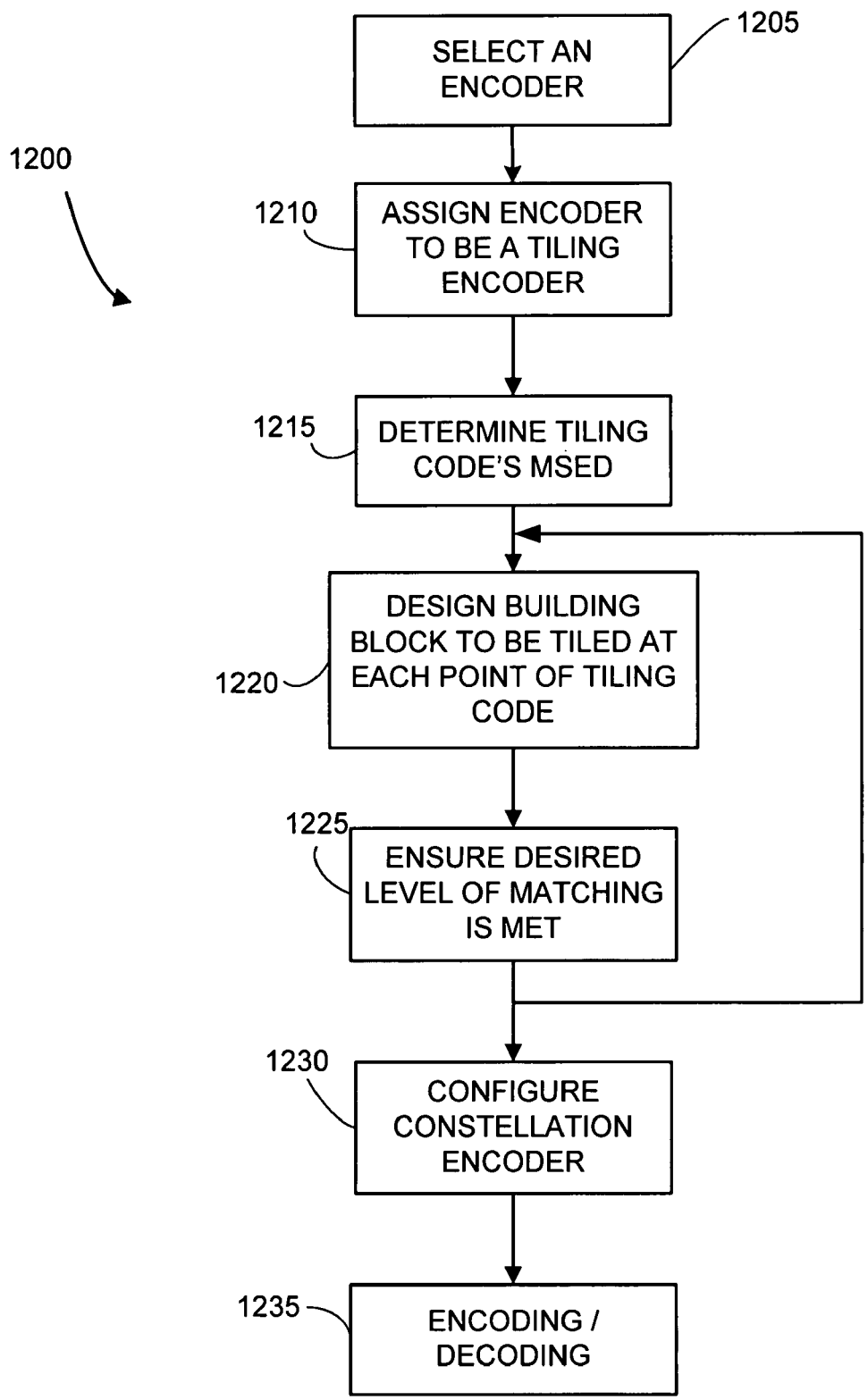
FIG. 18 is a flow chart illustrating a second general design method of designing tiled-building-block trellis coded systems.

Turning now to FIG. 18, an alternative method 1200 for designing tiled-building-block trellis codes is illustrated in flow chart form. In a first step 1205 a trellis code is selected. For example, this selected trellis code can be any set partitioned trellis code such as an LSB code or any Ungerbock code. In two examples below, we demonstrate the method 1200 by selecting 4D and 8D Wei codes in step 1205 as the starting code. Next, in step 1210, the selected trellis code is assigned for use in the tiling code 105. The MSED of the tiling code is next determined in step 1215. This MSED will generally be a known property of the code selected in step 1205, but could also be determined mathematically or numerically, especially if the selected code 1205 is a new code being specially developed for use as a tiling code. In a step 1220 a building block's geometry and coding structure is designed. The building block is selected or designed to be inserted into the tiling code in such a way as to obtain some desirable result, e.g., to improve the coding gain and/or the data rate of the tiling code, or to reduce overall coding complexity. For example, if the selected tiling code is a 4D Wei code, a 4D building block that takes in one input bit per 4D mapping interval or a 4D building block built with a higher rate code that takes in more than one input bit per 4D mapping interval might be selected. Next, in a step 1225, the coding parameters are evaluated to verify that that the MSED inside the building block is balanced or appropriately balanced with the MSED of the tiling code. As discussed above, in some embodiments, a block coder, a combination of a block coder and a trellis coder, or some kind of interleaved concatenated code can optionally be used to provide MSED to either or both of the building block and the tiling code. It may turn out that secondary effects such as error coefficient caused an unbalance and a design objective was missed. This might be identified in simulation or testing. If it turns out that some additional margin is needed to put the system in better balance, then design method can optionally loop back to step 1220 to modify the building block, or to step 1205 to choose a different tiling code. Next, in step 1230, the constellation encoder 100 is configured. This often involves contracting the tiling constellation in some optimal or suboptimal way as discussed by way of example below. The data rate of the building block is often chosen with this configuration and constellation contraction step in mind. At this point the coding gain can be computed by computing at the average bit energy and then comparing the normalized minimum distance, $d_{min}^2 = D^2/2 E_{b,avg}$ to a reference coding scheme. Finally, in step 1235 the encoder is put into operation. The steps 1230 and 1235 may also be used during simulation and testing to determine whether the design met the design goals so as to determine whether another design iteration is needed.

We now apply the method 1200 to demonstrate how to improve the performance of Wei's 16-state 4D encoder, his 64-state 4D encoder, and his 64-state 8D encoder. Beginning with the 4D case, as per step 1205, we select Wei's 16-state 4D encoder 75 of FIG. 7b as the starting code. In accordance with step 1210, we next assign this to be the tiling encoder 105 in FIG. 9. As per steps 1215, we determine that Wei's 16-state 4D code has an MSED of $D^2=64$ and Wei's 64-state 4D code has an MSED of $D^2=80$. As per step 1220 we select the 4D building block (315, 25) of FIG. 10. Using tables 12(c)-12(e) of the Lin and Costello reference, we select a 32-state, rate-½ convolutional code with $d_{free}=8$ to obtain $D^2=64$ for use with Wei's 16-state 4D code and we select a 64-state, rate-½ convolutional code with $d_{free}=10$ to obtain $D^2=80$ for use with Wei's 64-state 4D code. Note that other choices are possible, for example we could have chosen a 128-state rate-⅔ convolutional code to obtain $d_{free}=8$ to maintain the same $D^2=64$ for use with Wei's 16-state code. This would increase the bit rate of the building block from 0.5 bits per interval to 0.667 bits per interval. As discussed below, such a choice would lead to additional constellation contraction and coding gain, but at the cost of an increase in coding complexity. Next the step 1230 is carried out to optimize the tiling constellation. This generally involves contracting the tiling constellation by removing high energy tiling points and configuring the frame mapper 102 to select high energy constellation points as little as possible to minimize the average bit energy of the trellis code.

Figure 19:
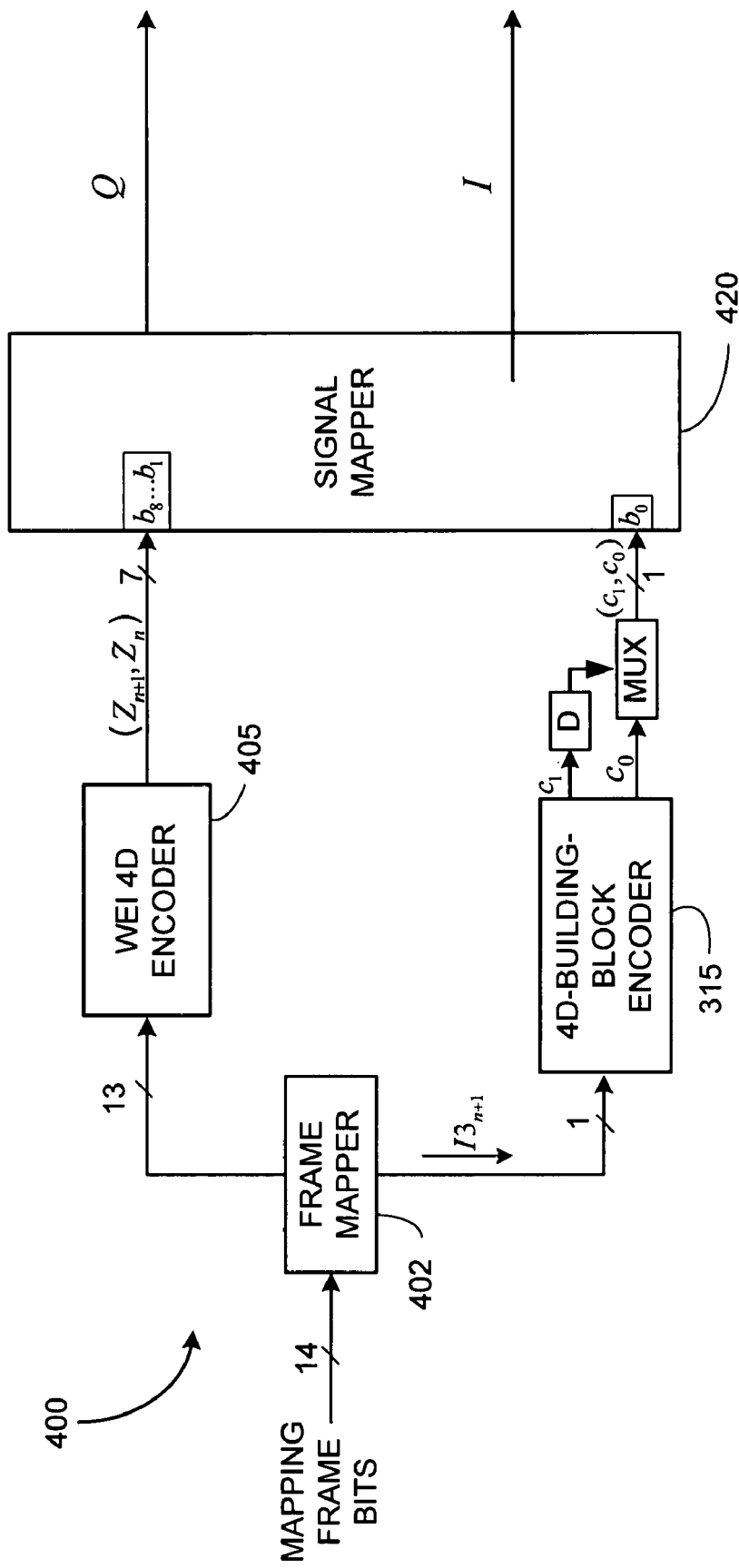
FIG. 19 is a block diagram illustrating a particular embodiment of tiled-building-block trellis encoder that uses Wei's 16-state 4D encoder as a tiling encoder to tile the novel rate-½ 4D building-block.
Figure 20:
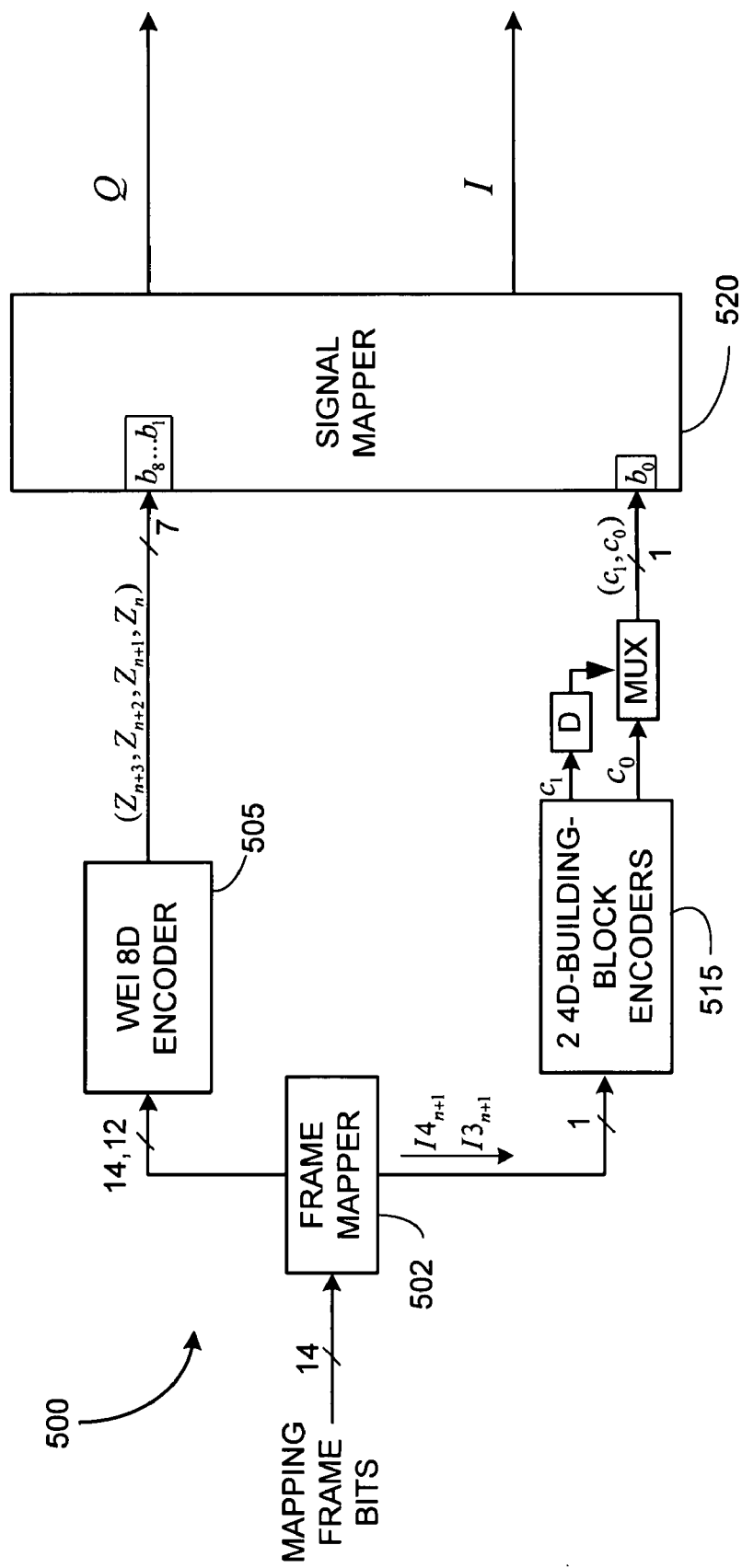
FIG. 20 is a block diagram illustrating a particular embodiment of tiled-building-block trellis encoder that uses Wei's 64-state 8D encoder as a tiling encoder to tile a novel rate-½ 8D building-block.

Referring now to FIG. 19, a tiled-building-block encoder 400 is illustrated in block diagram form. This encoder was designed as described above using the design method 1200. As per the above discussion a 4D Wei coder is used as a tiling encoder 405. The 4D building block encoder 315 is selected for use with this tiling code. Depending on the embodiment, the building-block encoder 315 will be configured as a 32-state and 64-state encoder respectively to achieve $D^2=64$ and $D^2=80$. Like Wei's 4D encoder 75, the overall 4D tiled-building-block encoder 400 takes in 14 information bits per 4D mapping interval. However, note that because one information bit is routed to the building block encoder 315 each mapping interval, when Wei's 4D encoder 75 is implemented as the tiling encoder 405 it only takes in 13 bits each mapping interval. Specifically, the $I3_{n+1}$ of Wei's 4D encoder 75 is rerouted to the 4D building block encoder 315. That is, the tiling encoder 405 is equivalent to Wei's 16-state 4D coder 75 with input bit $I3_{n+1}$ removed.

Figure 7B:
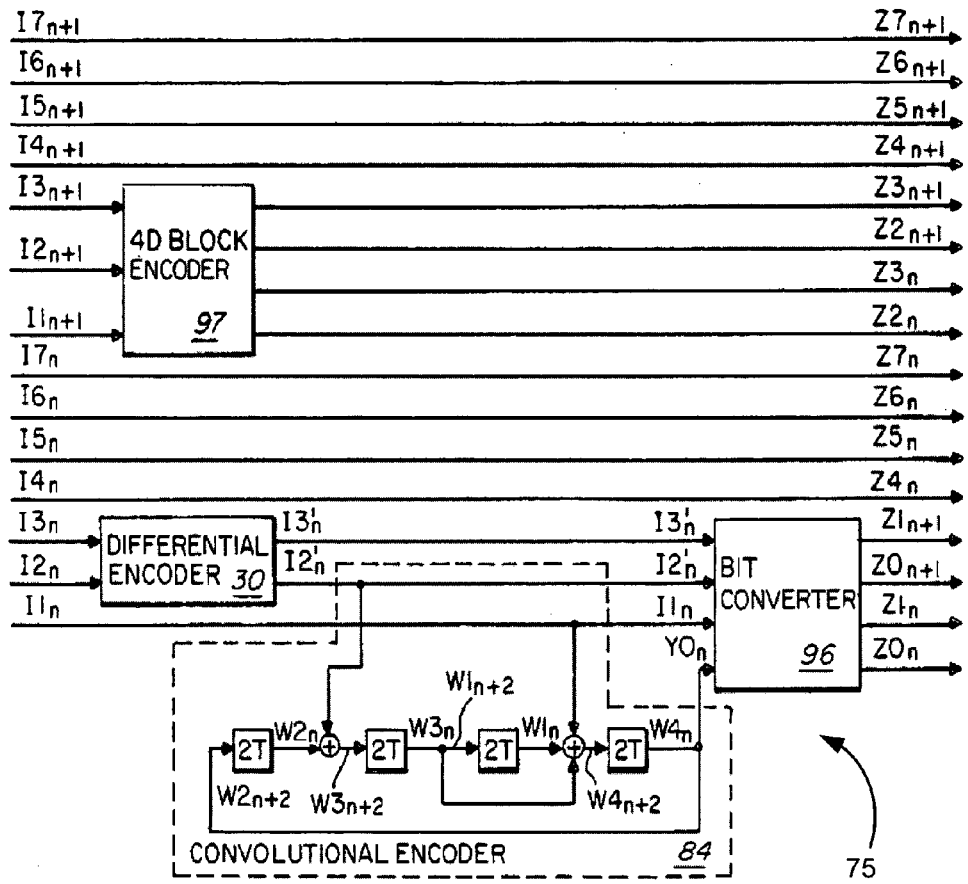
FIG. 7b illustrates the coder used to generate Wei's famous 16-state 4D code.

As can be seen by studying Wei'87 and the '817 patent, the 4D block encoder of FIG. 7b maps the three input bits $I3_{n+1}$, $I2_{n+1}$, $I1_{n+1}$ to eight possible constellation energy set pairs [(0,0) (0,1), (0,2), (1,2), (2,0) (2,1), (1,0), (1,1)]. In these energy set pairs, the first number represents one of three energy levels, 0, 1, or 2, transmitted during the first 2D signaling interval, and the second number in each pair represents one of these same three energy levels, but transmitted during the second 2D signaling interval. To better understand what these energy levels signify, consider the constituent 192-point constellation of FIG. 7a transmitted during each of the first and second 2D signaling intervals. Note that there are 64 points outside of the cross and there are 128 points inside the cross. The 64 points outside the cross correspond to energy level 2. Next divide the remaining 128 points inside the 128 CR into 64 inner-inner points and 64 inner-outer points. The 64 inner-outer points correspond to the four outer 16-point rectangles inside the 128 CR and these 64 points correspond to energy level 1. The inner-inner points correspond to the remaining embedded 64-QAM square constellation inside the 128 CR, and this corresponds to energy level 0.

When, as in the tiling encoder 405, the $I3_{n+1}$ bit is removed from the input of the 4D Wei encoder 75, the 4D bit converter of FIG. 7b can be eliminated because the remaining $I2_{n+1}$ and $I1_{n+1}$ bits can be configured to minimize energy by directly selecting the energy combinations [(0,0) (0,1), (1,0), and (1,1)]. Note that this eliminates energy level 2, i.e., eliminates all the tiling points outside the 128 CR constellation. That is, the tiled-building-block trellis code 400 undergoes an advantageous constellation contraction relative to the original 4D Wei code selected in step 1205. The tiling encoder 405 operates exactly like the 4D Wei encoder 75, but only encodes the inner 128 CR sub-constellation of points.

It can be noted that this tiled constellation looks much like the constellation produced by the 4D tiled-building block encoder 300 when configured to transmit 7.15 bits/interval. That is, it is a 128 CR constellation with the constituent 2D building block constellation 25 of the 4D building block inserted at constituent 2D each tiling point. This looks similar to the constellation shown in FIG. 13, except the LSB-partitioned 16-QAM tiling constellation is substituted with a 128 CR tiling constellation that is divided into Wei's four 2D types, {a, b, c, d}. We note the encoder 400 transmits 7 bits/interval as opposed to 7.15 bits/per interval as per the encoder 300 which started with 16 bits per mapping frame and lost some data rate due to LSB encoding to wind up at 7.15 bits per interval. That is, although the encoder 400 uses the same 128 CR tiling constellation as the 7.15 bit/interval version of the encoder 300, it transmits slightly less information bits per interval.

In general, if N is an integer, a "(4×N)-dimensional constellation-contracted Wei encoder" refers to Wei encoder that removes high energy signal points by contacting the signal constellation as described herein. That is, the constituent 2D signal constellations are contracted as described above, e.g., from 192 points to 128 points. The contracted constellation typically used as a tiling code and a coded-constellation building block is placed at each tiling point. The concatenation of the contracted 2D constituent constellations comprise the contracted (4×N)-dimensional constellation.

Because the average symbol energy of the 128CR (after scaling by 4) is 20.5×16=328, and the average symbol energy of the constituent 2D constellation 25 of the 4D building block is 2, the total combined average symbol energy of the tiled-building-block trellis coded scheme 400 is 330. Because 7 bits/interval are transmitted, the average transmitted bit energy is $E_{b,avg}=330/7$. Using $d_{min}^2=D^2/2E_{b,avg}$ and recalling that the uncoded 128CR constellation has $d_{min}^2=0.17073$, some simple calculations indicate that the $D^2=64$ version of the encoder 400 that uses a 32-state building block encoder with the reduced 128 CR version of Wei's 16 state 4D encoder 75 as the tiling encoder 405 has a normalized minimum distance of $d_{min}^2=0.67879$ and a coding gain of 5.9942 dB over the uncoded 128 CR constellation. The $D^2=80$ version of the encoder 400 that uses a 64-state building block encoder with the 128 CR version of Wei's 64-state 4D encoder has a normalized minimum distance of $d_{min}^2=0.84848$ and a coding gain of 6.9633 dB over the uncoded 128 CR constellation. The corresponding gains of the Wei's 16-state and 64-state 4D codes are 4.66 dB and 5.63 dB. That is, the encoder 400 performs 1.33 dB better than the 4D Wei code in both cases. As discussed in Wei'87 and the '817 patent, Wei's 4D codes suffered a 1.36 dB loss due to constellation expansion from a 128 CR to the 192 CR+ constellation 70. This expansion loss has been almost completely recovered due to the constellation contraction afforded by the addition of the 4D building block encoder 315. As calculated below, the cost for this 1.33 coding gain is a modest 27% increase in computational complexity in the decoder.

It can be noted that a more expensive rate-⅔ coded version with 128 states could be used to further contract the tiling constellation and to achieve further gains. In such a design we could form 6D or 12D symbols, so that 1.333 or 2.667 bits could be transmitted through the building block per mapping interval instead of 1 bit/interval as in the 4D embodiment 400. In the 6D case, twenty-six more constellation points could be removed below the 128 CR each 2D interval, and in the 12D case, thirty-seven more constellation points could be removed below the 128 CR each 2D interval. A more complicated energy set mapping rule would then be determined to minimize average bit energy. While it is important to understand that such embodiments are possible, these embodiments are relatively costly. The detailed example below also achieves further constellation contraction, but in a less costly way.

Figure 8A:
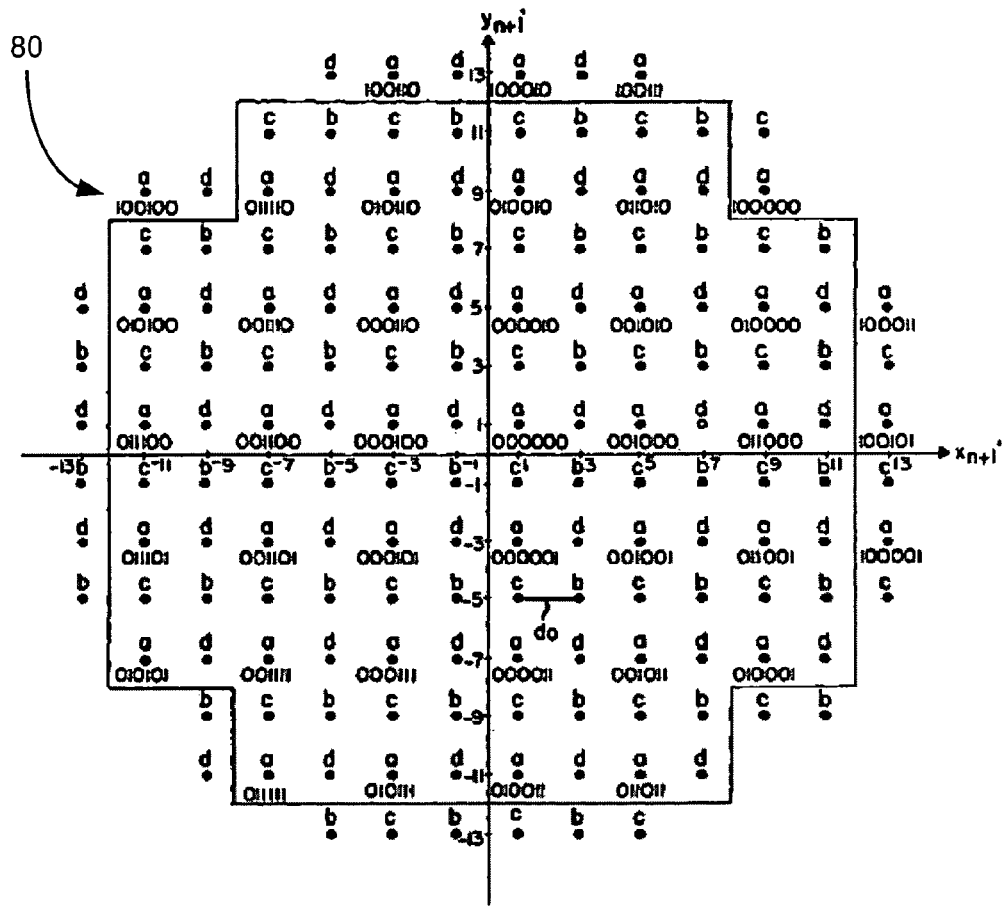
FIG. 8a illustrates a 160-point constituent 2D signal constellation used in Wei's 8D codes.
Figure 8B:
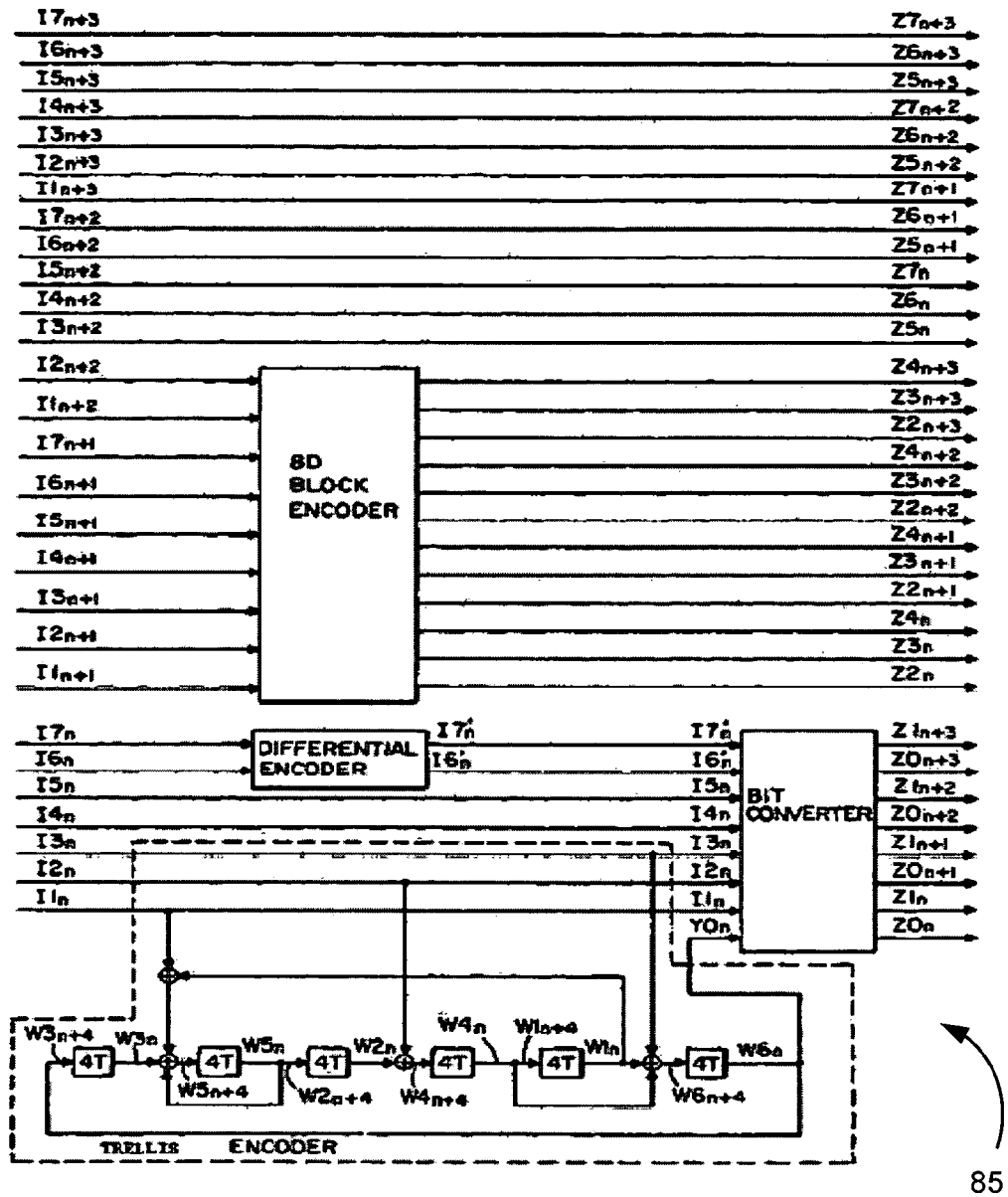
FIG. 8b illustrates the coder used to generate Wei's famous 64-state 8D code.

Next apply the design approach 1200 by selecting in the step 1205 Wei's 64-state 8D encoder 85 as shown in FIG. 8b. The 8D Wei encoder 85 transmits 7 bits/interval and employs the 160-point constellation 80 as shown in FIG. 8a. As per step 1210 we assign Wei's 64-state 8D encoder 85 to be a tiling encoder 505. As per step 1215 we recognize that the 64-state 8D Wei code is known to have an MSED of $D^2=64$. As per step 1220 we seek an 8D building block to insert at each tiling point of the 8D tiling constellation. The 8D building block is selected to be a concatenation of two 4D building blocks. As a part of step 1230 we configure the frame mapper 502 to contract the constellation and minimize the average bit energy.

Because each 4D building block can transmit 1 bit per 4D block, and because the 8D building block is a concatenation of two 4D blocks, the 8D building block encoder 515 draws two information bits away from the 8D Wei encoder 405, 85 each 8D mapping frame. Therefore we reconfigure the 8D Wei encoder 85 to only transmit 26 bits instead of 7×4=28 bits each mapping interval. That is, the tiling encoder 505 implements a constellation-contracted version of Wei's 8D encoder 85, i.e., one with fewer constellation points and lower average bit energy. The frame mapper 502 is next configured to implement an energy set mapping policy to achieve the lowest possible average bit energy.

Refer to FIG. 8b and note that while the 8D Wei encoder 85 takes in 7 information bits per interval, the rate-¾ convolutional encoder of the encoder 85 generates one parity bit per mapping interval so that 7.25 bits need to be transmitted per 2D signaling interval. It can be seen that the extra 0.25 bit per 2D signaling interval added by the parity bit adds 32 points to the 128 CR since 128+32=160 and 128/4=32. That is, the extra 0.25 parity bit per 2D signaling interval gives rise to a 25% constellation expansion. As discussed in Wei'87, this caused Wei's 8D code to loose 0.75 dB of coding gain. However, when Wei's 8D encoder 85 is used as the tiling encoder 505 two input bits are drawn away from the tiling encoder 505 by the 8D building-block encoder 515. Therefore we need to reconfigure Wei's 8D encoder 85 so that it only processes 28−2=26 information bits per 8D mapping interval. Because this reduced version of the 8D encoder 85 will still generate one parity bit per frame, the tiling constellation must carry 26+1=27 bits per 8D mapping frame. That is, each constituent 2D constellation must carry 27/4=6.75<7 bits per 2D signaling interval. Since the 128 CR carries 7 bits/interval, we see this shrinks Wei's 160-point constellation 80 below the 128 CR. We can thus expect to further decrease the average bit energy and to further increase the coding gain beyond what was achieved by the 4D tiled-building-block encoder 400.

As a part of the step 1230, we need to determine a constituent 2D constellation that can map 27 bits over 4 intervals. If N is the number of constellation points in each constituent 2D constellation, the N must satisfy $N^4 > 2^{27}$, i.e. N=108. However, it is easier to implement coded schemes with constellation points at multiples of 16. Hence, we will consider a constellation of size 112 points. To arrive at the 112-point constellation consider the constellation 80 of FIG. 8a. Note the binary numbers beneath each group of four points which are labeled a, b, c, and d. Only the a-points are enumerated because these binary numbers only represent uncoded bits and the b, c and d points have the same uncoded bits but only differ in coded bits as produced by the convolutional encoder and the bit converter of the Wei's 8D encoder 85. Using the numbering scheme of the constellation 80, the frame mapper 502 partitions the 112-point sub-constellation of the constellation 80 into seven energy sets as follows:

Sets 0-3: Standard 64QAM (logically subdivided into four 16-point quadrant subsets)
Set 4: Next 16 Points (from 65 to 80)
Set 5: Next 16 points (from 81 to 96)
Set 6: Next 16 points (from 97 to 112).

Because each set has 16 points, four uncoded bits per 2D signaling interval can be used to select a point within a set. That is, 4×4=16 uncoded bits can be used each 8D mapping frame to select a point within each of four selected energy sets. The remaining 27−16=11 coded bits are used to select a 4-tuple of energy set indices to specify the selected four energy sets. It is necessary to define $2^{11}$=2048 unique 4-tuples in order to enable the decoder to recover all eleven of the energy-set-selection bits. Since each element of the 4-tuple can take on seven values, there are $7^4$=2401 energy set combinations. This implies that the highest energy 2401−2048=353 combinations can be discarded. By close inspection of the constellation 80 and through calculation, it can be found that the average symbol energies of the above-defined energy sets 0-6 are 168, 168, 168, 168, 344, 472 and 504 respectively. The frame mapper 502 includes a truth table that maps one eleven-bit word per mapping frame to a corresponding 4-tuple of energy-set indices that corresponds to one of the 2048 lowest energy set combinations. Each 2D interval, one index from the energy-set 4-tuple and four uncoded bits are combined to arrive at the uncoded numbers illustrated in the constellation 85. The {a, b, c, d}-point selection is made by the trellis encoder and bit converter portions of the encoder 85.

When the frame mapper 502 is configured as discussed above, the 2048 lowest energy 4-tuples use sets 0-3: 320 times, set 4: 75 times, set 5: 69 times and set 6: 48 times. The average transmitted symbol energy is thus $E_{avg}$=[320×168+ 75×344+69×472+48×504]/(512)=266.25, and the average bit energy is $E_{b,avg}$=266.25/7. Because the 64-state 8D Wei code has an MSED of $D^2$=64 and the 8D building block tiled at each tiling point of this tiling constellation has an intra-block MSED of $D^2$=64, we can compute the normalized distance produced by encoder 500 to be $d_{min}^2 = D^2/2E_{b,avg}$=0.84131, which yields a gain of 6.9265 dB over the uncoded 128 CR constellation. Meanwhile, Wei's 64-state 8D encoder 85 gains 5.41 dB over uncoded 128CR. That is, the 8D tiled-building-block encoder 500 performs 1.52 dB better. This is due to the fact that the 8D building block 515 carries 2 bits per 8D mapping frame to allow the tiling constellation to be contracted. An overall-favorable constellation reshaping accounts for the added coding gain.

Figure 21:
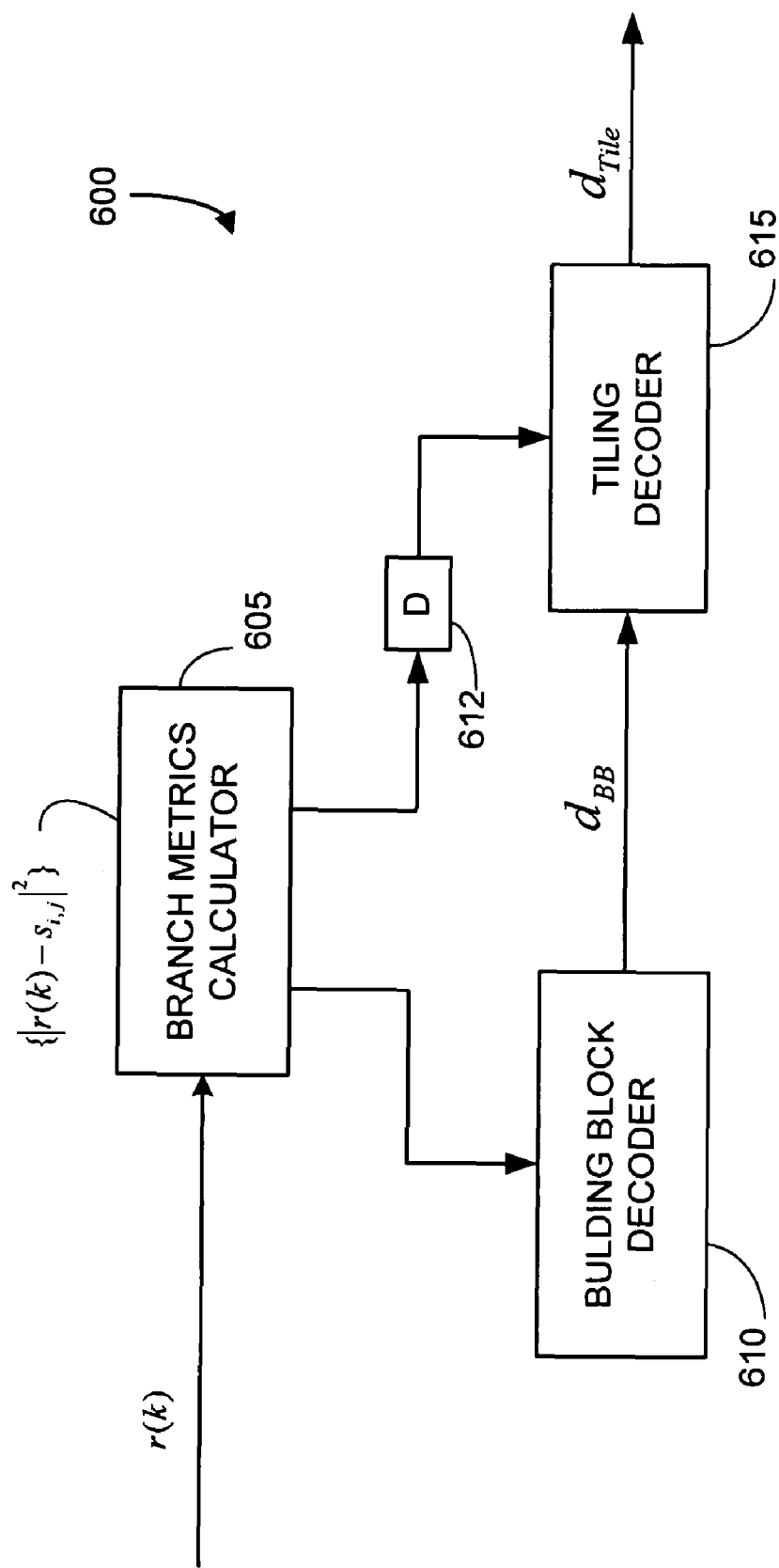
FIG. 21 is a block diagram illustrating a multi-level decoder architecture used to decode tiled-building-block-encoded signals.

Turning now to FIG. 21, a block diagram of a tiled-building-block constellation decoder 600 is illustrated in block diagram form. The constellation decoder 600 is preferably used to decode a received signal r(k) that was transmitted by a tiled-building-block encoder of the form 100. The signal r(k) can generally be considered to be a signal r(t) sampled at time $kT_s$ where $T_s$ is a sampling time. The sampling time is typically determined with the use of a timing recovery loop or some other timing recovery circuit or algorithm. The input signal r(k) is generally considered to have been transmitted through a channel such as an additive white Gaussian noise (AWGN) channel. That is, the signal r(k) is generally considered to be a tiled-building-block coded signal received along with additive noise and possibly other forms of channel distortion. The signal r(t) and/or its digitized counterpart, r(k), may undergo receive filtering and equalization before entering the decoder 600. In orthogonal frequency division multiplexed (OFDM) embodiments, the signal r(k) may be generated using a fast Fourier transform (FFT), that is, the signal r(k) may be a complex number corresponding to a value at a particular tone after phase alignment with respect to a pilot tone. This type of embodiment can be used in WiMAX (IEEE 802.16a) type applications, WiFi (802.11) type applications, or DSL (G.991/G.992) type applications that use discrete multi-tone transmission (DMT).

After any implementation-specific demodulation and receiver preprocessing, the received signal r(k) is passed to a metrics calculator 605. The metrics calculator 605 can compute a set of branch metrics given by $\{|r(k)-s_{i,j}|^2\}$ where $s_{i,j}$ is the $(i, j)^{th}$ constellation point in the transmitted signal constellation, e.g., the 32 points of the constellation 40:4D of FIG. 13. As discussed below, the metrics calculator can also compute real and imaginary metric components separately and store these components for later use. The metrics are then passed to a building block decoder 610. As discussed below, the building block decoder preferably implements the well known Viterbi algorithm to perform maximum likelihood sequence detection (MSLD) to determine the most likely coded building block sequence conditioned on the most recent observations, $\{r(k), r(k−1) \ldots r(k-L_{BB})\}$, where $L_{BB}$ is a memory length of the building block decoder 605's Viterbi decoder after which a symbol decision is made. That is, after a delay of $L_{BB}$ intervals, a hard building-block symbol decision is made and extracted from the surviving path. After the building block decoder has made a building-block level decision, a decision $d_{BB}$ is passed from the building block decoder to a tiling decoder 615.

Note that the building block decoder 605 is implemented as though there were no is tiling decoder. For example, if the building block 20 is used, the building block decoder 610 can be implemented using the decoder used to decode the WiMAX coded signal 163. Hence the implementation of the building block decoder 605 is well known to those skilled in the art. However, recall that while the building block 20 has an MSED of $D^2$=40, the MSED of the points in the constellation 174a using the encoding rule 163 dropped to $D^2$=16. This is due to the fact that the Euclidian distance in the constellation 174a corresponding to any single bit error in either of the uncoded bits of the encoder 163 is $D^2$=16. We can see the job of the tiling decoder 615 will be to deal with these more significant bits. That is, the building block decoder is able to decide the correct building block point to an accuracy of $D^2=40$. It is the job of the tiling decoder to protect the previously uncoded bits to ensure that errors in these bits do not dominate the error performance of the overall coded system.

Figure 22:
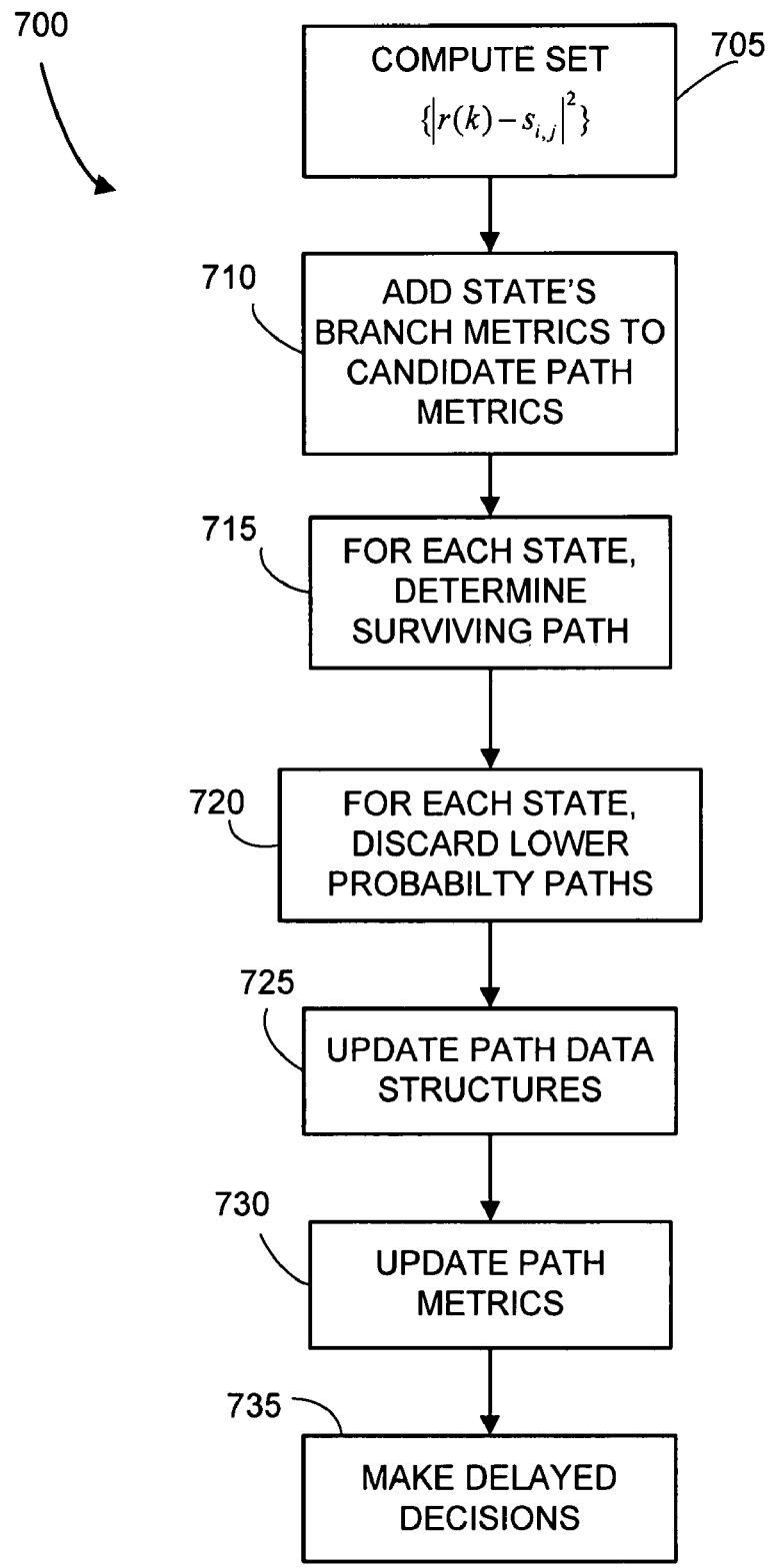
FIG. 22 is a flow chart illustrating a decoder algorithm used by the decoders of the architecture of FIG. 21 to decode tiled-building-block-encoded signals.

The tiling decoder 615 begins tiling decoding where the building block decoder left off. For example, consider the constellation 40:4D of FIG. 13 and assume that the building block decoder decided that an upper-right building block point was sent. Once this decision is made, the tiling decoder sees the constellation 40:4D as a 16-QAM constellation containing only the upper-right points in FIG. 13. The lower-left points are all removed. In this way, each signaling interval, the tiling decoder only needs to decode over a constellation the size of the tiling constellation, but whose actual constellation points are offset into the building block in accordance with the building-block decoder 605's decision, $d_{BB}$. As per the example of FIG. 13, the distance between these remaining 16 upper-right-diagonal points can be seen to be $D=4$ or $D^2=16$, i.e., the distance between tiling points. The decoders 610 and 615 generally follow the decoding algorithm as set forth in FIG. 22. A more specific example of how this is implemented is discussed in connection with FIG. 23.

To better understand the operation of the decoder 600, consider an example of decoding the constellation 40:4D of FIG. 13. The first step is to compute a full set of 32 branch metrics, $\{|r(k)-s_{i,j}|^2\}$. These squared distances are preferably calculated as the sum of the real and imaginary portions, which are saved separately for later use by the separate I-channel and Q-channel LSB decoders as discussed below. In this example the building block decoder is a 32-state convolutional decoder selected for its free Hamming distance of $d_{free}=8$ to achieve the target inter-block MSED of $D^2=64$. The 32-state building-block decoder 605 thus needs to maintain 32 survival paths, one per state. Because this building block decoder is only concerned with resolving the two points in the building block 25, it only needs to evaluate two branch metrics per state. Further, since this is a 4D building block, survival paths are updated after every two intervals. Hence, out of the 32 metrics, two branch metrics are selected, one for the coded bit 0 and one for the coded bit 1. It is noticed that out of the 32 metrics 16 correspond to the coded bit of the building block=1 and the remaining 16 correspond to that coded bit=0. These are selected by taking smallest metric from each of these 16 groups. The building block decoder 610 uses 2 branch metrics every 2 intervals, and calculates survival paths by comparing 2 metrics. After decoding the building block, the coded bit will be known during each interval. Hence, after a delay of $L_{BB}$, the tiling decoder will reuse 16 of the 32 metrics that correspond to the upper-right or lower-left sub-constellations. In the 40:4D example of FIG. 13, the tiling decoder 615 is implemented as a pair of LSB decoders. Each LSB decoder decodes an independent 4-point PAM constellation corresponding to the respective I and Q axes. In general, if the tiling constellation is $M^2$-QAM, each LSB code decodes over an M-PAM constellation. Out of these 4 constellation points, 2 points correspond to LSB=0 and the other 2 points correspond to LSB=1. The branch metrics that correspond to these four PAM points can be recalled from the originally calculated metrics from the memory device 612. The LSB decoders also only need to evaluate 2 paths (LSB=0 and LSB=1) emerging and remerging at each of 32 states. Survival paths are selected at the end of every interval. Once the LSB bits are decoded, the location of the building block during each interval is identified and hence, the entire set of information bits can be recovered. A preferred decoding process used in each of the building-block decoder 610 and the tiling decoder 615 is summarized in the flow chart 700 of FIG. 22.

It should be noted that the LSB decoders also deal in real arithmetic and are only concerned with the real or imaginary components of the pre-computed branch metrics. That is, the I and Q components of each branch metrics are preferably stored separately by the metrics calculator 605 for later use by the LSB decoders in the tiling decoder 615. As discussed above, the LSB decoders only have two possible branches per state and thus only need to evaluate two branch metrics per state. If 32-state LSB decoders are in use, then each LSB decoder will have to keep track of 32 paths and decide upon surviving paths as per FIG. 22. Decisions are taken from the surviving path that $L_T$ intervals back in time.

Figure 23:
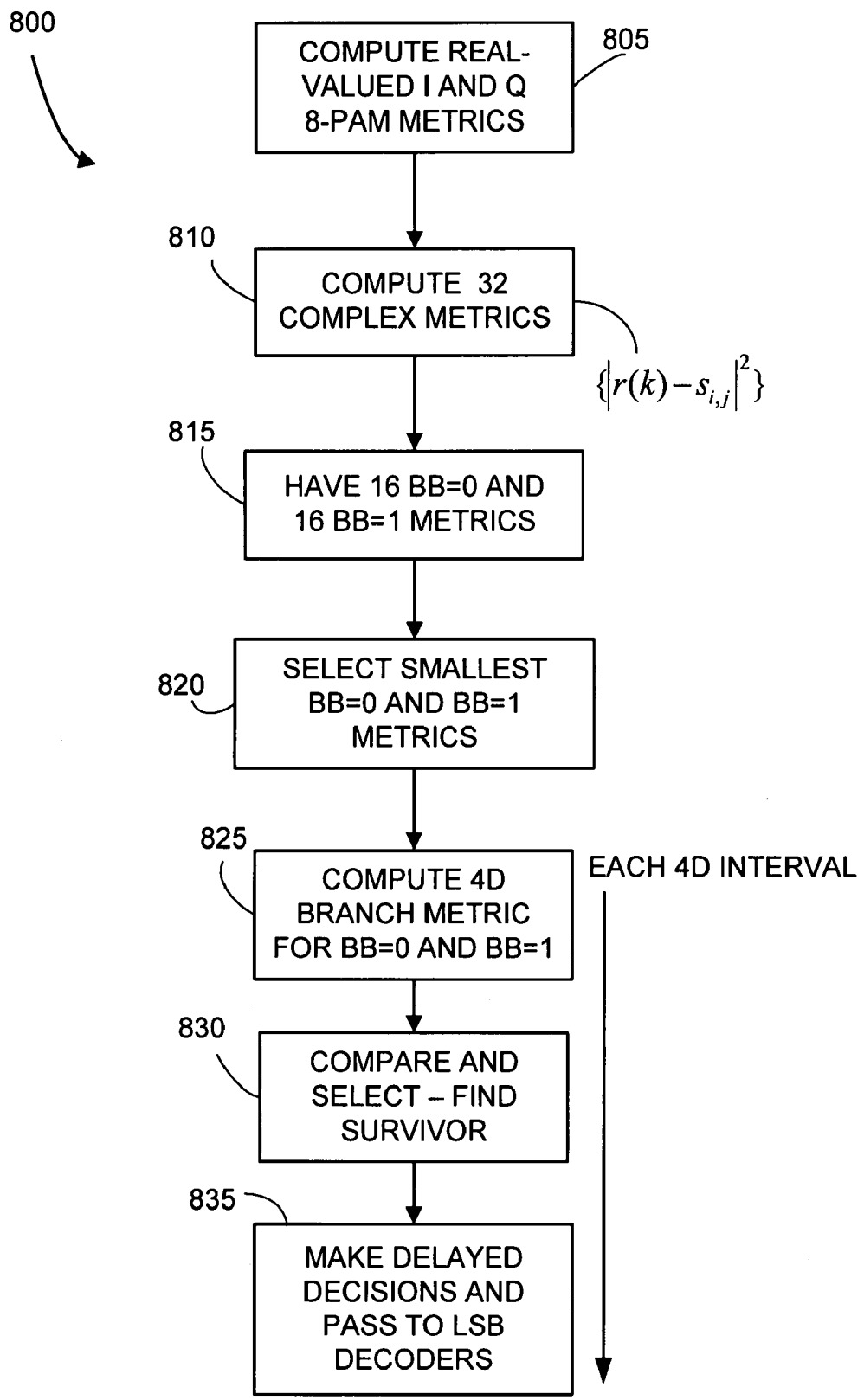
FIG. 23 is a flow chart illustrating an exemplary preferred decoder algorithm used by the decoder architecture of FIG. 21 to efficiently decode tiled-building-block-encoded signals for a specific example.

Turning now to FIG. 23, consider the computations involved in decoding the constellation 40:4D. In a first step 805 the received signal is viewed as two PAM signals, one on the I-axis and another on the Q-axis. As can be seen from FIG. 13, the constellation 40:4D gives rise to eight projected PAM signal points on each of the I and Q axes. To compute the real-valued metrics, the real and imaginary parts of the received signal point are compared to the eight PAM signal points projected onto each of the I and Q axes. These real-valued metrics correspond respectively to the eight unique quantities $(\text{Re}\{r(k)\}-\text{Re}\{s_{ij}\})^2$ and the eight unique quantities $(\text{Im}\{r(k)\}-\text{Im}\{s_{ij}\})^2$.

In a step 810, the real-valued metrics are combined to compute 32 unique 2D metrics of the form $|r(k)-s_{i,j}|^2$ for each of the 32 unique signal constellation points in the constellation 40:4D. In a steps 815 the set of 32 2D metrics are broken into the upper-right and lower-left subsets corresponding to the building block bit BB being equal to one and zero respectively. In a step 820 the smallest metric of each of the BB=0 and BB=1 2D subsets is identified and saved. Once every other 2D signaling interval, i.e., once per 4D mapping interval, a step 825 computes a 4D branch metric using the two saved smallest 2D metrics from each of the BB=0 and BB=1 2D subsets. In a step 830 the minimum metrics from the BB=0 and BB=1 4D subsets are used to determine a surviving path at each state. This involves, at each state, adding each minimum 4D metric to each incoming path, comparing the paths to find the smallest, and selecting the path with the smallest path metric (4 computations per state). In a step 835, a delayed 4D decision is taken off the tail end of the surviving path, and this 4D decision (2 2D decisions or 4 1D decisions) is fed to the LSB decoders. Each 2D signaling interval, the LSB decoders then decode the selected one of the upper-right and lower-left sub-16-QAM constellations as discussed above.

To decode the constellation 40:4D, i.e., m=4 bits/interval, the step 805 computes 8 real-valued PAM-type metrics for each of the I and Q dimensions. Each of these real metrics involves a computation of the form $(r-a)^2$, i.e., two computations. In total, the step 805 requires $2\times8\times2=32$ computations when the constellation 40:4D is in use. More generally, when m is even, there are $2^{m/2+1}$ projected points on each of the real and imaginary axes, there are two such axes, and there are two computations per point. When m is odd, there are $2^{(m+1)/2}$ projected points on each of the real and imaginary axes, there are two such axes, and there are two computations per point. Therefore, when m is even, the step 805 requires $2^{m/2+3}$ computations, and when m is odd, the step 805 requires $2^{(m+1)/2+2}$. Note that the m-odd case assumes a CR type tiling constellation is used, e.g., when m=5 a 32 CR tiling constellation is used and when m=7 a 128 CR tiling constellation is used.

In the case of the constellation 40:4D, the two sets of eight real metrics are next combined to compute 32 2D metrics, one for each of the constellation points in the constellation 40:4D. This requires another 32 computations per 2D interval for the constellation 40:4D. In general, the step 810 requires $2^{m+1}$ computations, one for each constellation point. Next the minimum 2D metric is found for each of the BB=0 and BB=1 2D subsets, adding another 32 computations for the constellation 40:4D or another $2^{m+1}$ computations in general. For the constellation 40:4D, this brings the total to 32+32+32=96 computations for the steps 805-820. When m is even the total number of computations for steps 805-820 is $2^{m/2+3}+2^{m+1}+2^{m+1}=2^{m/2+3}+2^{m+2}$. When m is odd, the total for steps 805-820 comes to $2^{(m+1)/2+2}+2^{m+2}$.

The two smallest 2D metrics are then added together to obtain a 4D branch metric every other interval. Independent of constellation size, the building block decoder in step 825 computes 32 (states)×2 (branches per state)=64 path operations×1 addition per path. For each state, two computations are also needed (32×2) to compare paths and to select the survivor paths. The aforementioned computations are needed once every other interval (÷2). That is, the building block decoder steps 825-835 add [(32×2)+(32×2)]÷2=64 computations per 2D signaling interval.

In this embodiment, the step 835 passes the building block decisions to a tiling decoder 615 implemented as two LSB decoders. The two 32-state LSB decoders reuse the real-valued metrics computed in the step 805 so do not involve any metric computations. Because the LSB decoders involve a rate-⅘ code, the LSB decoder's trellis makes a transition once each five signaling intervals. From each of the 32 states, there are 16 possible transitions that respectively correspond to the 16 binary combinations of the four uncoded bits that are either zero or one. That is, because four information bits sent for each trellis transition, there are 16 possible transitions out of each state. In terms of the five coded bits, each of the 16 branches out of each state also corresponds to a particular combination of five coded bits.

Because the LSB decoder follows the building block decoder which resolves the BB bit, tiling decoder only needs to decode a $2^m$-point constellation. The first step of LSB decoding is to determine, for each of the I and Q axes, the smallest real metric between the received signal point and each of the LSB=0 and LSB=1 subsets. When m is even, $2^{m/2}$ comparisons are needed to find the minimum metrics in each of the LSB=0 and LSB=1 subsets for each of the I and Q axes, or $2^{m/2+1}$ in total. When m is odd, a total of $2^{(m+1)/2+1}$ comparisons are needed. In the m=4 case of the constellation 40:4D, 8 comparisons are needed.

The second step of LSB decoding is to use the above-determined minimum real metrics to determine a set of branch metrics. The LSB code is a rate-⅘ code and thus there are four uncoded bits per trellis state transition and there are five coded bits per trellis state transition. That is, each state has $2^4$=16 possible branches that correspond to the 16 binary combinations of the four uncoded bits. Each of these branch metrics is computed as a sum of five minimum metrics from the LSB=0 and LSB=1 subsets that correspond to a corresponding sequence of five coded bits. So the second step is to compute all of the 32 possible sums of the minimum metrics from the LSB=0 and LSB=1 subsets and to store them into a lookup table that uses a 5-bit address. This requires a total of 32×5=160 additions.

Next, at each of the 32 states, for each of the 16 incoming paths (×16) a five bit address is used to look up the branch metric with associated with a set of five corresponding coded bits for a given branch, and then this looked up value is added to the incoming path metric. This path metric is compared to a previous path metric to determine if it is the minimum metric. This process is continued until all 16 path metrics have been updated and the survivor path has been found. The combination of the lookup, add and compare/select requires another three operations (×3). The above mentioned computations are performed once every five intervals (÷5). That is, the total computation for this part of the decoding is [(32×5)+(32×16×3)]/5=340. Since there are two LSB decoders, the second step of LSB decoding adds 340×2=680 computations/2D interval. In general, the combination of the steps 825-835 and the second step of the LSB decoding adds 64+680=744 computations/2D interval. Tallying things up, to decode the constellation 40:4D requires 96+64+8+744=912 computations/2D interval. In general, the total computation is m-even: $2^{m/2+3}+2^{m+2}+2^{m/2+1}+744$, and m-odd: $2^{(m+1)/2+2}+2^{m+2}+2^{(m+1)/2+1}+744$.

It is helpful to compare the above to the amount of computation required by the m-odd type of WiMAX decoder 165, 167. These decoders start with the same $2^{(m+1)/2+2}+2^{m+2}$ metric computations and comparisons as the m-odd case discussed above for steps 805-820, but with the constellation points rearranged onto a square-shaped constellation with the same number of points. Because the rate-¾ puncture-coded building block 171b is used, the step 820 involves keeping track of eight paths per state each interval so computes eight subset minima instead of two, but involves the same number of comparisons. The WiMAX decoder then skips step 825 but in step 830 computes 64 (states)×8 (branches per state)=512 path computations×3 computations per add/compare/select operation. So while the decoder 600 with m-odd computes on the order of $2^{(m+1)/2+2}+2^{m+2}+2^{(m+1)/2+1}+744$ operations, the corresponding m-odd WiMAX decoder computes on the order of $2^{(m+1)/2+2}+2^{m+2}+1536$ operations. As we see, while the decoder 600 requires three decoders instead of one, the total computation is about 50% lower than comparable WiMAX decoders. Relative numbers are tabulated in FIG. 15.

As mentioned previously, a $D^2$=48 version of the tiled building block trellis code can be constructed that uses an 8-state building block encoder and two 16-state LSB decoders. Theses lower-state decoders also start by computing the same computations as discussed in steps 805-820. The building block decoder in step 825 then computes 8 (states)×2 (branches per state)=16 path operations×2 computations per add/compare/select operation, once every other interval (÷2), for a total of 16 path computations per 2D interval. Moving to the tiling decoder, the real-valued metrics computed in the step 805 are reused as branch metrics, but a total of 8 compare operations are still needed to find the minimum real metrics on the I and Q axes for each of the LSB=0 and LSB=1 subsets. Then each I and Q 16-state LSB decoder computes, a table of 32 branch metrics corresponding to the sum of the minimum LSB=0 and LSB=1 metrics in each of the five signaling intervals per trellis state transition, for each combination of the five uncoded bits. This adds (32×5) additions once ever five intervals (±5). Next, for each of the 16 states, for each of the 16 paths per state (×16) a selected branch metric is added to an incoming path metric and the survivor path metric is determined, resulting in one addition, one compare, and one select per path (×3). This is performed once every five intervals (÷5). That is, the total computation for this part of the decoding is [(32×5)+(16×16×3)]/5=186. Since there are two LSB decoders, this adds 186×2=372 computations. Tallying things up, to decode the constellation 40:4D requires 96+16+8+372=492 computations/2D interval. In general, the total computation for the $D^2=48$ version of the decoder is m-even: $2^{m/2+3}+2^{m+2}+2^{m/2+1}+372$, and m-odd: $2^{(m+1)/2+2}+2^{m+2}+2^{(m+1)/2+1}+372$.

We next evaluate the decoding complexity of an m-even, dual PAM type WiMAX decoder that decodes at the same information rate as what is carried by the constellation 40:4D described above. In the transmission of m=4 bits/interval, the WiMAX standard uses a 64QAM constellation and uses a dual-PAM scheme instead of a building block approach (see the IEEE 802.16a standard for further details). Using the received signal, separate independent I and Q decoders calculate $2^{m/2+1}$ branch metrics each interval, that is, a total of $2^{m/2+2}$ branch metrics are computed. When m=4, eight branch metrics are computed on each of the I and Q channels for a total of sixteen. These metrics are $\{(r-s_i)^2\}$ for each PAM constellation point on each of the I and Q axes of the constellation 174b. Since each of the dual-PAM WiMAX decoders use 64 states and have 2 information bits coming in, each of these decoders will have four branches entering and exiting each of the 64 states. These four branch metrics are selected from the total of eight metrics calculated from the received signal on each of the I and Q directions. Two separate I and Q trellises are thus decoded, each of which requires four path calculations and comparisons per state. That is, 2 decoders× 64 states/decoder×4 paths/state×3 computations/path=1536 decoding computations. In general, for m-even, $2^{m/2+2}+1536$ computations are required when the WiMAX dual-PAM approach is used. When m=4, this comes to 16+1536=1552. Recall that to decode the $D^2=64$ version 40:4D constellation required 912 computations, i.e., a relative complexity of 912/1552=0.59. To decode the $D^2=48$ version 40:4D constellation required 460 computations, i.e., a relative complexity of 492/1552=0.32.

The tiling decoder 615 can be also be implemented by other types of decoders, e.g., as an Ungerbock decoder, or in some cases, more specifically as a Wei decoder. In these cases the operation is the same, only the LSB decoders are traded out for the selected Ungerbock decoder. The building block decoder still precedes the tiling decoder and the tiling decoder operates on a reduced signal constellation with only one point per tile. The combination of the building block decision and the tile decision will resolve both the tile and the point within the tile.

A similar complexity analysis can be considered to understand the complexity of the decoder 600 when configured to decode a tiled-building-block version of Wei's code, e.g., as generated by the encoders 400 and 500. In this analysis we focus on Wei's 16-state 4D code. To begin, we first analyze the complexity of a decoder designed to decode Wei's 192-point 16-state 4D code as generated by the standard encoder 75 of FIG. 7b. As can be seen from the constellation 70, the first step is to compute 16 real-valued metrics for each of the I and Q directions and to then combine these to compute 192 2D metrics, for a total of 2×16×2+192=256 metric computations. For each of the {a, b, c, d} types, a minimum metric needs to be found, adding another 192 computations, for a total of 256+192=448 computations to this point. Next some minor scalar operations are needed to derive the 4D path metrics, and then 16 (states)×4 (subsets/state) need to be updated and compared and selected (×3) once every other 2D interval (÷2). On the order of 96 path operations thus need be computed per 2D interval. This brings the total computation count to 448+96=544.

When the decoder 600 is used, there are 128 tiling points and 256 total constellation points to decode. That means 2×16×2+256=320 metric computations are needed up front and then 256 comparisons are needed to find the minima of the BB=1 and BB=0 2D subsets, raising the total to 576. By ordering these minima-search operations properly, the minima for each of Wei's {a, b, c, d} types of each of the BB=0 and BB=1 128-point 2D sub-constellations can be recorded while performing these same 256 comparisons. The building block decoder in step 825 then computes 32 (states)×2 (branches per state)=64 path operations times 3 computations per add/compare/select operation (×3), once every other interval (÷2), bringing the total computations to 576+96=672 computations per interval. Once the building block is decoded, a selected BB=0 or BB=1 128-point sub-constellation is fed to the Wei decoding algorithm. As discussed previously, the metrics computed by the building block decoder are reused and the minima of the {a, b, c, d} types for the selected BB=0 or BB=1 building subset are already stored. Next some minor scalar operations are needed to derive the 4D path metrics, and then 16 (states)×4 (subsets/state) need to be updated and compare-selected (×3) once every other 2D interval (÷2), that is 96 path operations need to be computed. After some minor reverse mapping operations are needed to recover the uncoded bits. The computation count is thus on the order of 672+96=768. Recalling that the Wei decoder alone had a computation count on the order of 544, the increase is 768/544=1.41, or a 41% increase in complexity. If the 64-state 4D Wei code is considered, the path computations increases by a factor of four, so the numbers become 672+96×4=1056 vs. 448+96×4=832. The relative complexity is thus 1056/832=1.27, i.e., about a 27% increase. The 64-state 8D code is similar.

In some applications it may be desirable to use a code like a 16-state 4D Wei code, but with a smaller signal constellation. This might occur for example when the code is being used to modulate tones in an OFDM type communication system. In such a case, the minimum 16-state 4D tiling code would be a 4-QAM tiling constellation made up of the trellis coded bits of the encoder 75. Uncoded bits could then be added in pairs. Adding an odd number or pairs would give rise to a CR type tiling constellation because an odd number of bits would be added per 2D interval. Adding an even number of uncoded bit pairs would give rise to square shaped tiling constellations. Bit conversion for energy set selection would be optional. The same idea applies to the 8D embodiment, but uncoded bits are preferably added four at a time.

Figure 24:
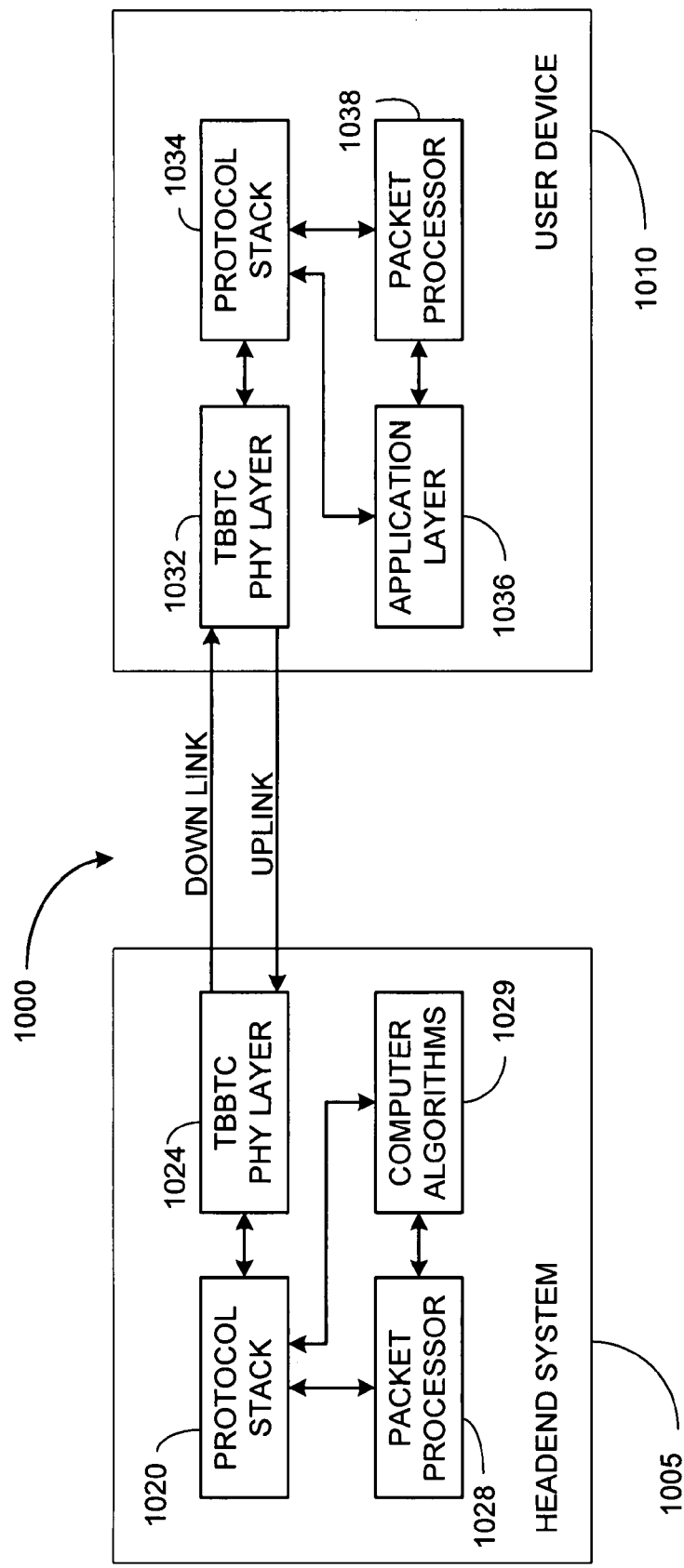
FIG. 24 is a block diagram representing an exemplary uplink/downlink type communication system used to implement a communication system and/or a communication protocol to provide a layered protocol structure using the tiled building block trellis code techniques of the present invention in the physical layer.

FIG. 24 shows a higher level systems architecture 1000 into which any of the Tiled Building Block Trellis Codes (TBBTC) techniques described herein may be used. A headend system 1005 transmits via a downlink channel to user device 1010. The user device 1010 transmits back to the headend system 1005 via an uplink channel. The headend system comprises a protocol stack 1020 which includes a physical layer 1024. The headend system also may include a control and routing module 1028 to connect to external networks, databases, and the like. The headend system also contains a computer control module 1029 which comprises processing power coupled to memory. The computer control module 1029 preferably implements any maintenance functions, service provisioning and resource allocation, auto-configuration, software patch downloading and protocol version software downloads, billing, local databases, web page interfaces, upper layer protocol support, subscriber records, and the like.

The user terminal 1010 similarly includes a physical layer interface 1032, a protocol stack 1034 and an application layer module 1036 which may include user interface devices as well as application software. The user terminal 1010 also may optionally include a packet processor 1038 which can be connected to a local area network, for example. The user 1010 terminal may also act as an IP switching node or router in addition to user functions in some embodiments.

Another type of embodiment replaces the headend system 1005 with another user device 1010 in which case direct peer-to-peer communications is enabled. In many applications, though, the headend can act as an intermediary between two user devices to enable indirect peer-to-peer communications using the same headend-to/from-user device uplink/downlink architecture illustrated in FIG. 25.

In preferred embodiments of the present invention, at least one of the uplink and the downlink channels is implemented using a TBBTC coder and/or decoder pair. In some types of embodiments, the PHYS 1024, 1032 may include echo cancellation, cross-talk cancellation, equalization, and other forms of signal conditioning or receiver pre-processing.

Similarly, the protocol stack may preferably include in its link layer scrambling, interleaving, and forward error correction coding (channel coding, e.g., Reed-Solomon, block codes, convolutional codes, and turbo codes). The headend may include the optional packet switching node and/or router 1028, for example using an Internet Protocol (IP) packet forwarding policy. External databases connected via the router 1028 thereby provide remote services to the subscriber terminal via the headend. Similarly, local databases holding more specific types of data may be saved in computerized storage areas and processed using the computerized module 1029.

In one type of embodiment, the headend system may be a cellular communications base station that carries voice and/or data, such as IP packet traffic. In other embodiments, the headend may be a wireless metropolitan area network (e.g., WiMAX), a local area network base station or personal area network base station, respectively, for WiFi and Bluetooth type applications. In other types of applications, the headend system 1005 may correspond to a cable services headend system and the user device 1010 may be a cable modem. In other types of applications, the head end system 1005 may correspond to a DSL services head end system and the user device 1010 may be a DSL modem. In such applications the user device may also have a router function and connect to a home or office network, or any other type of network, for example.

In other types of applications the headend 1005 may transmit and the user devices 1010 may receive only, or the communications may be highly asymmetric. The TBBTC encoding and/or decoding may be used to transmit digital television signals from a cable TV headend, a satellite TV broadcast headend, or a terrestrial HDTV headend. For example, a QAM signal as used in current digital CATV and terrestrial HDTV standards could be replaced, for example with TBBTC coding using a hardware and/or software upgrade. Similarly, a trellis interleaver scheme like a turbo encoder or a trellis interleaver as used in the ATSC HDTV terrestrial transmission standard may be used with the present invention. As such U.S. Pat. No. 4,677,624, U.S. Pat. No. 4,677,625, U.S. Pat. No. 4,677,626, U.S. Pat. No. 5,243,627 and U.S. Pat. No. 5,446,747 are all incorporated herein by reference, but only to the extent that they serve as the basis for various additional specific exemplary embodiments of aspects of the present invention involving specific embodiments formed from combinations of the current disclosure with these patents. It is envisioned that the present invention can be combined with any of these patents to construct advantageous coded communication structures and methods.

As a final note, the tiled building block trellis codes are related in some ways to multi-level codes. We have observed that the error coefficient of the building block code portion of tiled building block trellis code increases due to the addition of extra signal points in adjacent tiles. We have discovered a way to mitigate these effects, at the cost of some additional decoding complexity. The same technique we use to reduce the error coefficient in tiled building block trellis codes can be used with prior art multi-level codes to improve their performance by reducing their error coefficients. These additional inventive aspects will be disclosed in further detail in a follow-on patent.

It should be noted that an aspect of the present invention involves a method of trellis encoding. This method processes a first set of input bits using a first trellis encoder to generate a first set of coded bits that correspond to a particular building-block signal point of a coded-constellation-building block. A "building block signal point" is a signal point in the coded-constellation-building block such as the signal points shown in FIG. 2 and FIG. 10. The method also involves processing a second set of input bits using a second trellis encoder to generate a second set of coded bits that correspond to a tiling point of a tiling constellation. For example, FIG. 13 shows a 2D tiling constellation whose tiling points are shown as empty circles. At each tiling point is placed a replication of the coded constellation building block. In the case of FIG. 13, the building block is 4-dimensional, so a 2-dimensional constituent constellation portion of the building block is placed at each tiling point of the 2-dimensional tiling constellation. As shown in FIG. 9, a signal mapper 120 can be used to jointly map the first and second sets of coded bits onto a transmission signal point. A transmission signal point generally includes and I-component and a Q-component as shown in FIG. 9 at the output of the mapper 120. The I and Q components are generally used to modulate a carrier signal for transmission to a distant receiver that includes a multistage trellis decoder. A multistage trellis decoder makes decisions based on a first coding level (such as the building block code) and passes this decision information to second decoder (e.g., to decode the tiling code). In a preferred embodiment, the jointly mapping is performed in such a way that when each admissible combination of the first set of coded bits corresponding to a respective one of the plurality of building-block signal points is jointly mapped with the second set of coded bits, each such respective jointly mapped transmission signal point is located closer to the tiling point than any second tiling point in the tiling constellation.

In some cases, trellis encoder methods of the present invention use a tiling constellation that is a subset of a 2-dimensional integer lattice. In such cases the tiling encoder maps input bits onto a 2-dimensional integer lattice and is thus a "2-dimensional trellis encoder." The two dimensional trellis encoder used in the tiling encoder can be implemented as a first independent convolutional encoder and a second independent convolutional encoder that respectively process first and second independent bit streams. The coded outputs of these two independent encoders can be respectively mapped to an I-component of the tiling point and a Q-component of the tiling point. For example, these two independent convolutional encoders configured as a pair of LSB-type encoders as discussed herein by properly assigning coded values to integer points in the I/Q plane.

Although the present invention has been described with reference to specific embodiments, other embodiments may occur to those skilled in the art without deviating from the intended scope. For example, while block diagrams are provided herein, it should be noted that any of the blocks described herein could be implemented in hardware or in software running on one or more processors. Also, certain blocks can be modified. For example, the tiling decoder can be moved in front of the building block decoder, although we currently believe the mode shown in FIG. 21 is the best mode. While several exemplary coders were provided, many similar encoder/decoder pairs can be constructed by selecting different pairs of building-block and tiling codes. Also, the trellis encoders herein can be augmented with other kinds of coders such as block coders that operate either to the input data to the trellis encoder or to the output bits of the trellis encoder. Block codes may be added in certain cases to increase the effective free Hamming distance beyond what might be achieved by a trellis encoder acting alone. Also, in some cases the trellis encoder can be replaced all together by a block encoder to obtain similar results. In such cases one or both of the building block encoder and the tiling encoder lack a convolutional encoder in favor of a block encoder. In still other embodiments, one or both of the convolutional encoders are substituted or augmented with a more advanced type of encoder such as a Turbo encoder. Similarly, many examples specify specific convolutional encoders to include the coding rate and number of states, but these parameters may be changed at the designer's discretion while staying within the scope of the present invention. While it was stated that constellation building blocks typically include no uncoded bits, in some cases, e.g., the bit converter 96 of the encoder 75 or the bit converter of the encoder 85 can be viewed as constructing constellation building blocks that do incorporate limited numbers of uncoded bits to construct constellation building blocks, and such building block mechanisms can be used to construct constellation building blocks in accordance with the present invention. Hence it is to be understood that these general families of embodiments are contemplated and that the invention is to be limited only by the scope and spirit of the appended claims.

What is claimed is:

1. A method of trellis encoding, comprising:
    processing a first set of input bits using a first trellis encoder to generate a first set of coded bits that correspond to a particular building-block signal point of a coded-constellation-building block, wherein the coded-constellation-building block comprises a plurality of building-block signal points;
    processing a second set of input bits using a second trellis encoder to generate a second set of coded bits that correspond to a tiling point of a tiling constellation;
    jointly mapping the first and second sets of coded bits onto a transmission signal point, wherein the jointly mapping is performed in such a way that when each admissible combination of the first set of coded bits corresponding to a respective one of the plurality of building-block signal points is jointly mapped with the second set of coded bits, each such respective jointly mapped transmission signal point is located closer to the tiling point than any second tiling point in the tiling constellation.

2. The method of claim 1, wherein the jointly mapping further comprises:
    determining a final transmission signal point whose location in signal space includes respective components due to mapping the first set of coded bits, the second set of coded bits and a third set of input bits, wherein the third set of input bits remains uncoded.

3. The method of claim 1, wherein the coded-constellation-building block is two-dimensional and includes four building-block signal points that are distributed in an I/Q plane of the signal space, wherein the I/Q plane includes an I-axis that corresponds to an in-phase signal component direction and a Q-axis that corresponds to a quadrature-phase signal component direction.

4. The method of claim 1, wherein:
    the second trellis encoder includes a first independent convolutional encoder and a second independent convolutional encoder that respectively process first and second independent subsets of the second set of input bits to produce first and second independently coded subsets of the second set of coded bits;
    the first independently coded subset of the second set of coded bits is mapped to an I-component of the tiling point and the second independently coded subset of the second set of coded bits is mapped to a Q-component of the tiling point; and
    the tiling constellation comprises a set of integer lattice points in an I/Q plane that includes an I-axis that corresponds to an in-phase signal component direction and a Q-axis that corresponds to a quadrature-phase signal component direction.

5. The method of claim 4, wherein the first and second independent convolutional encoders and together with the mapping of the first and second independently coded subsets onto the I-component and the Q-component are implemented as first and second LSB trellis encoders to thereby generate an LSB-encoded tiling constellation over the I/Q plane, wherein the transmission signal point is transmitted to a receiver that comprises a multistage decoder that processes a received version of the transmission signal point using a first decoder to determine a building-block signal point decision and then feeds a set of bits corresponding to the building-block signal point decision to a second decoder which uses the bits corresponding to the building-block signal point decision and information derived from the received version of the transmission signal point to determine a tiling point decision.

6. The method of claim 1, wherein N is a positive integer and the coded-constellation-building block is (4×N)-dimensional and includes at least four building-block signal points, a first two of which are distributed in a first I/Q plane of a signal space during a first signaling interval and a second two of which are distributed in a second I/Q plane of the signal space during a second signaling interval, wherein each of the first and second I/Q planes include a respective I-axis that corresponds to an in-phase signal component direction and a respective Q-axis that corresponds to a quadrature-phase signal component direction.

7. The method of claim 6, wherein:
    the tiling constellation is a subset of a (4×N)-dimensional integer lattice of a (4×N)-dimensional signal space; and
    the second trellis encoder is a (4×N)-dimensional constellation-contracted Wei encoder.

8. The method of claim 6, wherein:
    the tiling constellation is a subset of a 2-dimensional integer lattice of a 2-dimensional signal space; and
    the second trellis encoder is a member of the group consisting of (1) a 2-dimensional trellis encoder and (2) a first independent convolutional encoder and a second independent convolutional encoder that respectively process first and second independent subsets of the second set of input bits to produce first and second independently coded subsets of the second set of coded bits, wherein the first independently coded subset of the second set of coded bits is mapped to an I-component of the tiling point and the second independently coded subset of the second set of coded bits is mapped to a Q-component of the tiling point, and wherein the first and second independent convolutional encoders collectively comprise the 2-dimensional trellis encoder.

9. A method of trellis encoding, comprising:
processing a first set of input bits using a first convolutional coder encoder to generate a first set of coded bits, wherein the first set of coded bits are associated with a particular building-block signal point of a coded-constellation-building block that comprises a clustered set of building-block signal points, and the first convolutional encoder is selected to increase a measure of minimum squared Euclidian distance (MSED) between coded sequences of building-block signal points of the coded-constellation-building block beyond a measure of squared Euclidian distance between individual building-block signal points in the coded-constellation-building block;
processing a second set of input bits using a second convolutional encoder to generate a second set of coded bits, wherein the second set of coded bits are associated with a tiling point of a tiling constellation, wherein the second convolutional encoder is selected to increase a measure of MSED between coded sequences of tiling points of the tiling constellation beyond a measure of squared Euclidian distance between individual tiling points in the tiling constellation; and
jointly mapping the first and second sets of coded bits onto a transmission signal point, wherein the jointly mapping is performed in such a way that when each admissible combination of the first set of coded bits corresponding to a respective member of the clustered set of building-block signal points is jointly mapped with the second set of coded bits, each such respective jointly mapped transmission signal point is located closer to the tiling point than any second tiling point in the tiling constellation.

10. The method of claim 9, wherein the jointly mapping further comprises:
determining a final transmission signal point whose location in signal space includes respective components due to mapping the first set of coded bits, the second set of coded bits and a third set of input bits, wherein the third set of input bits remains uncoded.

11. The method of claim 9, wherein the coded-constellation-building block is two-dimensional and includes four signal points that are distributed in an I/Q plane of the signal space, wherein the I/Q plane includes an I-axis that corresponds to an in-phase signal component direction and a Q-axis that corresponds to a quadrature-phase signal component direction.

12. The method of claim 9, wherein:
the second convolutional encoder includes a first independent convolutional encoder and a second independent convolutional encoder that respectively process first and second independent subsets of the second set of input bits to produce first and second independently coded subsets of the second set of coded bits;
the first independently coded subset of the second set of coded bits is mapped to an I-component of the tiling point and the second independently coded subset of the second set of coded bits is mapped to an Q-component of the tiling point;
the tiling constellation comprises a set of integer lattice points in an I/Q plane that includes an I-axis that corresponds to an in-phase signal component direction and a Q-axis that corresponds to a quadrature-phase signal component direction.

13. The method of claim 12, wherein the combination of the first and second independent convolutional encoders and the mapping of the first and second independently coded subsets onto the I-component and the Q-component are implemented as first and second LSB trellis encoders to thereby generate an LSB-encoded tiling constellation over the I/Q plane, wherein the transmission signal point is transmitted to a receiver that comprises a multistage decoder that processes a received version of the transmission signal point using a first decoder to determine a building-block signal point decision and then to feeds bits corresponding to the building-block signal point decision to a second decoder which uses the bits corresponding to the building-block signal point decision and information derived from the received version of the transmission signal point to determine a tiling point decision.

14. The method of claim 9, wherein N is a positive integer and the coded-constellation-building block is (4×N)-dimensional and includes at least four building-block signal points, a first two of which are distributed in a first I/Q plane of a signal space during a first signaling interval and a second two of which are distributed in a second I/Q plane of the signal space during a second signaling interval, wherein each of the first and second I/Q planes include a respective I-axis that corresponds to an in-phase signal component direction and a respective Q-axis that corresponds to a quadrature-phase signal component direction.

15. The method of claim 14, wherein:
the tiling constellation is a subset of a (4×N)-dimensional integer lattice of a (4×N)-dimensional signal space; and
the second trellis encoder is a (4×N)-dimensional constellation-contracted Wei encoder.

16. A trellis encoder, comprising:
a first trellis coder that is configured to process a first set of input bits to determine a first set of coded bits that correspond to a particular building-block signal point of a coded-constellation building block, wherein the coded-constellation-building block comprises a plurality of building-block signal points;
a second trellis encoder that is configured to process a second set of input bits to determine a second set of coded bits that correspond to a tiling point of tiling constellation; and
a signal mapper configured to jointly map the first and second sets of coded bits onto a transmission signal point, wherein the jointly mapping is performed in such a way that when each admissible set of the first set of coded bits corresponding to a respective member of the clustered set of building-block signal points is jointly mapped with the second set of coded bits, each such respective jointly mapped transmission signal point is located closer to the tiling point than any second tiling point in the tiling constellation.

17. The trellis encoder of claim 16, wherein the signal mapper is further configured to take into account a third set of input bits for use in the jointly mapping operation, and the third set of input bits remain uncoded.

18. The trellis encoder of claim 16, wherein the coded-constellation-building block is two-dimensional and includes four signal points that are distributed in an I/Q plane of the signal space, wherein the I/Q plane includes an I-axis that corresponds to an in-phase signal component direction and a Q-axis that corresponds to a quadrature-phase signal component direction.

19. The trellis encoder of claim 16, wherein:
the second trellis encoder includes a first independent convolutional encoder and a second independent convolutional encoder that respectively process first and second independent subsets of the second set of input bits to produce first and second independently coded subsets of the second set of coded bits;

the first independently coded subset of the second set of coded bits is mapped to an I-component of the tiling point and the second independently coded subset of the second set of coded bits is mapped to an Q-component of the tiling point;

the tiling constellation comprises a set of integer lattice points in an I/Q plane that includes an I-axis that corresponds to an in-phase signal component direction and a Q-axis that corresponds to a quadrature-phase signal component direction.

20. The trellis encoder of claim 19, wherein the first and second independent convolutional encoders together with the mapping of the first and second independently coded subsets onto the I-component and the Q-component are implemented as first and second LSB trellis encoders to thereby generate an LSB-encoded tiling constellation over the I/Q plane, wherein the transmission signal point is transmitted to a receiver that comprises a multistage decoder that processes a received version of the transmission signal point using a first decoder to determine a building-block signal point decision and then feeds a set of bits corresponding to the building-block signal point decision to a second decoder which uses the bits corresponding to the building-block signal point decision and information derived from the received version of the transmission signal point to determine a tiling point decision.

21. The trellis encoder of claim 16, wherein N is a positive integer and the coded-constellation-building block is (4×N)-dimensional and includes at least four building-block signal points, a first two of which are distributed in a first I/Q plane of a signal space during a first signaling interval and a second two of which are distributed in a second I/Q plane of the signal space during a second signaling interval, wherein each of the first and second I/Q planes include a respective I-axis that corresponds to an in-phase signal component direction and a respective Q-axis that corresponds to a quadrature-phase signal component direction.

22. The trellis encoder of claim 21, wherein:
the tiling constellation is a subset of a (4×N)-dimensional integer lattice of a (4×N)-dimensional signal space; and
the second trellis encoder is a (4×N)-dimensional constellation-contracted Wei encoder.

23. The method of claim 21, wherein:
the tiling constellation is a subset of a 2-dimensional integer lattice of a 2-dimensional signal space; and
the second trellis encoder is a member of the group consisting of (1) a 2-dimensional trellis encoder and (2) a first independent convolutional encoder and a second independent convolutional encoder that respectively process first and second independent subsets of the second set of input bits to produce first and second independently coded subsets of the second set of coded bits, wherein the first independently coded subset of the second set of coded bits is mapped to an I-component of the tiling point and the second independently coded subset of the second set of coded bits is mapped to a Q-component of the tiling point, and wherein the first and second independent convolutional encoders collectively comprise the 2-dimensional trellis encoder.

24. A trellis encoder, comprising:
a first trellis encoder that is configured to process a first set of input bits to determine a first set of coded bits that correspond to a particular building-block signal point of a coded-constellation building block, wherein the coded-constellation-building block comprises a plurality of building-block signal points;

a second trellis encoder that is configured to process a second set of input bits to determine a second set of coded bits that correspond to a tiling point of tiling constellation; and a signal mapper configured to jointly map the first and second sets of coded bits onto a transmission signal point, wherein the jointly mapping is performed in such a way that when each admissible first set of coded bits corresponding to a respective member of the clustered set of building-block signal points is jointly mapped with the second set of coded bits, each such respective jointly mapped transmission signal point is located closer to the tiling point than any second tiling point in the tiling constellation;

wherein the coded-constellation-building block is a member of the group consisting of (1) a two-dimensional coded-constellation-building block that includes four signal points that are distributed in an I/Q plane of the signal space, wherein the I/Q plane includes an I-axis that corresponds to an in-phase signal component direction and a Q-axis that corresponds to a quadrature-phase signal component direction and (2) a coded-constellation-building block that is four-dimensional and includes four signal points, a first two of which are distributed in a first I/Q plane of a signal space during a first signaling interval and a second two of which are distributed in a second I/Q plane during a second signaling interval, wherein each of the first and second I/Q planes include a respective I-axis that corresponds to an in-phase signal component direction and a respective Q-axis that corresponds to a quadrature-phase signal component direction;

wherein the second trellis encoder includes a first independent convolutional encoder and a second independent convolutional encoder that respectively process first and second independent subsets of the second set of input bits to produce first and second independently coded subsets of the second set of coded bits;

wherein the first independently coded subset of the second set of coded bits is mapped to an I-component of the tiling point and the second independently coded subset of the second set of coded bits is mapped to an Q-component of the tiling point;

wherein the tiling constellation comprises a set of integer points in an I/Q plane that includes an I-axis that corresponds to an in-phase signal component direction and a Q-axis that corresponds to a quadrature-phase signal component direction; and wherein combination of the first and second independent convolutional encoders and the mapping of the first and second independently coded subsets onto the I-component and the Q-component are implemented as first and second LSB trellis encoders to thereby generate an LSB-encoded tiling constellation over the I/Q plane; and wherein the transmission signal point is transmitted to a receiver that comprises a multistage decoder that processes a received version of the transmission signal point using a first decoder to determine a building-block signal point decision and then to feeds bits corresponding to the building-block signal point decision to a second decoder which uses the bits corresponding to the building-block signal point decision and information derived from the received version of the transmission signal point to determine a tiling point decision.

25. A trellis encoder, comprising:
a first trellis encoder that is configured to process a first set of input bits to determine a first set of coded bits that correspond to a particular building-block signal point of a coded-constellation building block, wherein the coded-constellation-building block comprises a plurality of building-block signal points;

a second trellis encoder that is configured to process a second set of input bits to determine a second set of coded bits that correspond to a tiling point of tiling constellation; and a signal mapper configured to jointly map the first and second sets of coded bits onto a transmission signal point, wherein the jointly mapping is performed in such a way that when each admissible first set of coded bits corresponding to a respective member of the clustered set of building-block signal points is jointly mapped with the second set of coded bits, each such respective jointly mapped transmission signal point is located closer to the tiling point than any second tiling point in the tiling constellation;

wherein N is a positive integer and the coded-constellation-building block is (4×N)-dimensional and includes at least four building-block signal points, a first two of which are distributed in a first I/Q plane of a signal space during a first signaling interval and a second two of which are distributed in a second I/Q plane of the signal space during a second signaling interval, wherein each of the first and second I/Q planes include a respective I-axis that corresponds to an in-phase signal component direction and a respective Q-axis that corresponds to a quadrature-phase signal component direction;

the tiling constellation is a subset of a (4×N)-dimensional integer lattice of a (4×N)-dimensional signal space; and the second trellis encoder is a (4×N)-dimensional constellation-contracted Wei encoder.

* * * * *